United States Patent [19]
Schary

[11] Patent Number: 5,861,644
[45] Date of Patent: *Jan. 19, 1999

[54] HIGH-FREQUENCY TRAVELING WAVE FIELD-EFFECT TRANSISTOR

[76] Inventor: Alison Schary, 77 Bartlett Ave., #2, Arlington, Mass. 02177

[ * ] Notice: The term of this patent shall not extend beyond the expiration date of Pat. No. 5,627,389.

[21] Appl. No.: 851,009

[22] Filed: May 5, 1997

Related U.S. Application Data

[63] Continuation-in-part of Ser. No. 275,999, Jul. 15, 1994, Pat. No. 5,627,389.
[51] Int. Cl.[6] .................................................. H01L 29/80
[52] U.S. Cl. ...................... 257/275; 257/256; 257/259; 257/280; 257/282; 257/283; 257/285; 257/287; 257/414
[58] Field of Search ................................. 257/256, 259, 257/275, 287, 280, 282, 283, 285, 414

[56] References Cited

U.S. PATENT DOCUMENTS 5,627,389  5/1997  Schary ..................................... 257/275

*Primary Examiner*—Tom Thomas
*Assistant Examiner*—Fetsum Abraham
*Attorney, Agent, or Firm*—Edwin H. Paul; Stephen Y. Chow; Jerry Cohen

[57] ABSTRACT

A method of improving the performance of a traveling wave field-effect transistor operated at frequencies in the microwave range or above the microwave range comprising the steps of forming a depletion region beneath a gate electrode wherein, in a plane transverse to the direction of signal propagation, a depletion region edge has a first end portion located between the gate electrode and a drain electrode and a second end portion located between the gate electrode and a source electrode; and separating the depletion region edge from the drain electrode. Further improvements in the operation of the TWFET include adjusting the first end portion of the depletion region edge to be closer to the gate electrode relative to the distance between the second end portion of the depletion region edge and the gate electrode, controlling an effective conductivity of a semiconductor of the traveling-wave field effect transistor, and setting the length of the gate electode at about one micron.

14 Claims, 79 Drawing Sheets

HIGH-FREQUENCY TRAVELING WAVE FIELD-EFFECT TRANSISTOR

CROSS REFERENCE TO RELATED APPLICATIONS

This application is continuation-in-part of allowed U.S. patent application, Ser. No. 08/275,999, U.S. Pat. No. 5,627,389, filed Jul. 15, 1994 of common title and inventorship as the present application.

BACKGROUND OF THE INVENTION

1. Field of the Invention

This invention relates to field-effect transistors, and in particular to traveling wave field-effect transistors (TWFETs) for use at frequencies in the microwave range and above the microwave range.

2. Description of the Prior Art

The prior art concepts for the design of high frequency semiconductor transistors, in particular field effect transistors (FETs), have obtained limited improvements in transistor performance in the aspects of signal power output and signal power gain at these high frequencies. Previous attempts to improve the performance of FETs for operation at these high frequencies have included the use of TWFETs. U.S. Pat. No. 4,065,782 presents the TWFET as an FET in which some of the FETs electrodes are adapted for use as coupled transmission lines. This concept was extended in U.S. Pat. No. 4,675,712, which presents a TWFET with a drain electrode that includes a meander segment. In U.S. Pat. No. 4,733,195, a TWFET is designed with unmatched termination impedances on the input and output transmission lines.

A TWFET comprises parallel elongated source, gate and drain electrodes disposed on a substrate of semiconductor material with an active channel connecting the electrodes. The direction of signal propagation is along the axis of these parallel electrodes. In the plane transverse to this direction of signal propagation, i.e. the cross-section of the TWFET, the arrangement of the electrodes and channel form an FET. In other attempts to improve the performance of TWFETs at high frequencies, this cross-section of the TWFET has been modified. For example, in U.S. Pat. No. 4,297,718 the TWFET's cross-section is designed as a vertical FET. In U.S. Pat. No. 4,587,541, the TWFET's cross-section is designed as dual-FETs.

All of these devices, however, achieve moderate increases in signal power output and signal power gain, particularly at high frequencies.

SUMMARY OF THE INVENTION

It is therefore a primary object of the present invention to provide signal power gain in a TWFET, operated at frequencies in the microwave range and above the microwave range, above the maximum frequency for which signal amplification would be possible for the FET contained in the cross-section of the TWFET.

It is another object of the present invention to increase the signal power amplification capability in a TWFET, operated at frequencies in the microwave range and above the microwave range, above the signal power amplification capability of the FET contained in the cross-section of the TWFET.

It is a further object of the present invention to provide signal power gain in a TWFET, operated at frequencies in the microwave range and above the microwave range, above the maximum signal power gain that would be possible for the FET contained in the cross-section of the TWFET.

It is yet another object of the present invention to provide for parallel interconnections of the inventive TWFET's for handling signals of relatively higher power.

These and other objects of the present invention are attained by forming a depletion region beneath a gate electrode wherein, in a plane transverse to the direction of signal propagation, a depletion region edge has a first end portion located between the gate electrode and a drain electrode and a second end portion located between the gate electrode and a source electrode; and separating the depletion region edge from the drain electrode. Further improvements in the operation of the TWFET include adjusting the first end portion of the depletion region edge to be closer to the gate electrode relative to the distance between the second end portion of the depletion region edge and the gate electrode, controlling an effective conductivity of a semiconductor of the traveling-wave field effect transistor, and setting the length of the gate electrode at substantially 1.0

BRIEF DESCRIPTION OF THE DRAWING

For a better understanding of these and other objects of the present invention, reference is made to the detailed description of the invention which is to be read in conjunction with the following figures of the drawing, wherein.

DESCRIPTION OF THE PREFERRED EMBODIMENT

Figure 1:
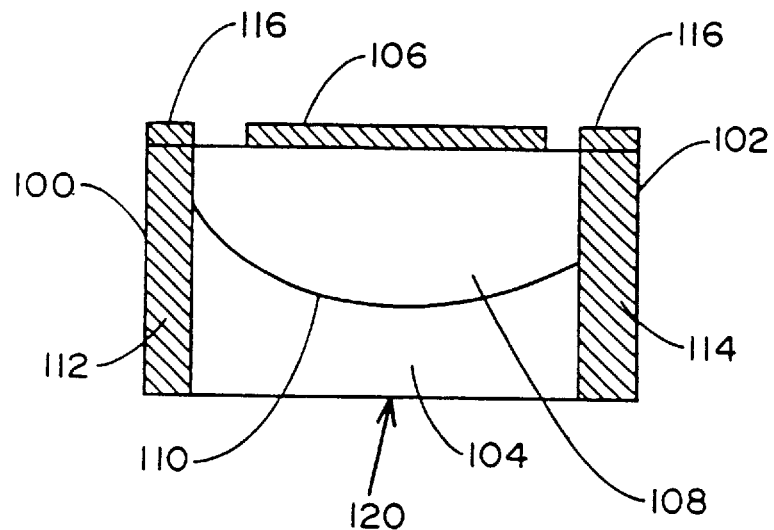
FIG. 1 is a schematic cross-section of a prior art FET.

The present invention makes use of a physical effect in the structure of a TWFET called non-reciprocal inductive coupling. The description of the preferred embodiment begins the discussion of non-reciprocal inductive coupling with a description of ideal coupled transmission lines. This includes a description of the inductance and admittance coupling matrices in ideal coupled transmission lines, using the TEM mode analysis. The description of the preferred embodiment then uses the TEM mode analysis to discuss the operation of the TWFET structure, in which the inductance and admittance coupling matrices can be non-reciprocal. The TEM mode analysis provides a good approximation to the distribution of transverse electric and magnetic fields of the propagating mode in the TWFET. These transverse electric and magnetic fields are the equivalent, in the TWFET structure, to the voltage and current waves of the transmission line.

In the case of ideal transmission lines, perfectly conducting rods are used to guide the propagating wave. These rods are imbedded in a homogeneous, linear medium, are aligned along the direction of wave propagation, and are uniform along this axis. A transmission line structure of n coupled transmission lines is formed from (n+1) conducting rods. The TEM mode which propagates along this transmission line structure can be considered to provide a voltage wave in the plane orthogonal to the direction of propagation. This voltage wave arises from the nature of the TEM mode which allows an electrostatic potential to be defined in the plane orthogonal to the direction of propagation. Consequently, in this transverse plane, each of the n conductors can have a potential defined relative to a reference potential on the (n+1)rst conductor. This (n+1)rst conductor is often designated as the ground conductor of the coupled transmission lines.

Accompanying this voltage configuration within this plane is a distribution of charge quantities on the (n+1) conductors. This charge distribution propagates with the voltage wave, varying with time and along the direction of propagation, to provide the current wave of the TEM mode. In the case of a single transmission line formed from two conducting rods, the voltage and current distributions are what is commonly known as the voltage and current of the transmission line. In a system of n coupled transmission lines, any propagating TEM wave can be formed from a superposition of the eigenmodes of voltage and current waves for the system of transmission lines.

The equation for the propagation of the voltage wave of an eigenmode for the system of transmission lines provides an important relationship between the charge coupling and the inductive coupling of the transmission lines.

The voltage eigenmode is defined as:

$$v = v_o e^{(jwt - yz)}$$

where v is a vector of the voltages on the n conductors relative to the (n+1)rst reference conductor, j is $\sqrt{-1}$, w is the angular frequency, z is the direction of propagation, t is time, and y is the propagation constant of the voltage wave eigenmode.

The charge matrix, K, which relates the voltage and charge distribution for the n transmission lines, is defined as:

$$q = Kv$$

where q is a vector of charges on the n conductors, and K is an n×n matrix relating the charge vector, q, to the voltage vector v.

Based on the preceding notation, the relationship between the voltage and current eigenmodes is defined as:

$$\frac{d}{dz} v = -\gamma v$$
$$= -\gamma K^{-1} q$$
$$= -j\omega \mu_o \epsilon K^{-1} i$$
$$= -j\omega L i$$
$$= -Z i$$

where v and i represent voltage and current vectors, and $\epsilon$ and $\mu_o$ represent the dielectric constant and permeability of the medium surrounding the transmission lines. In this equation, the permeability of the surrounding medium is assumed to be the permeability of free space. Therefore, $\mu = \mu_o$ is used. This result can be recognized as the transmission line equation for the z—derivative of the voltage eigenvector. It can be seen to follow from the relationship between the inductive coupling matrix, L and the charge matrix, K:

$$L = \mu_o \epsilon K^{-1} \left( \frac{1}{v_c^2} \right) K^{-1}$$

where $v_c$ is the speed of light in the medium containing the transmission lines. In this case of ideal transmission lines, the impedance coupling matrix, Z, is equated to the product $j\omega L$.

The preceding relationship between voltage and current vectors provides one of the two well-known transmission line equations. The other equation is defined as:

$$\frac{d}{dz} i = -\left( \frac{(\sigma)}{\epsilon} + j\omega \right) Kv$$
$$= -Yv$$

This last equation implies a definition for the admittance matrix of the coupled transmission lines which can be stated as:

$$Y = \left( \frac{\sigma}{\epsilon} + j\omega \right) K$$

In these equations, $\sigma$ is the conductivity of the surrounding medium, and $\epsilon$ is its dielectric constant In this case of ideal transmission lines, the Y matrix can be seen to describe the transverse current flow between the electrodes of the transmission lines with the presence of an inter-electrode potential in this transverse plane. For example, consider the case of ideal transmission lines imbedded in a homogeneous medium with finite conductivity. The Y matrix would describe the shunt conductance of an equivalent parallel R-C circuit element model for a differential length section of the structure, with conductance given by the term $$\left( \frac{\sigma}{\epsilon} \right) K$$

and capacitive coupling of these lines given by the term $$(j\omega K)$$

The Z matrix, which is contained in the other transmission line equation for the z-derivative of the voltage eigenvector, describes the change in the voltage with longitudinal direction as related to current flow along the electrodes in the direction of signal propagation in the coupled transmission lines. The i vector corresponds to the surface current flow along the electrodes, which arises with the presence of surface charges on these conductors. In view of this fact, it can be seen that Z, L, and K matrices all pertain to the longitudinal current flow, which is present in all transmission line structures.

In this case of ideal transmission lines (assuming the surrounding medium is linear and reciprocal), it is important to note that the charge matrix of the ideal (passive) transmission line structure is reciprocal and provides reciprocal inductive coupling in these structures. This can be defined in terms of a matrix element, $m_{kp}$ in which $m_{kl}=m_{lk}$. This means that the charge induced on conductor l by the presence of a voltage on conductor k is equal to the charge induced on conductor k by the presence of the same voltage on conductor l.

The equivalences between voltage and current on a transmission line to transverse electric and magnetic fields in non-ideal transmission line structures allows the use of the same equations for ideal coupled transmission lines for the analysis of the TWFET. A detailed derivation of these transmission line equations is presented in Appendix A. In addition, the TEM mode analysis provides a good approximation to the transverse electric and magnetic fields. Therefore, it will be used here to describe the operation of the present invention.

In the present TWFET invention, the Y and Z matrices are considered as 2×2 matrices for the 3 conductors formed by the elongated source, gate, and drain electrodes. While a common source configuration is assumed, it will be obvious to those skilled in the art that the analysis can include other configurations.

In a TWFET, the Y matrix elements are complex valued and describe the FET activity in the plane transverse to the direction of signal propagation by relating the inter-electrode transverse current flow to AC potential difference between the electrodes. Most often, this activity is evaluated using circuit models. An important difference of the Y matrix of the TWFET structure as compared to that of the ideal transmission lines is the nonreciprocity in the Y matrix of the TWFET. At low frequencies, this property appears in the transconductance component of circuit element models for the FET. The presence of this transconductance provides non-reciprocity in that the AC gate voltage transfers an AC particle current to the drain electrode, but an AC drain voltage does not transfer an approximately equal AC particle current to the gate electrode. This is an approximate description of the non-reciprocity feature of the Y matrix of the conventional FET which is made use of in both the present invention and prior art TWFET structures.

The important difference in the present invention, as compared to that of the prior art, is in the design of the properties of the Z matrix. This design difference is found in the inductive coupling matrix which provides part of the Z matrix, with the series resistance on the gate and drain electrodes providing the remaining component:

$$Z=R+j\omega L$$

In the case of the 3 conductor system of the source, gate, and drain electrodes, R is a 2×2 diagonal matrix containing the gate and drain electrode series resistances, and L is the 2×2 inductive coupling matrix for the TWFET. In the present invention, the inductive coupling matrix is designed to have a significant non-reciprocal property.

In the prior art, the inductive coupling matrices have been left as an unspecified component of the TWFET design, or have been analyzed as having reciprocal properties. This reciprocal inductive coupling has been obtained through calculations of the passive electrodes of the TWFET, or has also been obtained with calculations that include capacitances of circuit models for the active FET structure.

The prior art FIG. 1 is used to explain how this reciprocal inductive coupling is obtained with these calculations. In prior art FIG. 1, the FET 120 formed in the cross-section of a TWFET in the plane transverse to the direction of signal propagation comprises a semiconductor material 104, a source electrode 100, a drain electrode 102 and a gate electrode 106. The gate electrode 106 can be either metallic—in which case it forms a Schottky contact to the semiconductor material 104, or it can be formed as a semiconductor of opposite type to the semiconductor material 104. When the semiconductor material 104 is an n-type material and the gate electrode 106 is formed as a p-type semiconductor, the gate electrode 106 is reverse-biased—forming a rectifying contact to the semiconductor material 104 and changing the FET 120 to a junction FET (JFET). In either configuration, either metallic or formed as a semiconductor, the gate electrode 106 is reverse-biased so that little or no DC current flows into the semiconductor material 104 and so that a depletion region 108 is formed under the gate electrode 106.

In prior art FIG. 1, a source electrode region 112 and a drain electrode region 114 can be metals making ohmic contact with the semiconductor material 104 or formed with semiconductor doping. For example, when semiconductor material 104 is n-type, the source electrode region 112 and the drain electrode region 114 are highly doped $n^+$ regions—forming quasi-metallic ohmic regions. These $n^+$-ohmic regions provide an extension to the metallic conductors 116 that contact the source electrode region 112 and the drain electrode region 114. A depletion region edge 110 is in contact with the source electrode region 112 of the source electrode 100 and the drain electrode region 114 of the drain electrode 102.

The calculation of the inductive coupling matrix for this prior art structure proceeds from the calculation of the K matrix, as described earlier for the case of the ideal transmission lines. In this calculation, two AC-bias cases are considered: (a) An AC bias, $v_o$, applied to the gate electrode 106 with the source electrode 100 and the drain electrode 102 maintained at an AC bias of 0 volts; and (b) An AC bias, $v_o$, applied to the drain electrode 102 with the source electrode 100 and the gate electrode 106 maintained at an AC bias of 0 volts. For the common source configuration, an AC bias, $v_o$, refers to an AC excitation of complex value maintained between one electrode relative to the source electrode 100, while an AC bias of 0 volts means that the electrode is kept at the same AC potential as the source electrode 100.

In case (a), the charge induced on the gate electrode 106 and the drain electrode 102 is respectively:

$$q_{g,a}=K_{g-s}v_o+K_{g-d}0$$

$$q_{d,a}=K_{d-g}v_o+K_{d-s}0$$

In case (b), the charge induced on the gate electrode 106 and the drain electrode 102 is respectively:

$$q_{g,b}=K_{g-s}0+K_{g-d}v_o$$

$$q_{d,b}=K_{d-g}0+K_{d-s}v_o$$

In these equations, $q_{g,a}$ refers to the AC charge on the gate electrode 106 with AC bias case(a), $q_{d,a}$ refers to the AC charge on the drain electrode 102 with AC bias case(a), $q_{g,b}$ refers to the AC charge on the gate electrode 106 with AC bias case(b), and $q_{d,b}$ refers to the AC charge on the drain electrode 102 with AC bias case (b). $K_{g-s}$, $K_{g-d}$, $K_{d-s}$, and $K_{d-g}$ are the elements of the charge matrix, K. The elements of the first column of the K matrix are $K_{g-s}$ and $K_{d-g}$. These correspond respectively to the ratio of the charge induced on the gate electrode 106 and the drain electrode 102 to the voltage applied to the gate electrode 106 with AC-bias case (a). The elements of the second column of the K matrix are $K_{g-d}$ and $K_{d-s}$. These correspond respectively to the ratio of the charge induced on the gate electrode 106 and the drain electrode 102 to the voltage applied to the drain electrode 102 with AC-bias case(b). The off-diagonal elements of the K matrix are $K_{d-g}$ and $K_{g-d}$.

As prior art FIG. 1 suggests, the interaction of the gate electrode 106 and the drain electrode 102 in these two cases is well-approximated by a simple capacitive coupling between the electrodes. In particular, the charge induced on the drain electrode 102 with the AC bias applied to the gate electrode 106 (case(a)) is approximately equal to the charge induced on the gate electrode 106 with the AC bias applied to the drain electrode 102 (case(b)). This shows that the off-diagonal elements of the K matrix, $K_{g-d}$ and $K_{d-g}$, are approximately equal to each other. As a result, the K, L, and Z matrices are approximately reciprocal.

The preceding analysis of the K matrix calculation shows that the simple capacitive coupling of the gate electrode 106 and the drain electrode 102 of the prior art TWFET structure leads to reciprocal charge transfer and reciprocal K, L, and Z matrices. In a similar manner, when the K matrix is calculated using capacitances taken from a circuit model for the active FET, while omitting series resistance components of this circuit model, the charge transfer is also reciprocal, as are the K, L and Z matrices resulting from this analysis.

Figure 2:
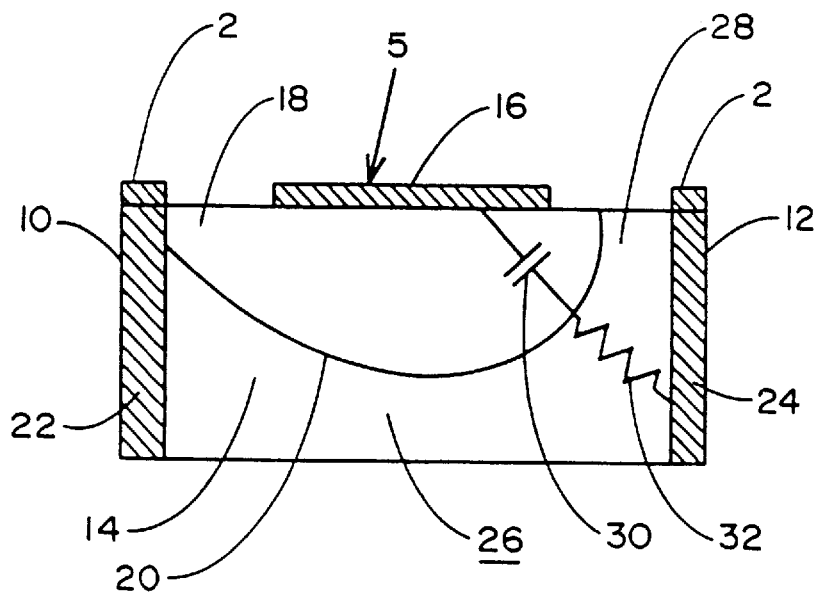
FIG. 2 is a schematic cross-section of an FET that embodies the present invention.

In FIG. 2, the FET 5 formed in the cross-section of a TWFET in the plane transverse to the direction of signal propagation comprises a semiconductor material 14, a source electrode 10, a drain electrode 12 and a gate electrode 16. The gate electrode 16 can be either metallic—in which case it forms a Schottky contact to the semiconductor material 14, or it can be formed as a semiconductor of opposite type to the semiconductor material 14. In either configuration, either metallic or formed as a semiconductor, the gate electrode 16 is reverse-biased herein defined as meaning a bias so that little or no DC current flows into the semiconductor material 14, and so that a depletion region 18 is formed under the gate electrode 16.

In the same manner as the gate electrode 16, a source electrode region 22 and a drain electrode region 24 can be metals making ohmic contact with the semiconductor material 14 or formed with semiconductor doping. For example, when semiconductor material 14 is n-type, the source electrode region 22 and the drain electrode region 24 are highly doped n$^+$ regions—forming quasi-metallic ohmic regions. These n$^+$-ohmic regions provide an extension to the metallic conductors 2 that contact the source electrode region 22 and the drain electrode region 24. In FIG. 2, a depletion region edge 20 is in contact with the source electrode region 22 of the source electrode 10, but it need not make contact with the source electrode region 22. However, as shown in FIG. 2, the depletion edge 20 cannot make contact with the drain electrode region 24.

An AC potential difference applied between the gate electrode 16 and the drain electrode 12 is distributed across the depletion region 18 and a neutral region 26 in the plane of FIG. 2. This part of the FET 5 can be considered to act as an R-C series circuit. The gate electrode 16 and the depletion region edge 20 form a capacitor 30, while the neutral region 26 provides a small series resistance 32 between the depletion region edge 20 and the drain electrode 12. The conductivity of the semiconductor material 14, and the distance of separation of the depletion region edge 20 and the drain electrode 12, can be selected so that most of the AC voltage which appears between the gate electrode 16 and the drain electrode 12 will appear across the depletion region 18, represented by the capacitor 30, and a comparatively small voltage will appear across the neutral region 26, represented by the resistor 32. In this case, almost all of the AC charge which appears on the gate electrode 16 is accompanied by changes in the depth of the depletion region 18. The comparatively small amount of AC voltage which is distributed across the neutral region 26 causes a correspondingly small AC charge to appear on the surface of the drain electrode 12.

In calculating the K matrix, the preceding argument shows that the charge induced on the drain electrode 12 with the AC bias of case(a) will be significantly less than the charge induced on the gate electrode 16 with the AC bias of case(b). As a result, the off-diagonal elements of the K matrix, $K_{g-d}$ and $K_{d-g}$, have significantly different values. Consequently, in the present invention, the K, L, and Z matrices are significantly non-reciprocal. In the description of the present invention, this effect shall be referred to as non-reciprocal inductive coupling.

The present invention obtains non-reciprocal inductive coupling by means of the separation of the depletion region edge 20 and the drain electrode 12. The separation is created by maintaining a region of semiconductor material 28 which provides a large enough distance between the depletion region edge 20 and the drain electrode 12, such that the depletion region edge 20 can screen the electric field from the drain electrode 12, as described above. The region of semiconductor material 28 between the depletion region edge 20 and the drain electrode 12 should also have sufficiently low conductivity—to establish a distinction between the region of semiconductor material 28 and the drain electrode region 24 of the drain electrode 12. As this separation between the depletion region edge 20 and the drain electrode 12 is decreased, or as the conductivity of the region of semiconductor material 28 is increased, the limit of reciprocal inductive coupling is obtained.

The preceding description of the present invention has used a TEM mode analysis to describe non-reciprocal inductive coupling by means of non-reciprocal charge transfer. As noted earlier, the TEM mode analysis provides an approximate description for transverse electric and magnetic fields in the structure of a TWFET.

The surface charge on ideal transmission line electrodes is proportional to the tangential magnetic fields at the surface of these conductors. Consequently, the non-reciprocal charge transfer of the preceding TEM mode analysis of FIG. 2 corresponds to non-reciprocity in the transverse magnetic fields at the surface of the gate electrode 16 or drain electode 12. The non-reciprocal inductive coupling of the present invention can thus be understood in terms of non-reciprocity in the charge transfer and associated non-reciprocity in the K matrix, or as an equivalence in non-reciprocity of the transverse magnetic fields which also correspond to non-reciprocity in the L and Z matrices due to the non-reciprocity of the longitudinal currents.

An importance consequence of the design of TWFETs with non-reciprocal inductive coupling is the increase in the signal power gain in the transistor. This is shown in the following pair of differential equations governing the TWFET structure:

$$\frac{d}{dz} i = -Yv$$

$$\frac{d}{dz} v = -Zi$$

In these equations, Z is defined as the sum of the diagonal series resistance matrix, R and the product of jω with L, the inductive coupling matrix. As noted earlier, R allows for series resistance on the transmission line electrodes. The parallel roles of Y and Z in these equations indicate that non-reciprocity in the inductance matrix can be just as important as non-reciprocity in the admittance matrix in providing power gain for signal amplification in the TWFET.

An important special consequence of the use of non-reciprocal inductive coupling in TWFETs is that it can increase the range of frequency of signal gain in the TWFET above that which is possible when only the effect of the non-reciprocal admittance matrix is available, such as in previous TWFET designs. In conventional transistors, i.e. those not designed as a part of an active coupled transmission line structure, there is a maximum frequency of operation above which the transistor cannot be used to provide gain to signals. In this discussion, this frequency limit is referred to as $f_{MAX}$ for the transistor. In the case of the conventional FET which forms the cross-section of the TWFET, $f_{MAX}$ represents the upper frequency limit for obtaining signal gain from the Y matrix in the TWFET. When non-reciprocal inductive coupling is present, TWFETs can provide signal power gain at frequencies above $f_{MAX}$ of the conventional FET which lies in the plane transverse to the direction of signal propagation in the TWFET. The power gain at frequencies above $f_{MAX}$ can occur when the Z coupling matrix exhibits the mathematical property that $z_{oh}$, the hermitian part of Z, defined as $Z_{oh} = \frac{1}{2}(Z+Z^*)$, (where $Z^*$ denotes the complex conjugate transpose of Z), is not non-negative definite, which is to say that $Z_{oh}$ satisfies $x^*Z_{oh}x<0$ for some nonzero complex valued vector, x, with complex conjugate transpose $x^*$. It should be noted that this is a minimal requirement for power gain in the TWFET. As will be obvious to those of ordinary skill in the art, the success of the design depends on the relative sizes of matrix elements in the Z and Y coupling matrices, in addition to this minimal requirement that the hermitian part of either Y or Z is not non-negative definite as defined above. A detailed analysis of the conditions which allow an increase in average power flow along a pair of coupled transmission lines is presented in Appendix B.

While non-reciprocal inductive coupling has been discussed in the TWFET structure, it can be obtained in similar distributed circuit elements based on the combination of an active semiconductor transistor with coupled transmission lines.

The essential requirement is that the cross-section of the distributed circuit element sustain AC surface charges on the electrodes or have transverse magnetic fields near the electrode surfaces which exhibit non-reciprocity as described above.

In the present invention, the TWFET designs are based on the use of a dual-FET structure, as disclosed in U.S. Pat. No. 4,587,541. The dual-FET structure allows the design of a single conventional FET with the understanding that the symmetry of the propagating signal in this structure has the effect of doubling the contact area of the electrodes. This doubled area implies that transforming the results of a single FET to those of a symmetric dual-FET requires doubling the calculated values for the admittance and charge matrix elements of a single FET and reducing the electrode series resistance values by a factor of 2.

The symmetry of the dual-FET allows the designs of the present invention to be developed with a 2-dimensional simulation of a single FET structure. This simulation is based on the finite element solution of the standard semiconductor equations using a TEM analysis of the TWFET. The semiconductor equations used for the present invention are those of an n-type semiconductor, neglecting generation and recombination effects:

$$-\vec{\nabla}\circ\epsilon\vec{\nabla}\phi - |q|(N_d - n) = 0$$

$$|q|\frac{\delta}{\delta t} n - \vec{\nabla}\circ\vec{J}_n = 0$$

$$\vec{J}_n = -|q|\mu_n n\vec{\nabla}\phi + |q|D_n\vec{\nabla}n$$

In these equations, |q| represents the magnitude of the electronic charge, ε represents the dielectric constant, n represents the electron concentration, $N_d$ represents the donor concentration, and φ represents the electrostatic potential, as would be consistent with a TEM analysis of the TWFET. In addition, $J_n$ represents the electron current, with an electron mobility of $\mu_n$, and an electron diffusion coefficient of $D_n$.

The simulation calculates the small-signal AC semiconductor device behavior in accordance with a method which is almost identical to the sinusoidal steady state analysis method in S. E. Laux, "Techniques for Small-Signal Analysis of Semiconductor Devices," *IEEE Transactions on Electron Devices* Vol. ED-32(10), pp. 2028–2037 (October, 1985). Following the method described earlier for the AC charge matrix calculations, two AC bias cases are used to calculate the total AC surface charge on the gate electrode 16 and the drain electrode 12 of FIG. 2, and to calculate the total AC current flowing into these electrodes. The AC surface charge on the electrodes is calculated from the normal derivative of the AC potential at these electrode surfaces In each AC bias case, the AC voltage is applied to one electrode relative to the remaining two electrodes at an AC voltage of 0. These calculations yield admittance and charge matrices by the method which was described in detail earlier for the charge matrix calculation.

In this sinusoidal steady state analysis, the complex phasor notation is used so that the time derivative in the semiconductor equations is replaced by a factor of (jω), and complex valued admittance and charge matrices are obtained. The results for admittance and charge matrices are converted to the inductance and admittance coupling matrices of the distributed dual-FET using the formulas given earlier for obtaining the inductance matrix from the charge matrix and the use of the factor of two scaling noted above. The coupling matrices are combined with selected values of series resistance for the dual-FET electrodes. In this way, the use of the 2-dimensional semiconductor device simulation of a fully specified FET in combination with series resistance values yields the complete coupling matrix information for the dual-FET structure.

Figure 3A:
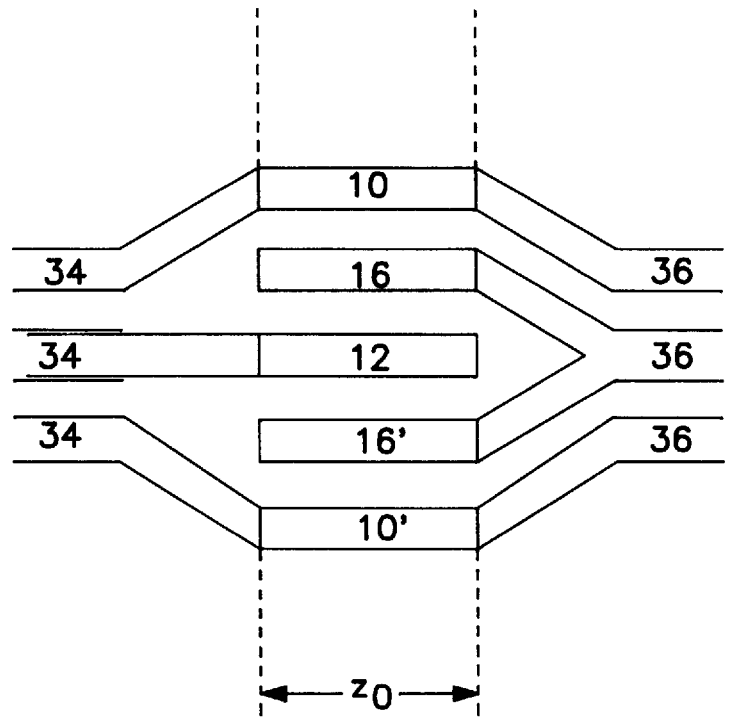
FIG. 3A is a top-view of a prior art TWFET in a coplanar transmission line.

In FIG. 3A, the TWFET is designed with open circuit terminations at the ends of the gate electrodes 16, 16' and the drain electrode 12, which are opposite to the attachments to first coplanar transmission lines 34 or second coplanar transmission lines 36. A 2-port impedance and admittance matrix can be calculated for the TWFET of FIG. 3A as a function of the coupling length, $z_o$, using an extension of the method of V. K. Tripathi, "Asymmetric Coupled Transmission Lines in an Inhomogeneous Medium," *IEEE Trans. Microwave Theory Tech.* Vol. MTT-23(9), pp. 734–739 (September, 1975) to treat the case of general (non-reciprocal) Y and Z TWFET coupling matrices. In the present invention, the 2-port admittance matrix was calculated for the coupling lengths, $z_o$, ranging from $5 \times 10^{-4}$ cm to $5 \times 10^{-2}$ cm. This admittance matrix data allows the calculation of maximum unilateral gain (U, Mason's U-function), maximum available gain (MAG), maximum stable gain (MSG), and the stability parameter (k) for the TWFET, using the standard formulas for these quantities as a function of the admittance or impedance matrix elements.

In the present invention, the electrode series resistance is calculated from the skin depth of the conductors. The resistance-per-unit length, which can be defined as the ratio of resistivity to cross-sectional area, uses the cross-sectional area formed by the product of skin depth and electrode width (or circumference). With this definition, a metallic resistivity of $10^{-6}$ ohm-cm combined with an electrode width of $10^{-4}$ cm and a skin depth of $10^{-5}$ cm provides a series resistance of $10^3$ ohm/cm or 1 k-ohm/cm. When the dual-FET structure is used, this series resistance value would reduce to 500 ohm/cm.

It should be noted that the capacitive effects due to the abrupt termination of the end of the gate electrode and drain electrode, and the inter-electrode capacitive coupling from the transverse electric fields above the surface of the semiconductor have been omitted from the present analysis. A person of ordinary skill in the art would understand that the corrections for these effects would be small.

Figure 3B:
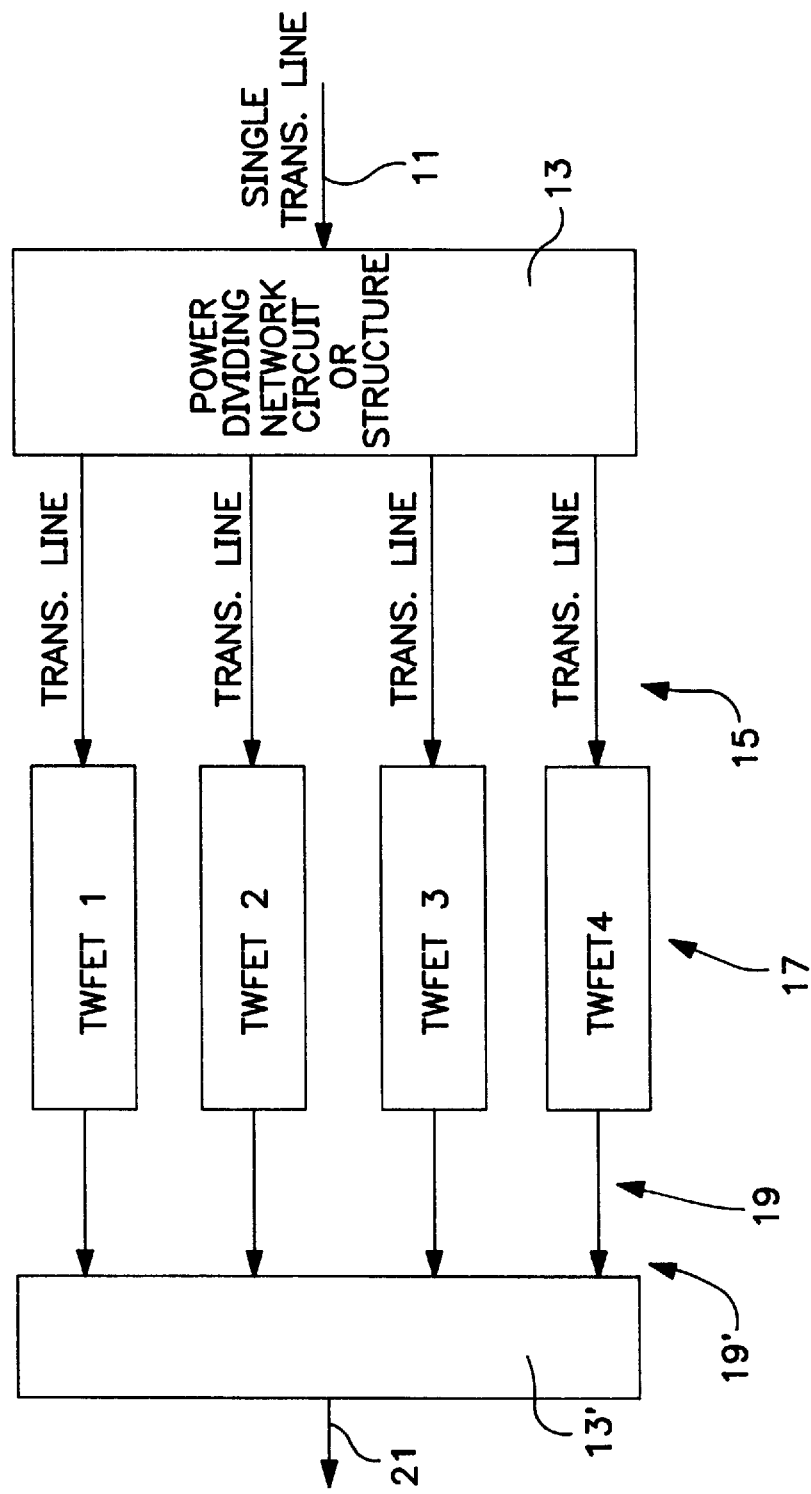
FIG. 3B is a block diagram of a parallel TWFET structure.

In FIG. 3B, four of the TWFET structures of FIG. 3A are arranged in a parallel configuration for handling signals with relatively higher power. In other preferred embodiments two, three or more than four TWFET's may be parallelled. In FIG. 3B, a single transmission line 11 carries an input signal of a relatively high power, compared to the power handling of any one of the TWFET's 17. The input signal on the single transmission line 11 is divided by a network 13 into four signals which are substantially identical in power and phase, each signal having about one fourth the input signal power. Each of these four signals are fed via identical transmission lines 15 to the input side of four TWFET's 17 each of which can easily handle the divided power levels.

The output of each of the TWFET's 19 can be used independently or any of the outputs 19 may be combined to form a higher powered output signal. Alternatively, the four TWFET's, in fact, operate in parallel when the input signals are in-phase no matter what the input signal source may be. In fact, in other preferred embodiments, the network 13 and/or 13' may not be used. As known in the art, when the TWFET's are used for signal amplification, for optimal power transfer, the input and output impedances of the surrounding circuitry should present a conjugate match to the TWFET input and output. In this preferred embodiment, impedance matching circuitry (not shown) could be designed for location on the single transmission line 11. Alternatively, impedance matching networks (not shown) may be designed for location at the transmission lines 15 which connect to the inputs of the four TWFET's 17.

As referenced above and as known in the art, the outputs 19 of the four TWFET's may be connected to transmission lines that lead to a network similar to network 13. In this case the network 13' receives the signals carried on the transmission lines 19' from the four TWFET outputs and combines them into a signal of relatively higher power on the single transmission line 21. Impedance matching circuitry could be designed for location at the single output transmission line 21 or, alternatively, impedance matching circuitry could be designed for location at the transmission lines 19'. The transmission lines 15 and 19' may be microstrip or coplanar transmission lines. When coplanar transmission lines are used, the TWFET's may be of the type shown in FIG. 3A.

The power dividing networks 13 and 13' may use conductive lines formed by the branching of a single transmission line conductor to form multiple identical transmission line conductors. When such branching is used, one of the branched transmission line conductors may cross over another using a structure known as an air bridge or using other structures which use dielectric materials to insulate the metallic electrodes when one metal electrode crosses over another.

Directional couplers formed with coupled transmission lines in which the coupled transmission line structure is designed to function as a power splitter may also be used in-power dividing networks. These power splitters may be combined in series so that a signal from a single transmission line is fed into a power splitter which in turn transfers the signal into two more power splitters, each of which transfers the signal into two more output transmission lines. This combination of three power splitters would create a power dividing network which can transfer an incoming signal on a single transmission line to output signals on four transmission lines. This concept may be repeated with combinations of more power splitters to further divide the power of the input signal as needed in various embodiments of the present invention.

In the power dividing stuctures, care should be taken to provide identical signals, having identical phases to the input of each TWFET.

Figure 4:
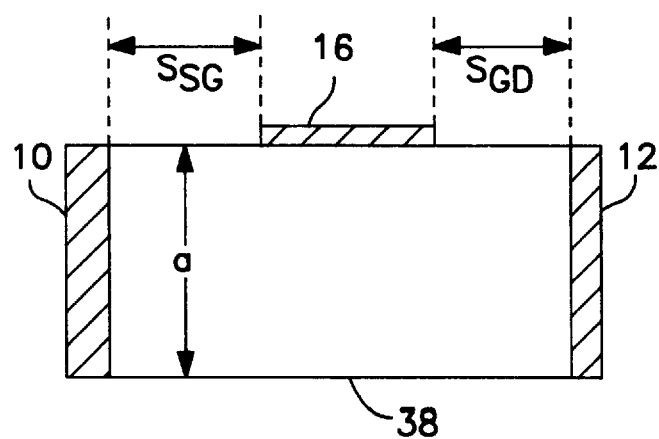
FIG. 4 is a schematic cross-section of an FET that embodies the present invention and depicts various parameters of the FET.

In FIG. 4, $S_{SG}$ represents the source-to-gate inter-electrode separation distance, $S_{GD}$ represents the gate-to-drain inter-electrode separation distance, and a represents the depth of a channel 38.

The n-type material used for the FET semiconductor has a conductivity of approximately 1.6 Siemens/cm for most of the semiconductor region. For example, an n-type semiconductor with a donor concentration of $10^{16} \text{cm}^{-3}$ and a constant electron mobility of $10^3 \text{cm}^2/\text{V-sec}$ could be used. This conductivity could be obtained with n-type GaAs composed of a net donor density to obtain this equilibrium electron concentration, but with an electron mobility which is reduced by means of some partial compensation of the n-type material with p-type acceptors or by some damage to the material. Those of ordinary skill in the art will recognize that when n-type silicon is used little or no modification to the donor density or electron mobility is needed. Since actual electron mobility in semiconductor devices is a function of many physical parameters, including the electric field strength, the specified conductivity of 1.6 mhos/cm can be obtained by locally adjusting the net donor concentration, as needed.

Figure 6:
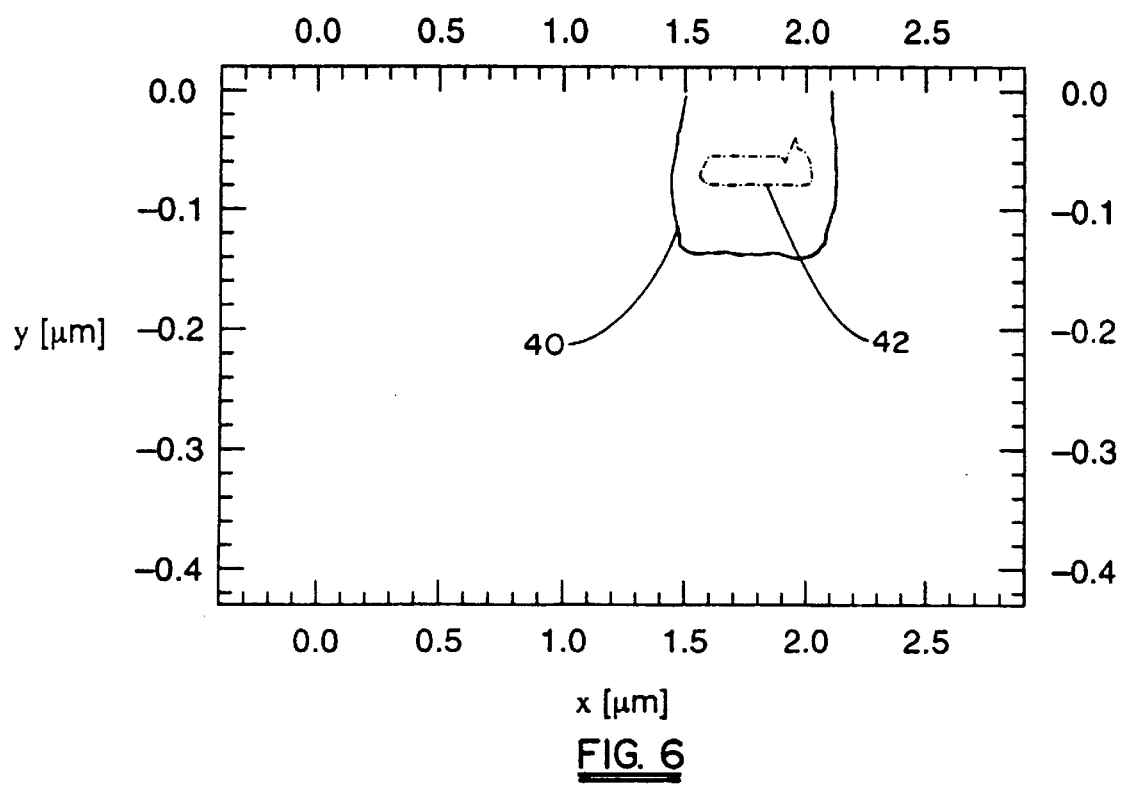
FIGS. 6–8 are contour plots of donor density for an FET that embodies the present invention.
Figure 7:
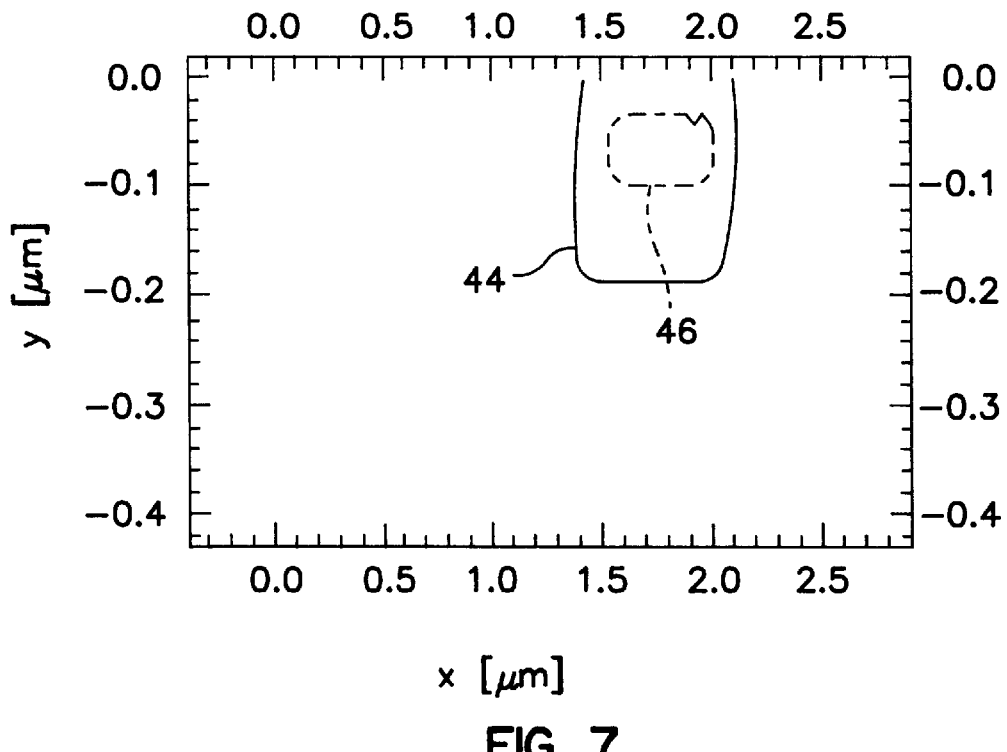
Figure 8:
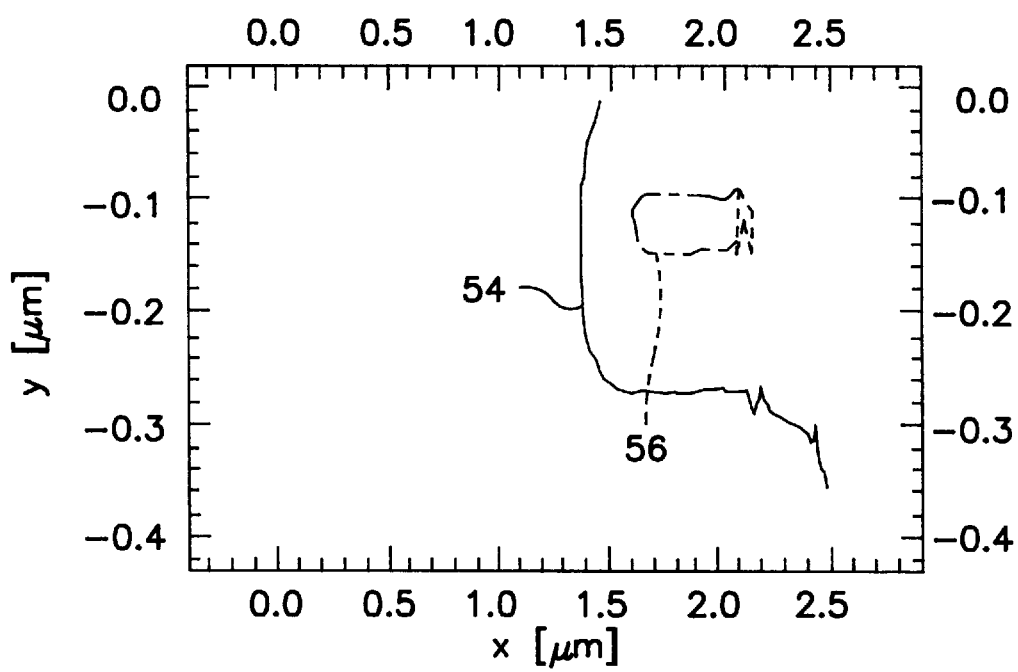

In addition to the TWFET examples with uniform conductivity and uniform net donor density of $10^{16} \text{cm}^{-3}$, three examples with local regions of increased doping density (and correspondingly increased conductivity) were used for the present invention. These TWFET structures with non-uniform doping density used distributions of net donor concentrations as shown in FIGS. 6 through 8. FIGS. 6 through 8 show the contours of net donor concentrations in the FET in the plane transverse to the direction of signal propagation in the TWFET. In FIG. 6, a solid-line contour 40 has a value of $1.5 \times 10^{16} \text{cm}^{-3}$ and a dashed-line contour 42 has a value of $3.5 \times 10^{16} \text{cm}^{-3}$. The contour lines 40 and 42 indicate the local region of increased donor density with the rest of the semiconductor of the FET having a background donor concentration of $10^{16} \text{cm}^{-3}$. The maximum value of the net donor concentration in the local region of increased donor density is approximately $3.9 \times 10^{16} \text{cm}^{-3}$, located within the dashed-line contour 42.

In FIG. 7, a similar donor density contour plot for a different donor density distribution is shown. As in the case of FIG. 6, FIG. 7 indicates a local region of increased net donor density with the rest of the semiconductor of the FET having a background donor concentration of $10^{16} \text{cm}^{-3}$. In FIG. 7, a solid-line contour 44 has a value of $1.5 \times 10^{16} \text{cm}^{-3}$ and a dashed-line contour 46 has a value of $4.0 \times 10^{16} \text{cm}^{-3}$. The maximum value of the net donor concentration in the local region of increased donor density is approximately $5.2 \times 10^{16} \text{cm}^{-3}$, located within the dashed-line contour 46.

In FIG. 8, another similar donor density contour plot for a third donor density distribution is shown. As in the cases of FIG. 6 and FIG. 7, FIG. 8 indicates a local region of increased net donor density with the rest of the semiconductor having a background donor concentration of $10^{16} \text{cm}^{-3}$. In FIG. 8, a solid-line contour 54 has a value of $1.5 \times 10^{16} \text{cm}^{-3}$ and a dashed-line contour 56 has a value of $4.0 \times 10^{16} \text{cm}^{-3}$. The maximum net donor concentration in the region of increased donor density is approximately $4.2 \times 10^{16} \text{cm}^{-3}$, located within the dashed-line contour 56. These local regions of increased net donor density, shown in FIGS. 6–8, can be created using typical device fabrication techniques. For example, the local regions can be formed with ion implantation through a mask window on the surface of a semiconductor of uniform donor density of $10^{16} \text{cm}^{-3}$.

In the present invention, the Schottky barrier height used for the TWFET structures was 0.7505 eV. This barrier height value corresponds to the value of built-in potential obtained with the abrupt depletion model of the junction of the Schottky contact with the n-type semiconductor. As a result, it specifies a built-in potential for the Schottky contact to the semiconductor, not a true barrier height value.

Figure 5:
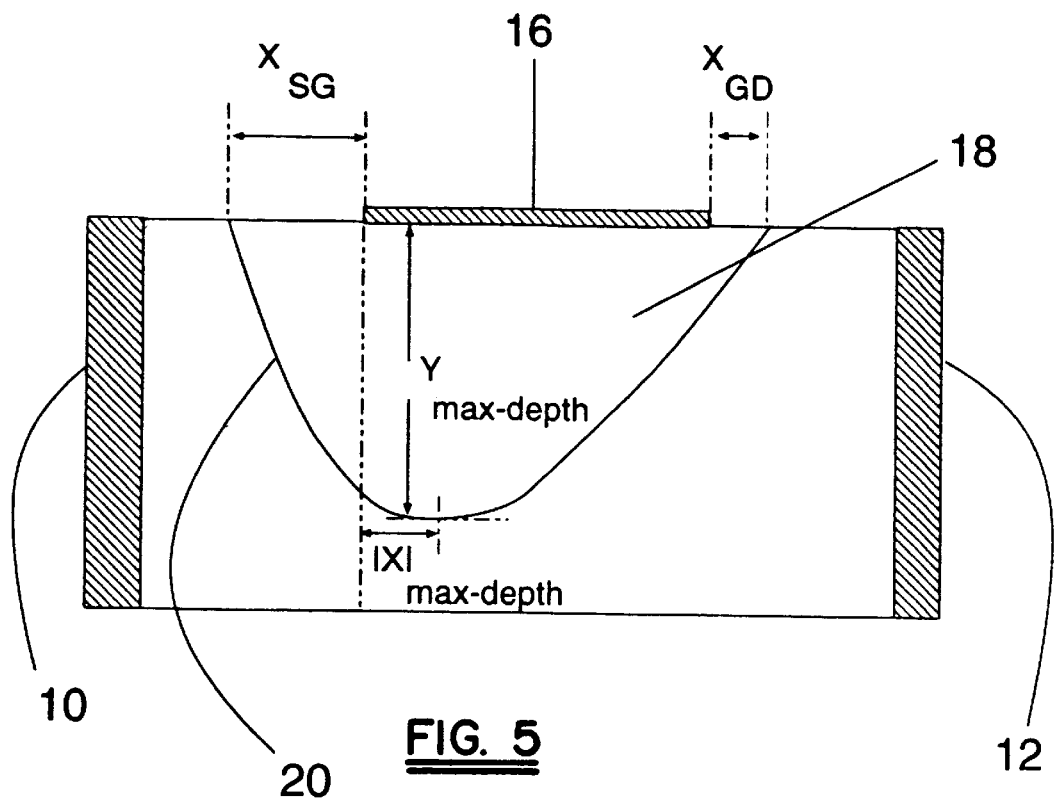
FIG. 5 is a schematic cross-section of an FET that embodies the present invention and depicts various parameters of the FET's depletion region.

In FIG. 5, the general features of the depletion region 18, as used in the TWFETs of the present invention, is shown. In the present invention, the shape of the depletion region 18 is a mirror-image of the shape of a depletion region found in the prior art FETs. The shape of the depletion region 18 is obtained when the depletion region edge 20 is further away from the gate electrode 16 at the end near the source electrode 10 than the depletion region edge 20 is from the gate electrode 16 at the end near the drain electrode 12. The deepest point of the depletion region 18 is located almost directly below the end of the gate electrode 16 near the source electrode 10. The parameter $X_{SG}$ represents the horizontal distance from the depletion region edge 20 to the gate electrode 16 between the source electrode 10 and the gate electrode 16, $X_{GD}$ represents the horizontal distance from the gate electrode 16 to the depletion region edge 20 between the gate electrode 16 and the drain electrode 12, $|X|_{max\text{-}depth}$ represents the absolute value of the difference in horizontal distance from the deepest point of the depletion region 18 as compared to the location of the end of the gate electrode 16 nearest the source electrode 10, and $Y_{max\text{-}depth}$ represents the vertical distance at the deepest point in the depletion region 18.

In the abrupt depletion model of the FET, the depletion region edge 20 can be considered as the boundary between the neutral region 26 in which, for n-type semiconductors, the electron concentration is approximately equal to the doping density, and the depletion region 18, in which the electron concentration is approximately zero. In the present invention, the depletion region edge 20 is defined as the point at which the electron concentration decreases to half of the donor concentration of the majority of the semiconductor in the FET. In the present invention, this is a concentration value of $5 \times 10^{15} \text{cm}^{-3}$.

The shape of the depletion region 18 has been obtained in the present invention by use of negative DC-bias on the drain electrode 12 relative to the source electrode 10. The gate electrode 16 and the drain electrode 12 are supplied with DC biasing by the use of bias tees (not shown) attached to the coplanar transmission lines 34 and 36. It is possible that the DC-bias value of the drain electrode 12 can create a total potential difference for the contact junction between the gate electrode 16 and the drain electrode 12 which is almost zero or is quite close to a forward bias condition for the gate electrode 16 relative to the drain electrode 12. In order to avoid being this close to a forward bias condition for the gate electrode 16, the doping density between the gate electrode 16 and the depletion region edge 20 near the drain electrode 12 should be increased. This allows the same shape of the depletion region 18 to be obtained with a larger reverse bias between the gate electrode 16 and the drain electrode 12. The same technique can be applied to obtain the same shape of the depletion region 18 with a positive DC-bias on the drain electrode 12 relative to the source electrode A series of TWFETs were designed, as discussed above, that provided gain above the $f_{MAX}$ of the FET contained in the cross-section of the TWFET. In the first series, referred to as the "forward" configuration, the signal was applied using the symmetric mode of operation for coplanar transmission lines shown in FIG. 3A. Thus, the signal input was applied identically to the pair of electrodes of the source electrode 10 and the gate electrode 16, and to the pair of electrodes of the source electrode 10' and the gate electrode 16'. The signal output was taken from the pair of electrodes of the source electrode 10 and the drain electrode 12, and the pair of electrodes of the source electrode 10' and the drain electrode 12. Table I shows the gain values for this series of "forward" configuration TWFETs.

TABLE I(a)

| CASE | $V_{gate}$ volts | $V_{drain}$ volts | $S_{SG}$ microns | $S_{GD}$ microns | Gate Length microns | Donor Distribution Type |
|---|---|---|---|---|---|---|
| 1 | −.4988 | −1.103 | 0.5 | 1.0 | 1.0 | Uniform |
| 2 | −.4988 | −1.203 | 1.0 | 0.5 | 1.0 | Uniform |
| 3 | −.4988 | −1.203 | 1.0 | 0.5 | 0.25 | Uniform |
| 4 | −.4988 | −1.203 | 0.5 | 0.5 | 0.25 | Uniform |
| 5 | −.4988 | −1.203 | 1.0 | 0.5 | 1.0 | FIG. 6 |
| 6 | −.4988 | −1.203 | 1.0 | 0.5 | 1.0 | FIG. 8 |

The DC-bias values are relative to the source electrode 10. The source electrode 10 is DC-biased at 0 V. In Cases 1–4, the donor distribution has a uniform concentration of $10^{16} \text{cm}^{-3}$. In Case 5, the donor distribution has a local region of increased concentration—as shown in FIG. 6. In Case 6, the donor distribution has a local region increased concentration—as shown in FIG. 8.

TABLE I(b)

Figure 9:
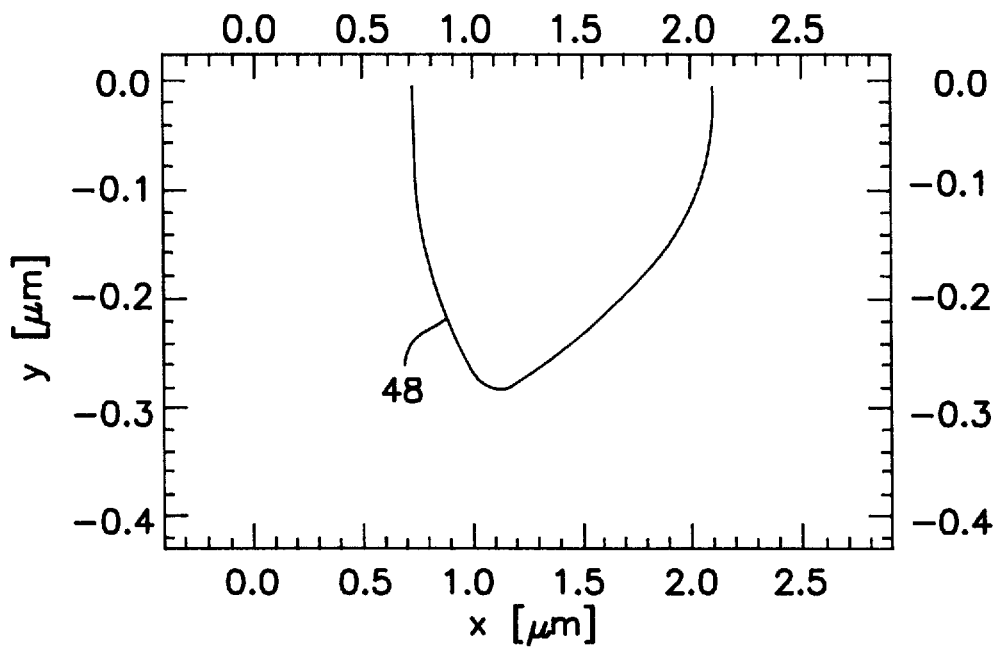
FIGS. 9–12 are contour plots of DC electron concentration for an FET that embodies the present invention.
Figure 10:
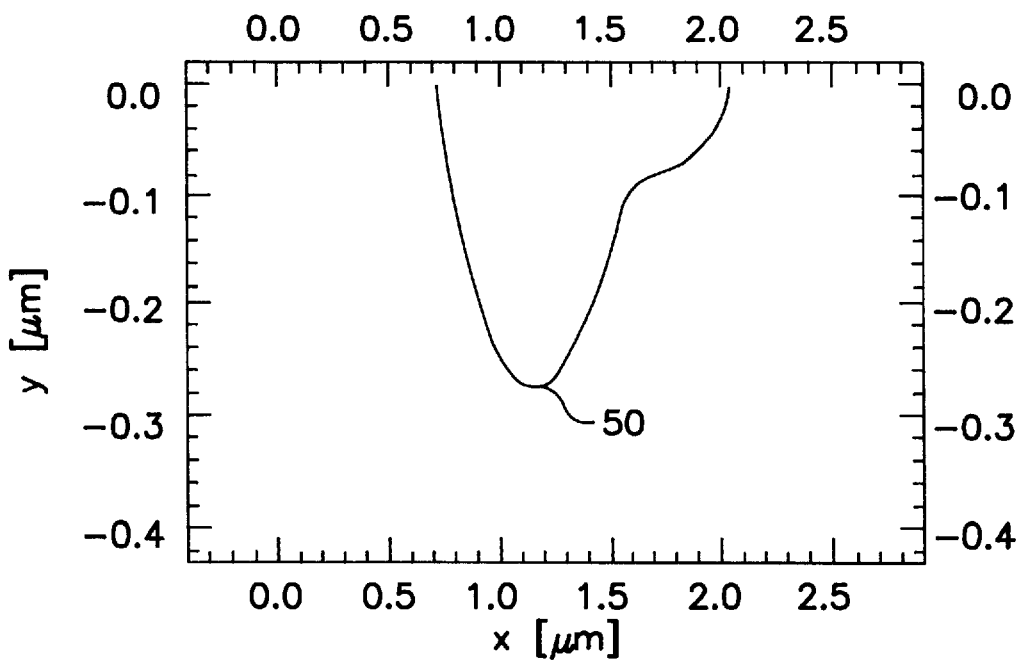
Figure 12:
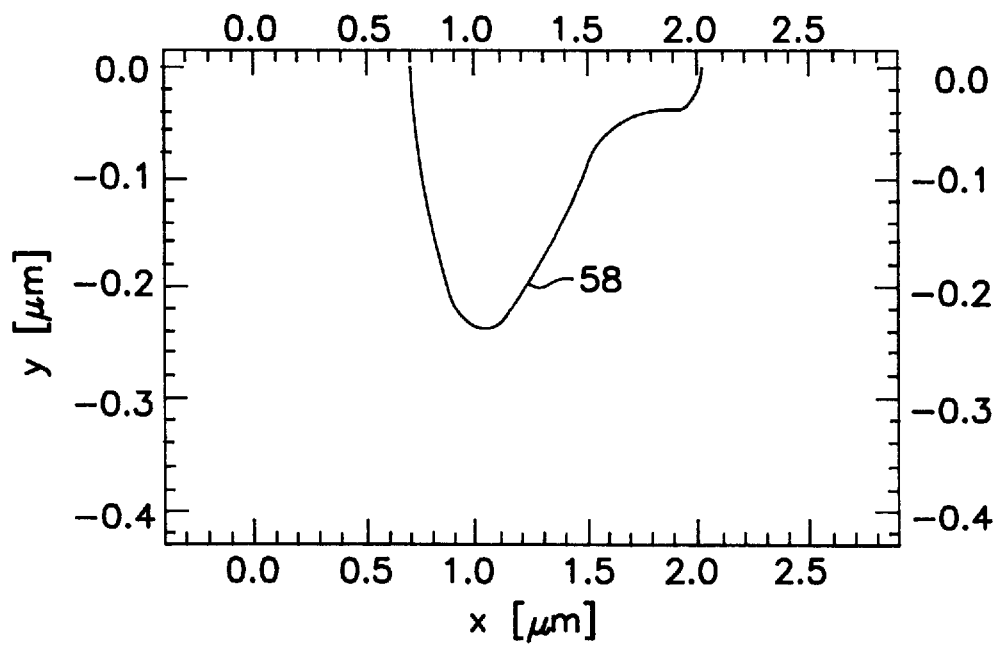

| CASE | $X_{SG}$ microns | $X_{GD}$ microns | $\|X\|_{max\text{-}depth}$ microns | $Y_{max\text{-}depth}$ microns | Depletion Region Type |
|---|---|---|---|---|---|
| 1 | 0.3 | 0.1 | 0.1 | 0.3 | FIG. 9 |
| 2 | 0.3 | 0.1 | 0.1 | 0.3 | FIG. 9 |
| 3 | 0.3 | 0.1 | <0.1 | 0.2 | FIG. 9 |
| 4 | 0.3 | 0.1 | <0.1 | 0.2 | FIG. 9 |
| 5 | 0.3 | 0.1 | 0.1 | 0.3 | FIG. 10 |
| 6 | 0.3 | <0.1 | <0.1 | 0.2 | FIG. 12 |

In Cases 1–4, the shape of the depletion region 18 is of the shape shown in the DC electron concentration contour plot of FIG. 9. In FIG. 9, a solid-line electron concentration contour 48 has a value of $5 \times 10^{15} cm^{-3}$, the value assigned to the depletion region edge as earlier noted. In Case 5, the shape of the depletion region 18 is of the shape shown in the DC electron concentration contour plot of FIG 10. In FIG. 10, a solid-line electron concentration contour 50 has a value of $5 \times 10^{15} cm^{-3}$, the value assigned to the depletion region edge as earlier noted. In Case 6, the shape of the depletion region 18 is of the shape shown in the DC electron concentration contour plot of FIG. 12. In FIG. 12, a solid-line electron concentration contour 58 has a value of $5 \times 10^{15} cm^{-3}$, the value assigned to the depletion region edge as earlier noted.

The values for $X_{sg}$, $X_{gd}$, $|X|_{max\text{-}depth}$, and $Y_{max\text{-}depth}$ are rounded to the nearest 0.1 micron.

TABLE I(c)

| CASE | | $f_{MAX}$ GHz | a microns | $R_g$ ohm/cm | $R_d$ ohm/cm | U ($Z_{0,U}$) ($10^{-2}$ cm) | MAG ($Z_{0,MAG}$) ($10^{-2}$ cm) | MAG ($Z_{0,MAG}$) ($10^{-2}$ cm) |
|---|---|---|---|---|---|---|---|---|
| 1 | | 10 | 0.43 | 500 | 500 | 1.3 (3.1) | 1.46 (3.1) | NA |
| 2 | (a) | 10 | 0.43 | 625 | 625 | 4.6 (3.2) | 2.0 (3.6) | 3.45 (3.5) |
|   | (b) | | | 750 | 750 | 1.2 (3.1) | 1.26 (3.1) | NA |
| 3 | (a) | 15 | 0.43 | 625 | 625 | NA | 1.85 (3.6) | 3.67 (3.4) |
|   | (b) | | | 690 | 625 | 5.4 (3.1) | 1.6 (3.5) | 3.57 (3.4) |
|   | (c) | | | 750 | 750 | 2.4 (3.0) | 1.86 (3.3) | 2.85 (3.2) |
| 4 | (a) | 30 | 0.43 | 350 | 275 | 3.7 (3.1) | 2.34 (3.4) | 3.56 (3.3) |
|   | (b) | | | 400 | 300 | 1.6 (3.0) | 2.22 (3.1) | 2.4 (3.0) |
| 5 | | <1.0 | 0.43 | 275 | 275 | NA | 1.8 (3.6) | 2.54 (4.15) |
| 6 | | <1.0 | 0.43 | 275 | 275 | NA | 3.1 (4.0) | 4.6 (3.9) |

In Cases 1–4 and 6, the gain data are for a 100 GHz signal frequency. In Case 5, the gain data is for a 70 GHz signal frequency. In Cases 1–4, the gain values were observed over a range of coupling lengths of $2 \times 10^{-3}$ cm to $5.1 \times 10^{-2}$ cm. In Cases 5–6, the gain values were observed over a range of coupling lengths of $5 \times 10^{-4}$ cm to $5 \times 10^{-2}$ cm. The columns of U, MAG, and MSG contain the maximum applicable values for these gain parameters which were observed for these ranges of coupling lengths. As those with ordinary skill in the art are aware, MAG is a valid gain parameter when the stability parameter is greater than unity, and MSG is a valid gain parameter when the stability parameter, k, is less than unity, but positive. In Cases 1 and 2(b), the use of "NA" for MSG values indicates that no coupling lengths were observed to have k less than unity, therefore MSG was not applicable to these cases. In Cases 3(a), 5 and 6, the use of "NA" for U values indicates examples for which no valid maximum value of U could be assigned due to the appearance of regions of the coupling length for which U was negative. Coupling length values which lie at the boundaries of these negative-U regions have an infinite value for U. Consequently, in these cases, no maximum value for U can be assigned. In Table I(c), the coupling lengths and gain data should be interpreted as approximate values and the $f_{max}$ frequency is approximated to within 5 GHz.

In FIGS. 13–36, the variation with frequency for the AC admittance matrix elements for the FETs in this series of "forward" configuration TWFETs is shown. FIGS. 13–16 show the AC admittance matrix elements for Case 1, FIGS. 17–20 show the AC admittance matrix elements for Case 2, FIGS. 21–24 show the AC admittance matrix elements for Case 3, FIGS. 25–28 show the AC admittance matrix elements for Case 4, FIGS. 29–32 show the AC admittance matrix elements for Case 5, and FIGS. 33–36 show the AC admittance matrix elements for Case 6. The charge matrix element values have been normalized to the value of the dielectric constant of free space, to yield a dimensionless quantity. In FIGS. 37–60, the variation with frequency for the AC charge matrix elements for this series of "forward" configuration TWFETs is shown. FIGS. 37–40 show the AC charge matrix elements for Case 1, FIGS. 41–44 show the AC charge matrix elements for Case 2, FIGS. 45–48 show the AC charge matrix elements for Case 3, FIGS. 49–52 show the AC charge matrix elements for Case 4, FIGS. 53–56 show the AC charge matrix elements for Case 5, and FIGS. 57–60 show the AC charge matrix elements for Case 6. In FIGS. 13–60 the notation used for the subscripts dg, ds, gd, and gs of the charge and admittance matrix elements is explained in the detailed description of the charge matrix calculation. The curve markers indicate the frequency values 1 GHz, 40 GHz, 70 GHz and 120 GHz in sequence for each matrix element curve.

In the second series, referred to as the "reverse" configuration, the signal was applied using the symmetric mode of operation for coplanar transmission lines shown in FIG. 3A. Thus, the signal input was applied identically to the pair of electrodes of the source electrode 10 and the drain electrode 12, and to the pair of electrodes of the source electrode 10' and the drain electrode 12. The signal output was taken from the pair of electrodes of the source electrode 10 and the gate electrode 16, and the pair of electrodes of the source electrode 10' and the gate electrode 16'. With this "reverse" configuration, the elements of the coupling matrices and voltage and current vectors of the transmission line equations must be re-ordered to correspond. For example, with this re-ordering of the matrix, the first column of the Z matrix contains $Z_{ds}$ and $Z_{gd}$ and the second column of the Z matrix contains $Z_{dg}$ and $Z_{gs}$, making the diagonal elements of the Z matrix $Z_{ds}$ and $Z_{gs}$. A similar re-ordering is also required for the Y matrix. Table II shows the parameters and gain values for this series of "reverse" configuration TWFETs.

TABLE II(a)

| CASE | $V_{gate}$ volts | $V_{drain}$ volts | $S_{SG}$ microns | $S_{GD}$ microns | Gate Length microns | Donor Distribution Type |
|---|---|---|---|---|---|---|
| 1 | −.4988 | −1.203 | 1.0 | 0.5 | 1.0 | Uniform |
| 2 | −.4988 | −1.203 | 1.0 | 0.5 | 1.0 | FIG. 6 |
| 3 | −.5988 | −1.203 | 1.0 | 0.5 | 1.0 | FIG. 7 |

The DC-bias values are relative to the source electrode 10. The source electrode 10 is DC-biased at 0 V. In Case 1, the donor distribution has a uniform concentration of $10^{16} \text{cm}^{-3}$. In Case 2, the donor distribution has a local region of increased concentration—as shown in FIG. 6. In Case 3, the donor distribution has a local region of increased concentration—as shown in FIG. 7.

TABLE II(b)

Figure 11:
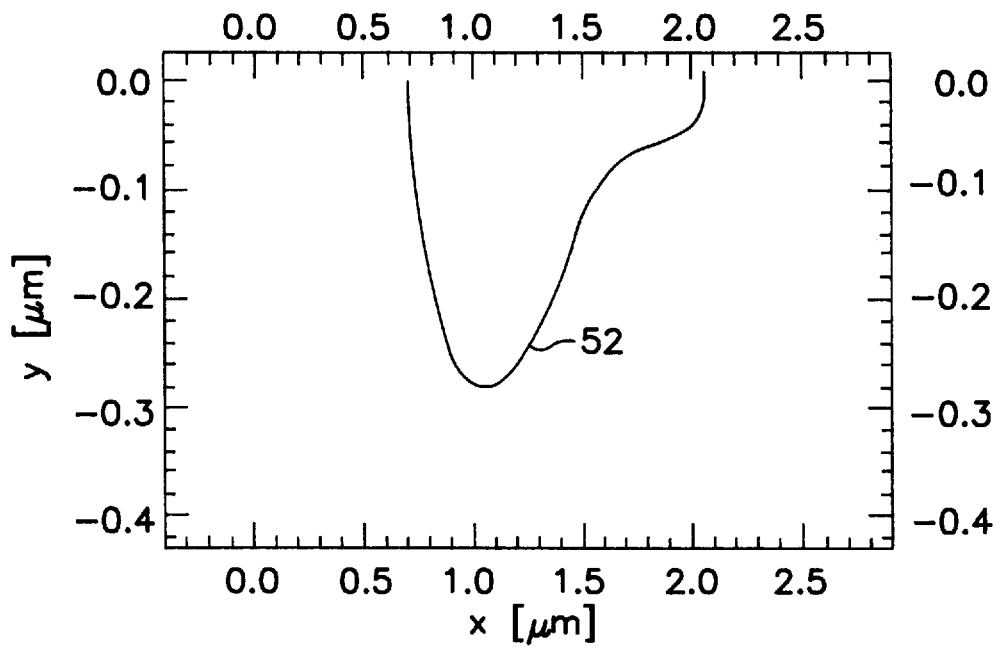

| CASE | $X_{SG}$ microns | $X_{GD}$ microns | $|X|_{\text{max-depth}}$ microns | $Y_{\text{max-depth}}$ microns | Depletion Region Type |
|---|---|---|---|---|---|
| 1 | 0.3 | 0.1 | 0.1 | 0.3 | FIG. 9 |
| 2 | 0.3 | 0.1 | 0.1 | 0.3 | FIG. 10 |
| 3 | 0.3 | 0.1 | 0.1 | 0.3 | FIG. 11 |

In Case 1, the shape of the depletion region 18 is of the shape shown in the DC electron concentration contour plot of FIG. 9. In FIG. 9, the solid-line electron concentration contour 48 has a value of $5 \times 10^{15} \text{cm}^{-3}$, the value assigned to the depletion region edge as earlier noted. In Case 2, the shape of the depletion region 18 is of the shape shown in the DC electron concentration contour plot of FIG. 10. In FIG. 10, the solid line electron concentration contour 50 has a value of $5 \times 10^{15} \text{cm}^{-3}$, the value assigned to the depletion region edge as earlier noted. In Case 3, the shape of the depletion region 18 is of the shape shown in the DC electron concentration contour plot of FIG. 11. In FIG. 11, a solid-line electron concentration contour 52 has a value of $5 \times 10^{15} \text{cm}^{-3}$, the value assigned to the depletion region edge as earlier noted.

The values for $X_{sg}$, $X_{gd}$, $|X|_{\text{max-depth}}$, and $Y_{\text{max-depth}}$ are rounded to the nearest 0.1 micron.

TABLE II(c)

| CASE | $f_{MAX}$ GHz | a microns | $R_g$ ohm/cm | $R_d$ ohm/cm | U $(Z_{0,U})$ $(10^{-2} \text{cm})$ | MAG $(Z_{0,MAG})$ $(10^{-2} \text{cm})$ | MAG $(Z_{0,MAG})$ $(10^{-2} \text{cm})$ |
|---|---|---|---|---|---|---|---|
| 1 | 10 | 0.43 | 600 | 600 | 9.67 (3.2) | <1.0 | <1.0 |
| 2 | <1.0 | 0.43 | 600 | 600 | 7.43 (3.25) | <1.0 | <1.0 |
| 3 | <1.0 | 0.43 | 600 | 600 | 4.24 (3.25) | <1.0 | <1.0 |

In Table II(c), the U, MAG, and MSG columns indicate the maximum applicable values of these gain parameters that were observed over a range of coupling length values of $5 \times 10^{-4}$ cm to $5 \times 10^{-2}$ cm, for a signal frequency of 100 GHz. All MAG and MSG values were less than unity for this entire range of coupling lengths. The coupling lengths for the maximum U-function values and the magnitude of the U-function value should be interpreted as approximate values for these parameters and the $f_{MAX}$ frequency is approximated to within 5 GHz.

In FIGS. 61–72, the variation with frequency for the AC admittance matrix elements for the FETs in this series of "reverse" configuration TWFETs is shown. FIGS. 61–64 show the AC admittance matrix elements for Case 1, FIGS. 65–68 show the AC admittance matrix elements for Case 2, and FIGS. 69–72 show the AC admittance matrix elements for Case 3. The charge matrix element values have been normalized to the value of the dielectric constant of free space, to yield a dimensionless quantity. In FIGS. 73–84, the variation with frequency for the AC charge matrix elements for this series of "reverse" configuration TWFETs is shown. FIGS. 73–76 show the AC charge matrix elements for Case 1, FIGS. 77–80 show the AC charge matrix elements for Case 2, and FIGS. 81–84 show the AC charge matrix elements for Case 3. In FIGS. 61–84, the notation used for the subscripts dg, ds, gd, and gs of the charge and admittance matrix elements is explained in the detailed description of the charge matrix calculation. The curve markers indicate the frequency values 1 GHz, 40 GHz, 70 GHz and 120 GHz in sequence for each matrix element curve.

In Table I, Cases 5 and 6 and Table II, Cases 2 and 3, the TWFETs have localized regions of increased donor density. This non-uniform donor distribution provides an important advantage for these cases relative to the other cases—the region of increased donor density will reduce the movement of the depletion region edge 20 when large values of inter-electrode AC voltages are present in signals propagating through the TWFET structure. Thus, these cases can provide linear signal amplification for a signal with a larger AC voltage component than those cases without localized regions of increased donor density. These advantages of increased donor density can be extended to structures with a uniform conductivity, by increasing the donor density while simultaneously reducing the electron mobility so that the conductivity value of 1.6 Siemens/cm is maintained. The increased donor density restricts the movement of the depletion region edge, while the adjustment of the conductivity value allows the high frequency characteristics of the TWFET to remain unchanged.

Figure 13:
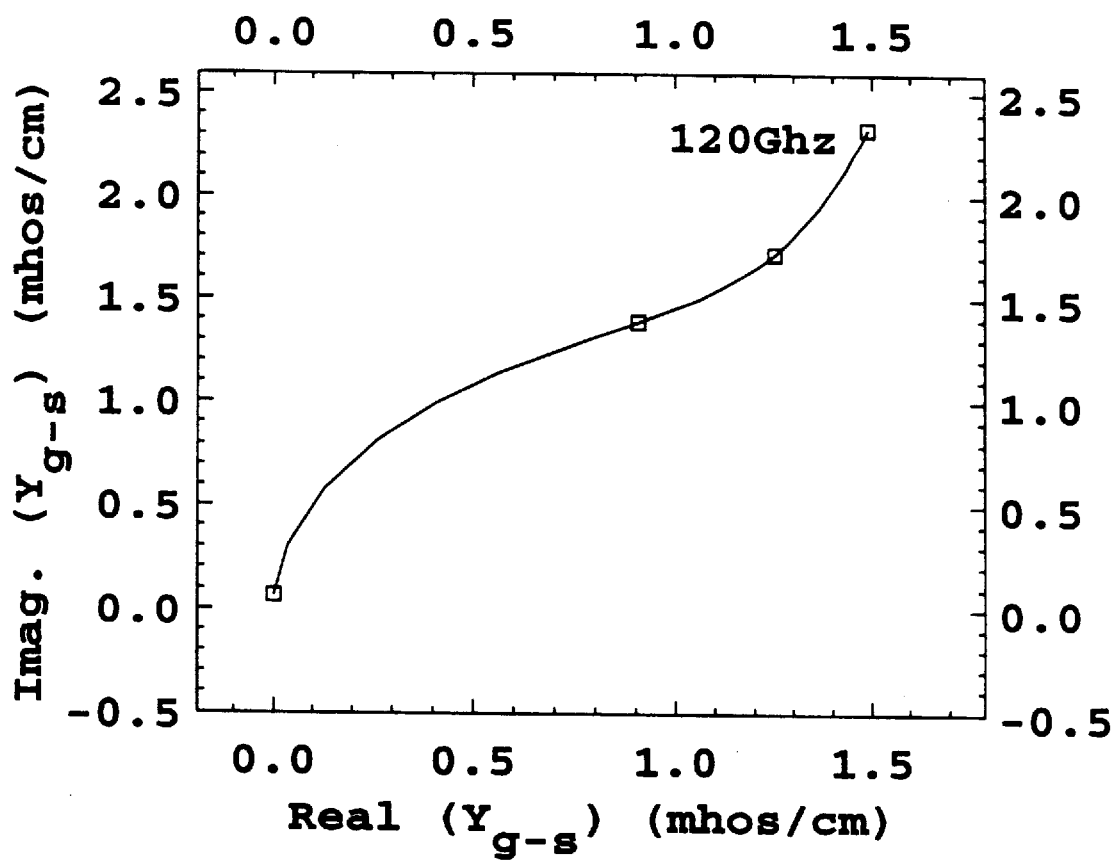
FIGS. 13–36 show the variation in the AC admittance matrix for specific FETs of the present invention in the "forward" configuration.
Figure 14:
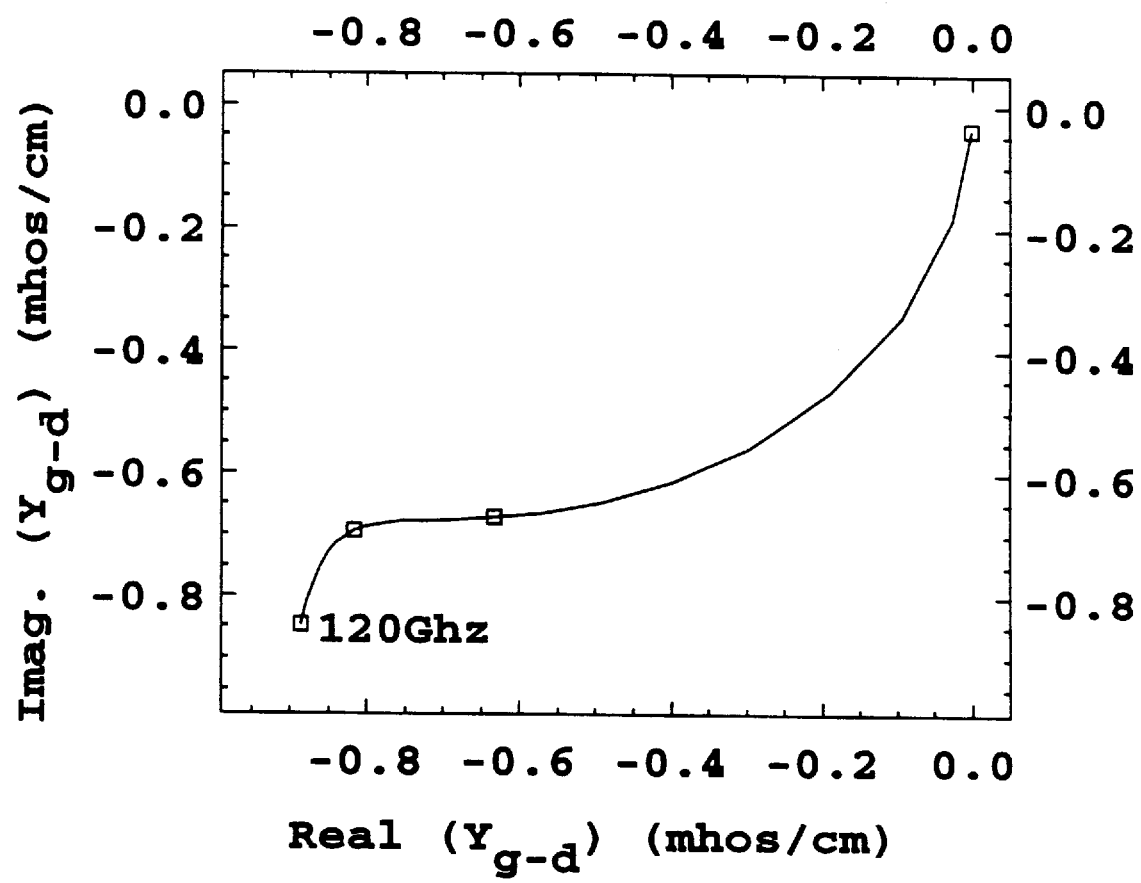
Figure 15:
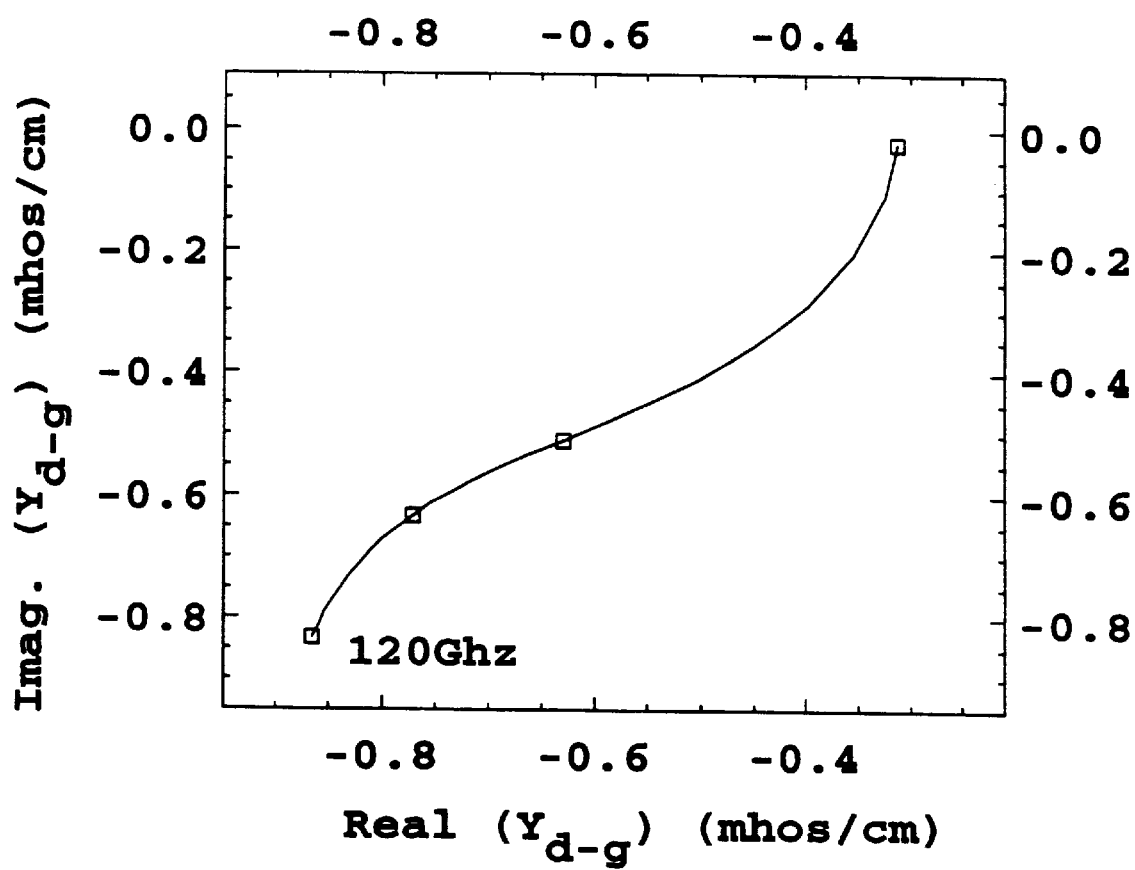
Figure 16:
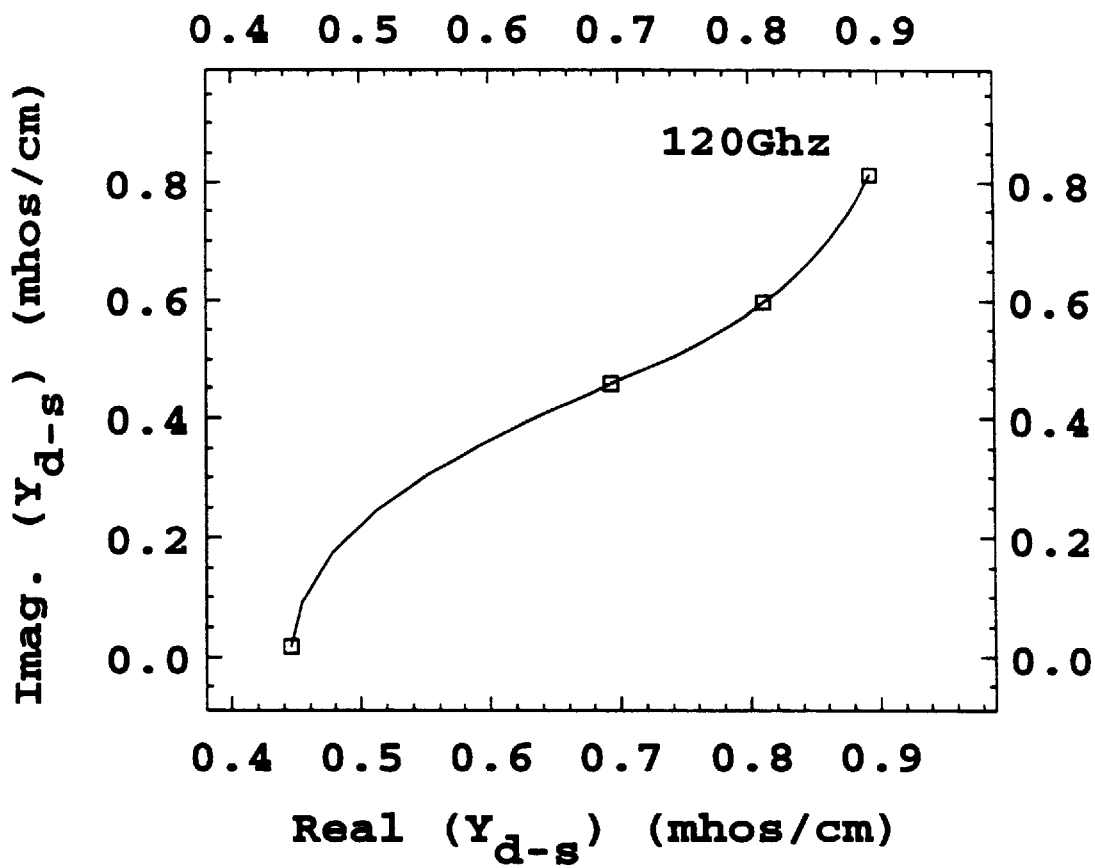
Figure 17:
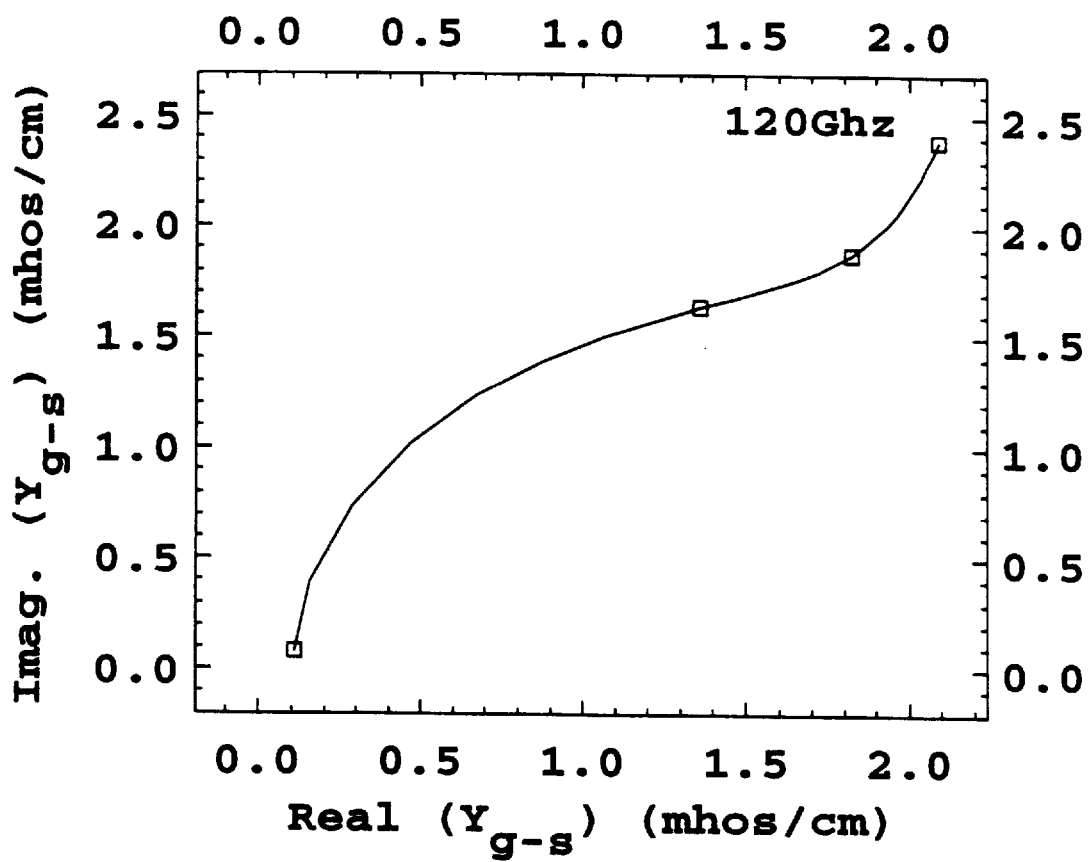
Figure 18:
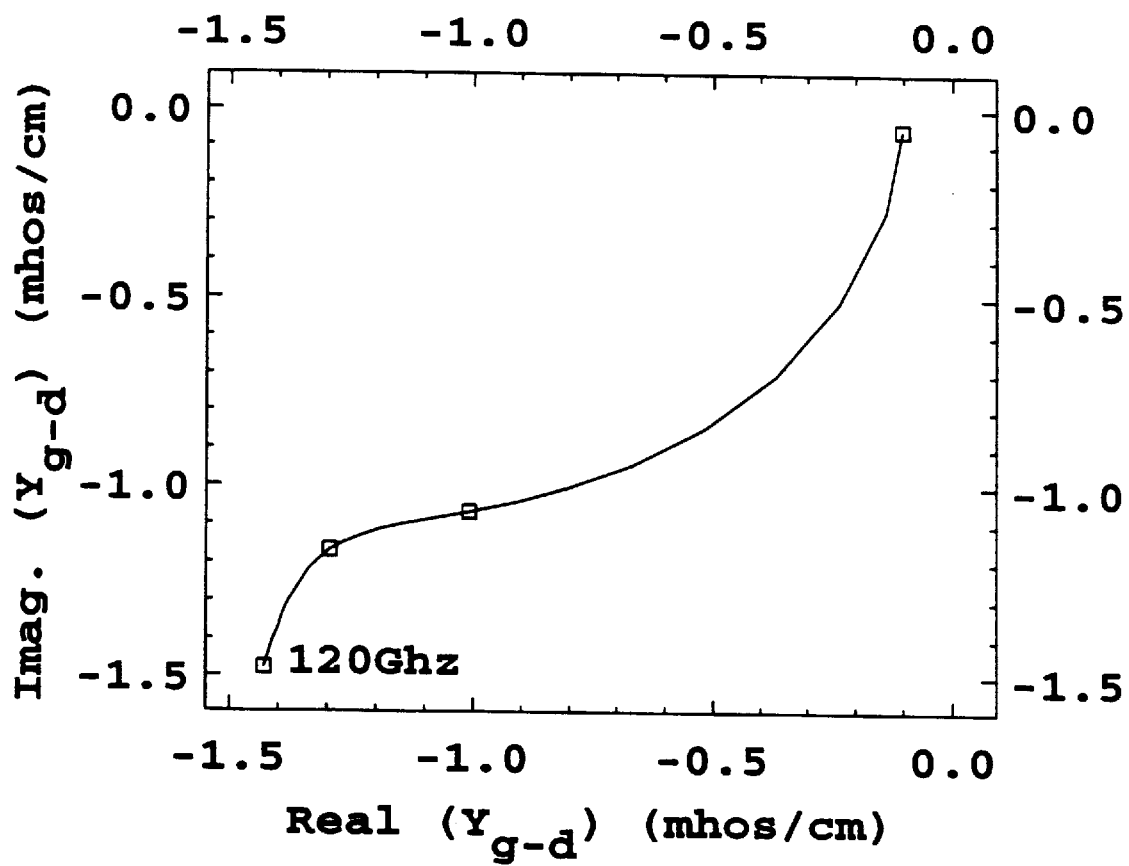
Figure 19:
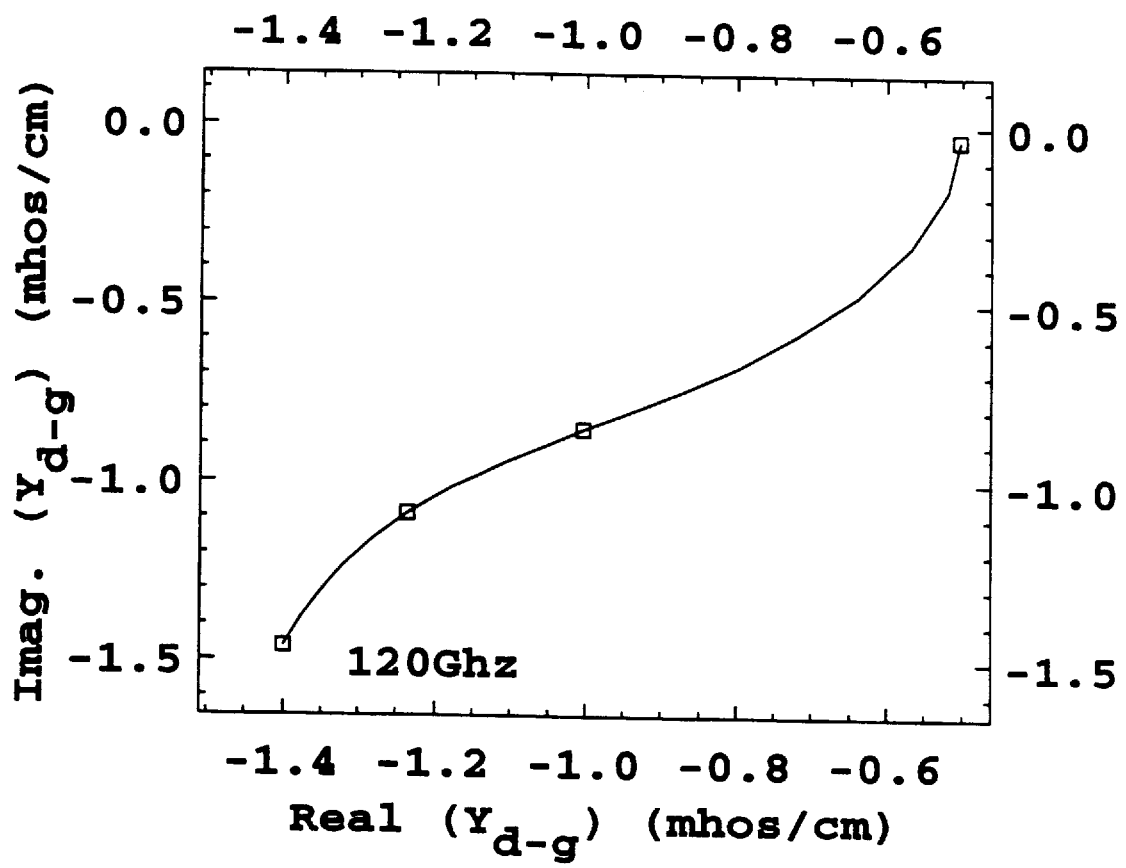
Figure 20:
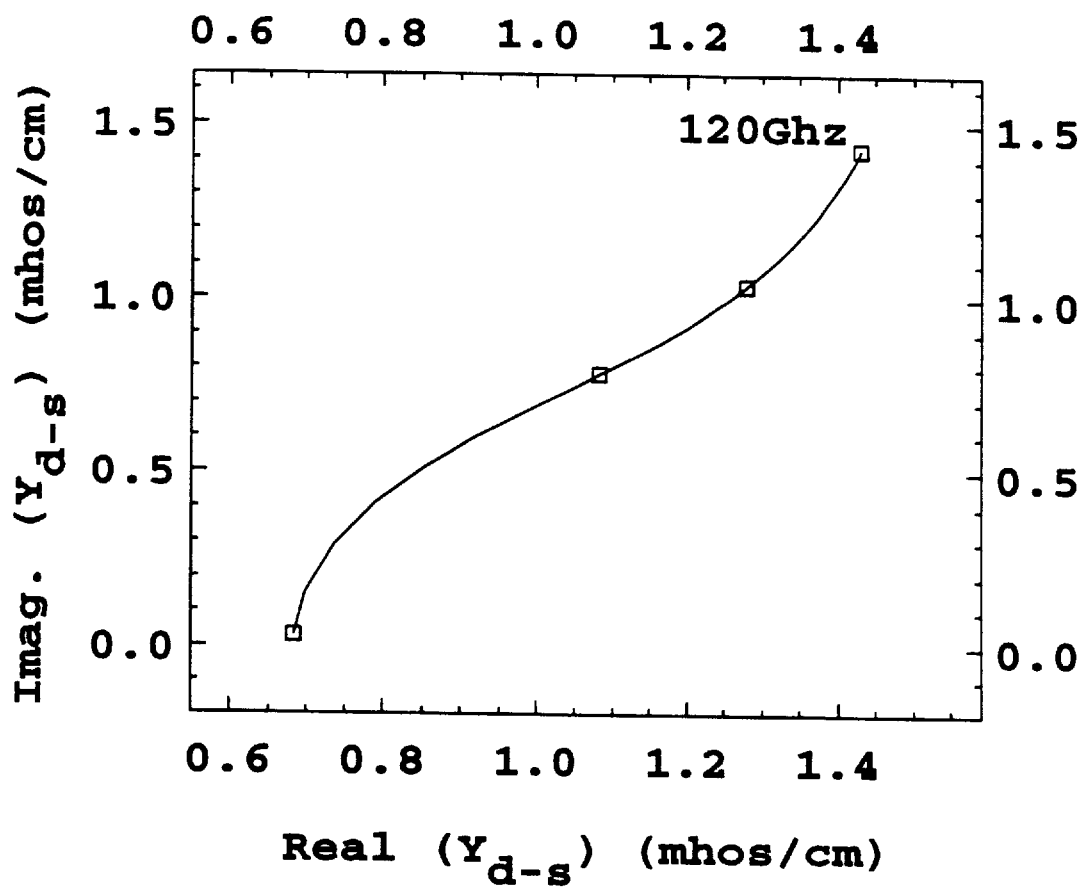
Figure 21:
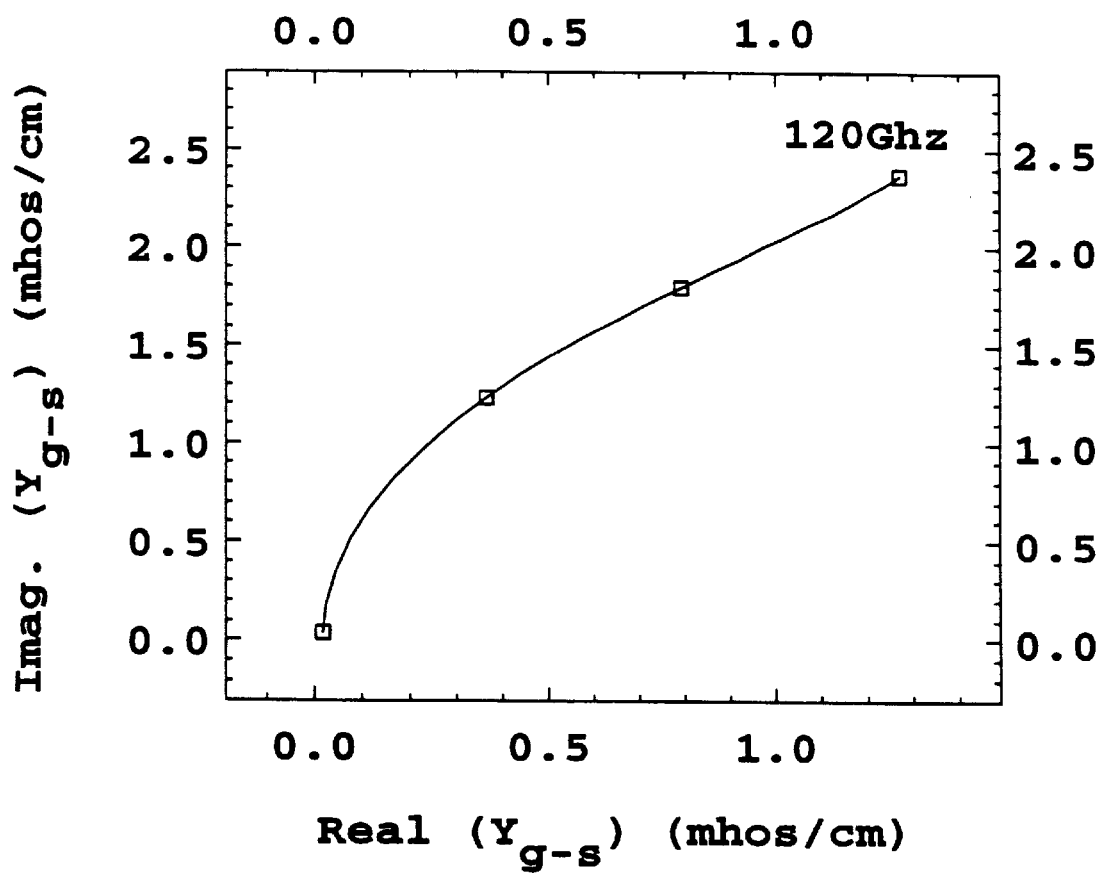
Figure 22:
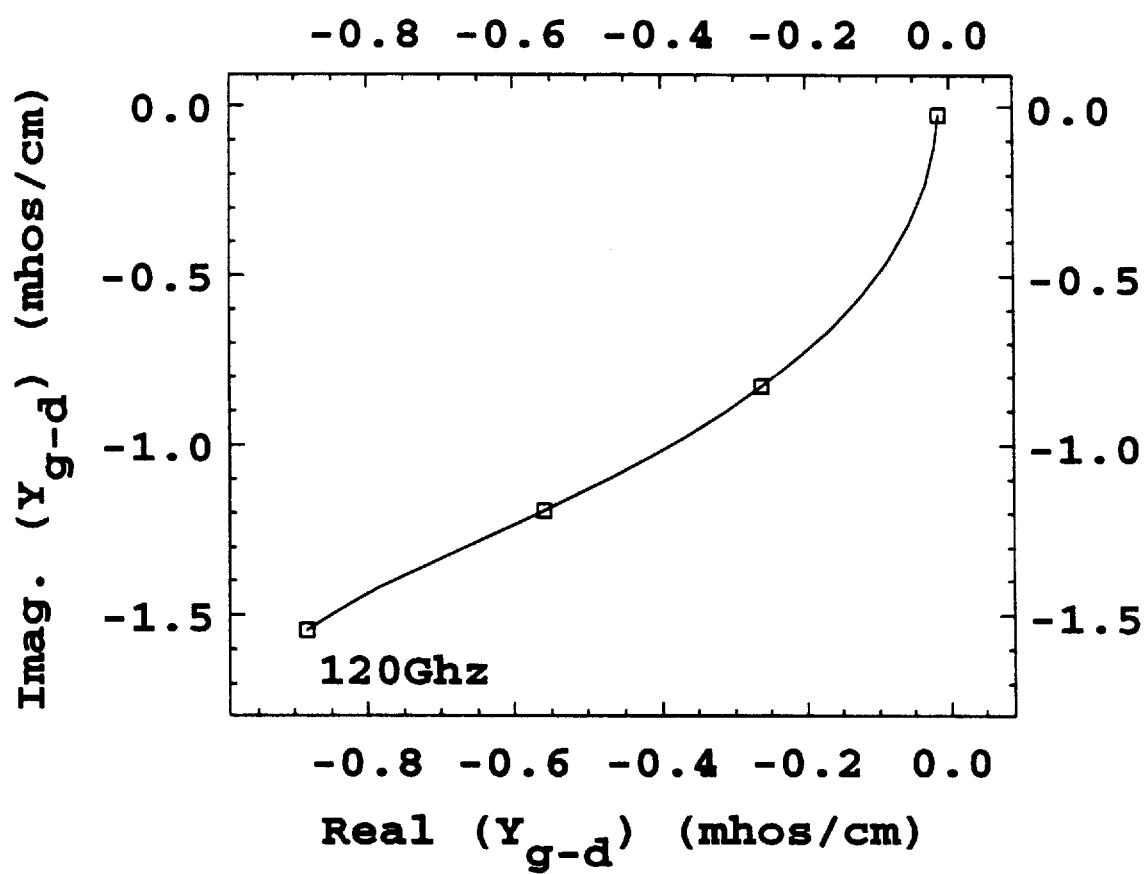
Figure 23:
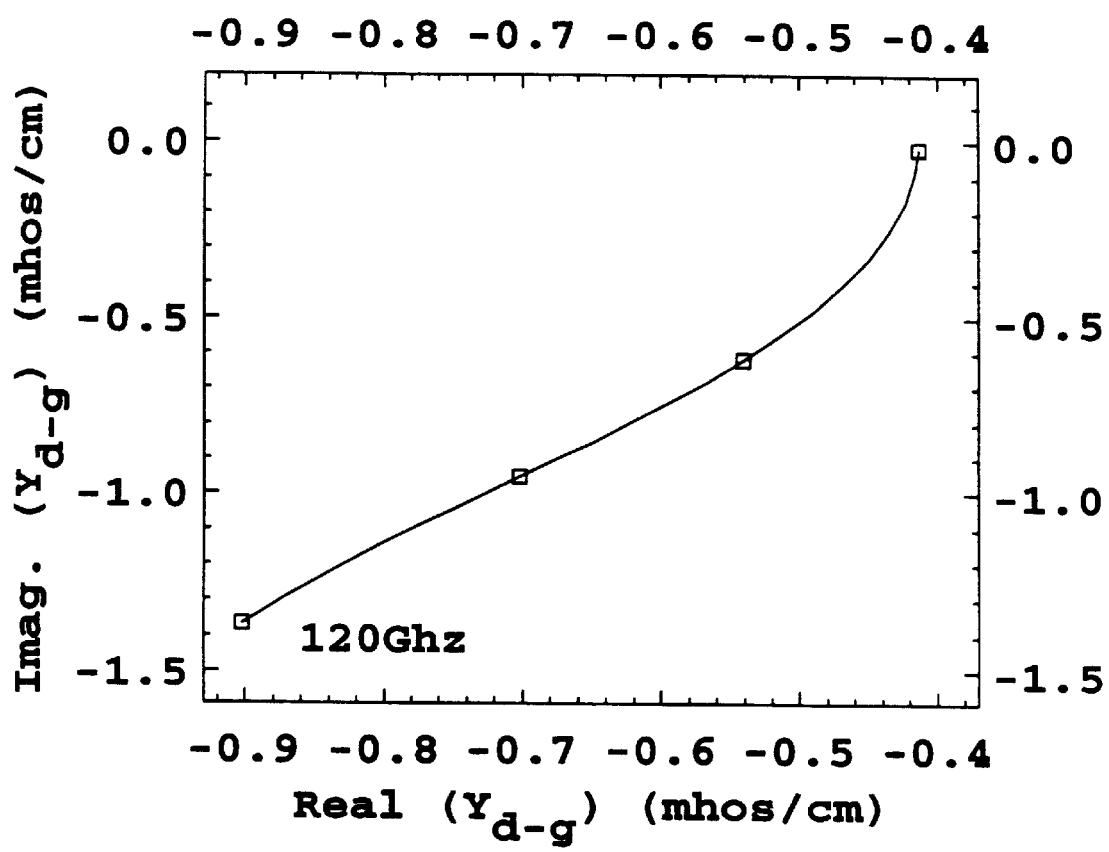
Figure 24:
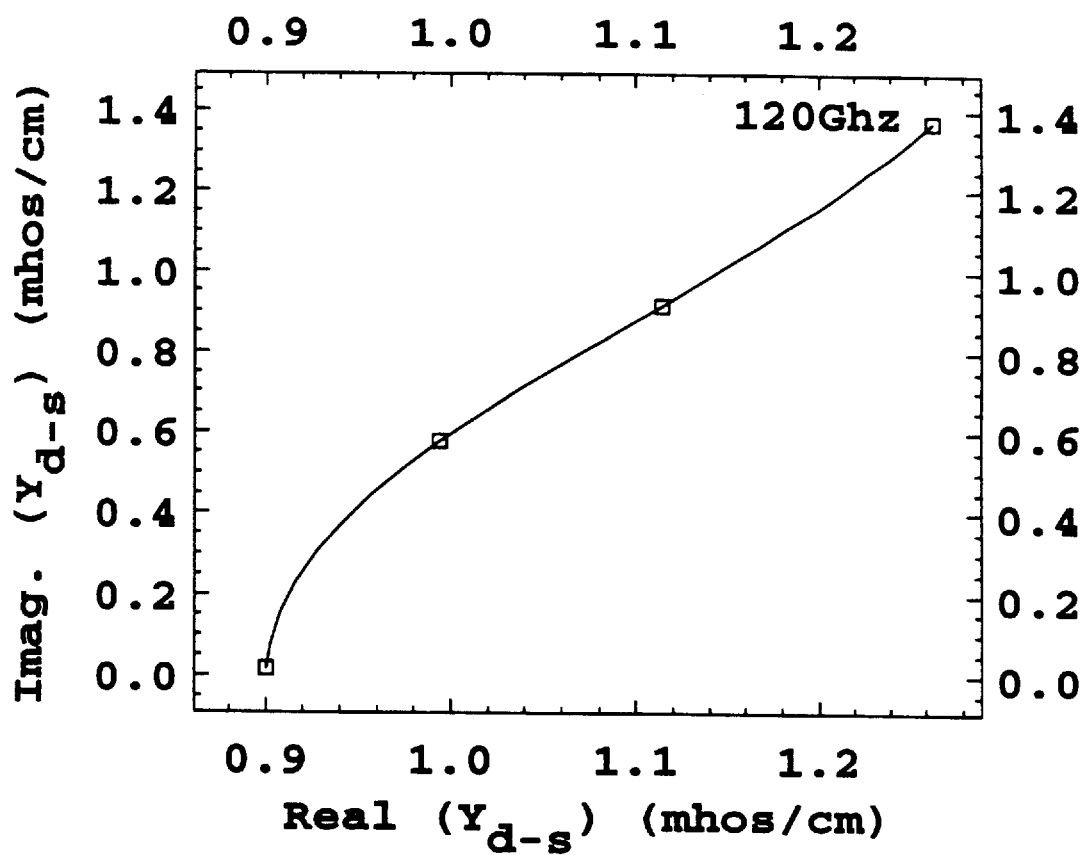
Figure 25:
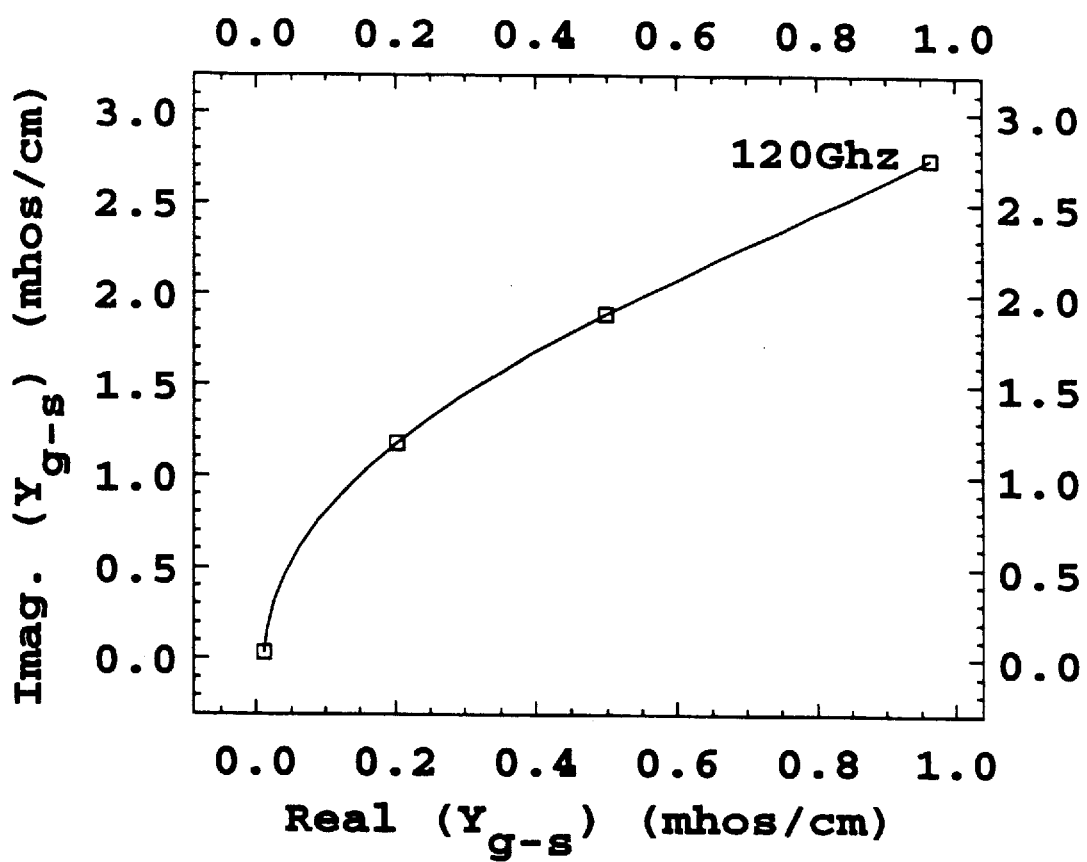
Figure 26:
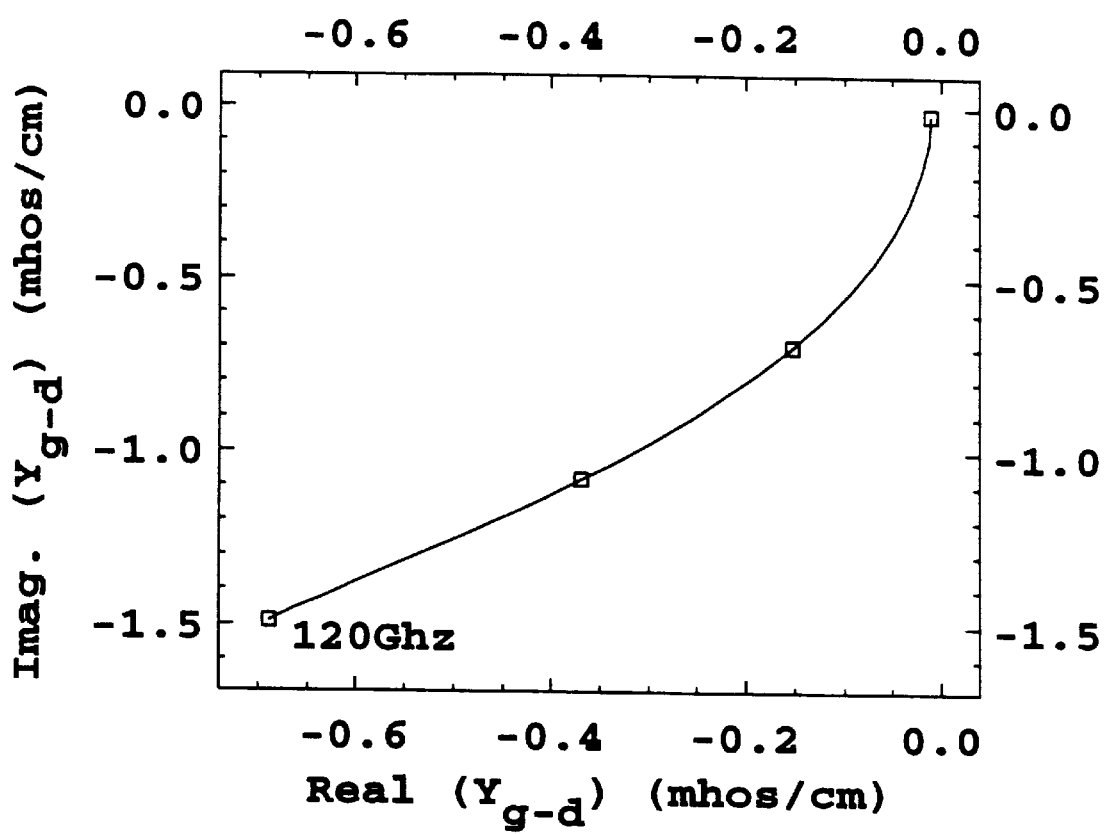
Figure 27:
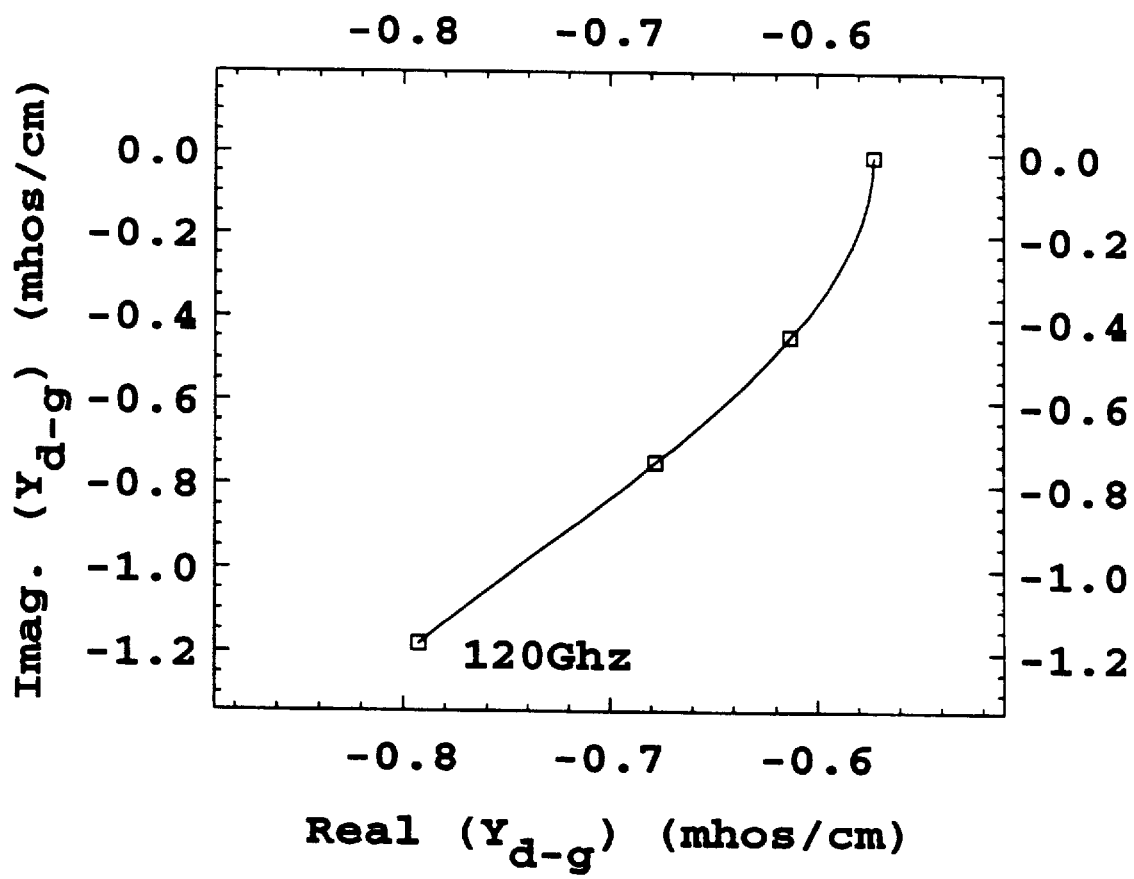
Figure 28:
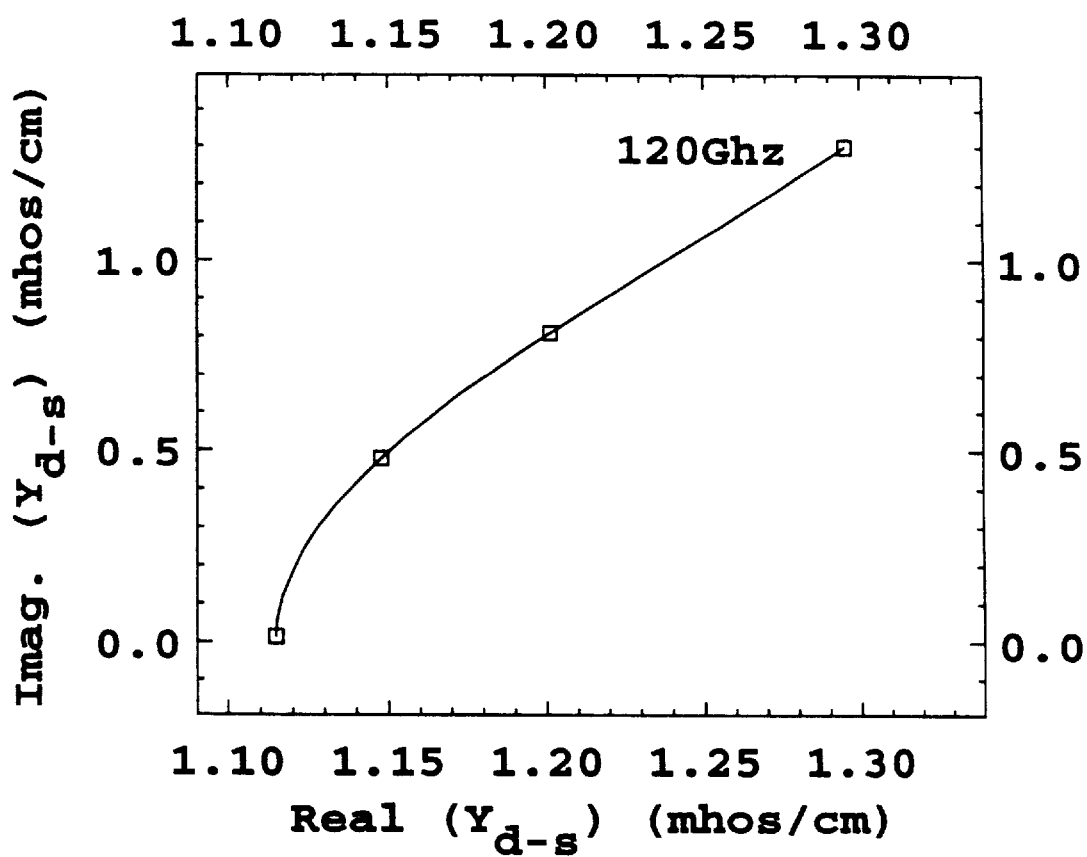
Figure 29:
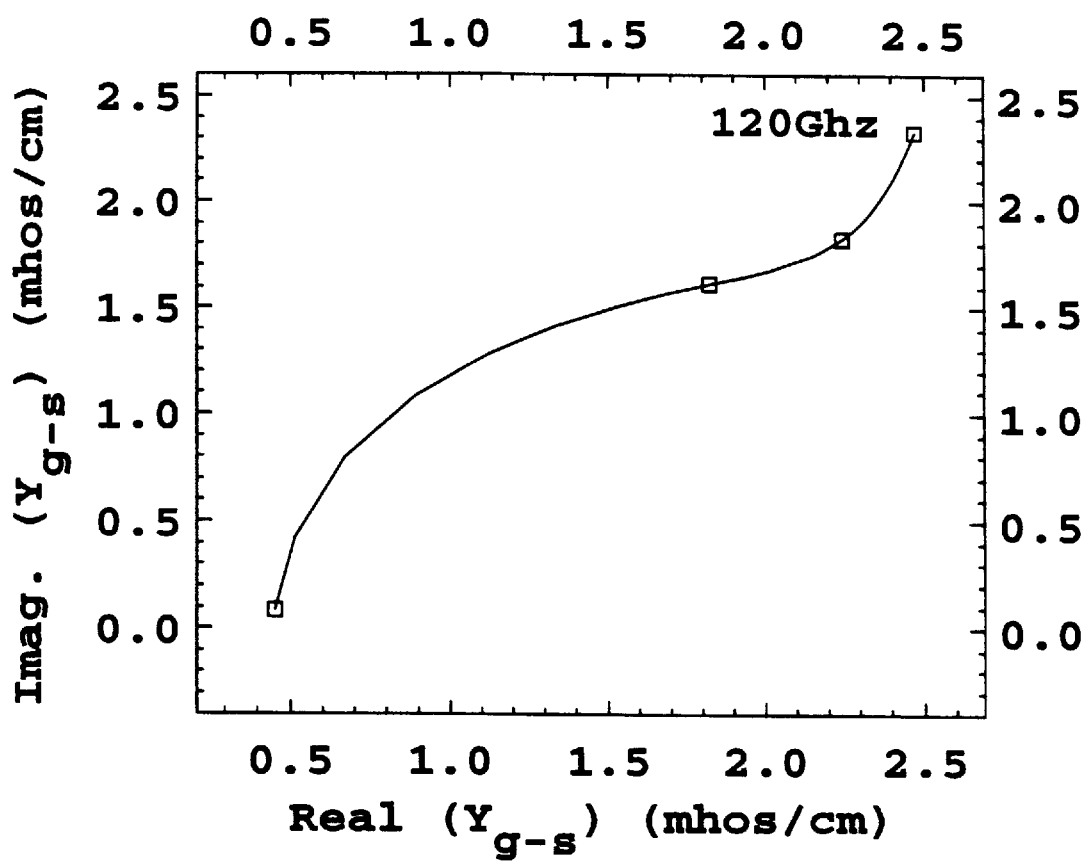
Figure 30:
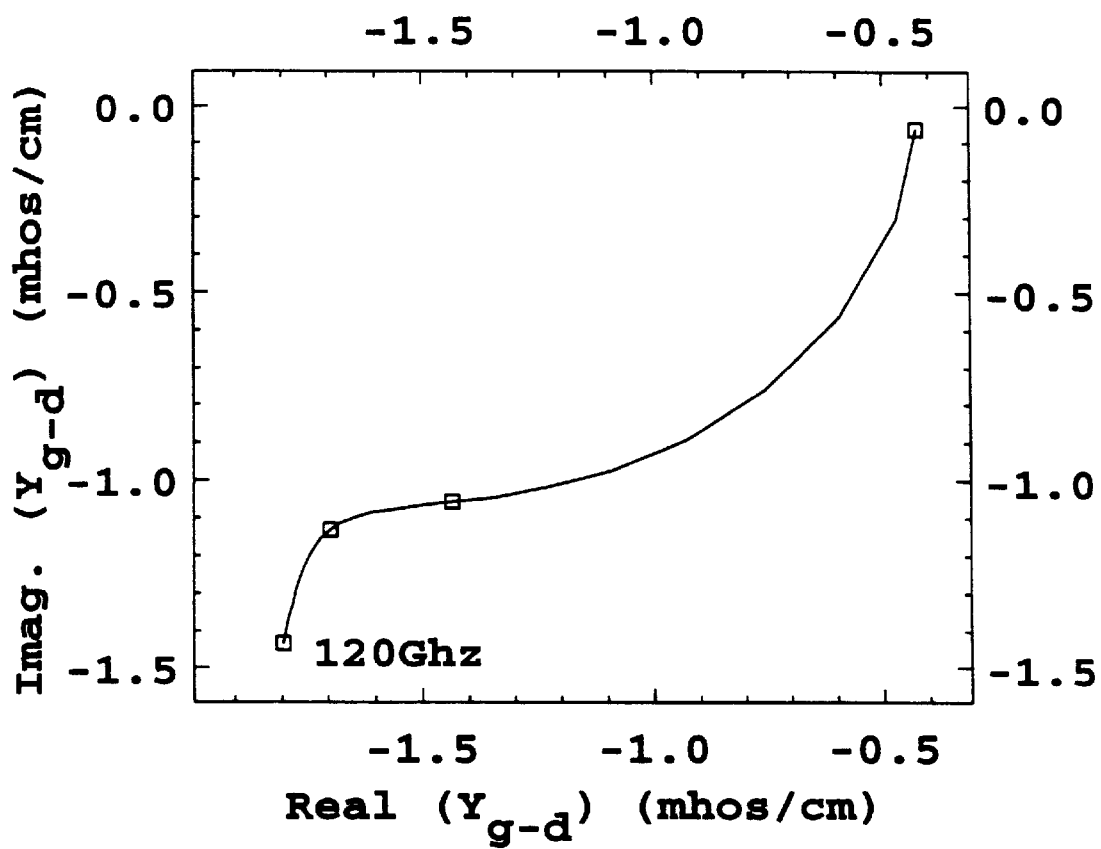
Figure 31:
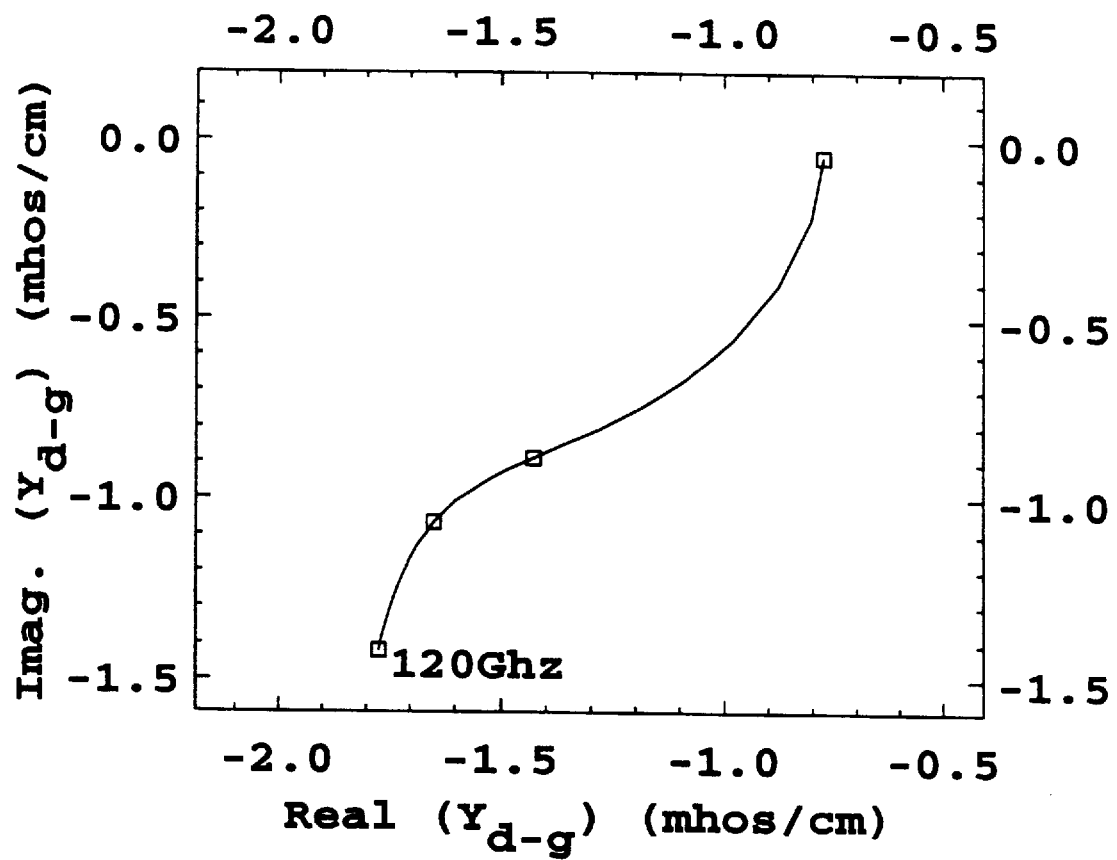
Figure 32:
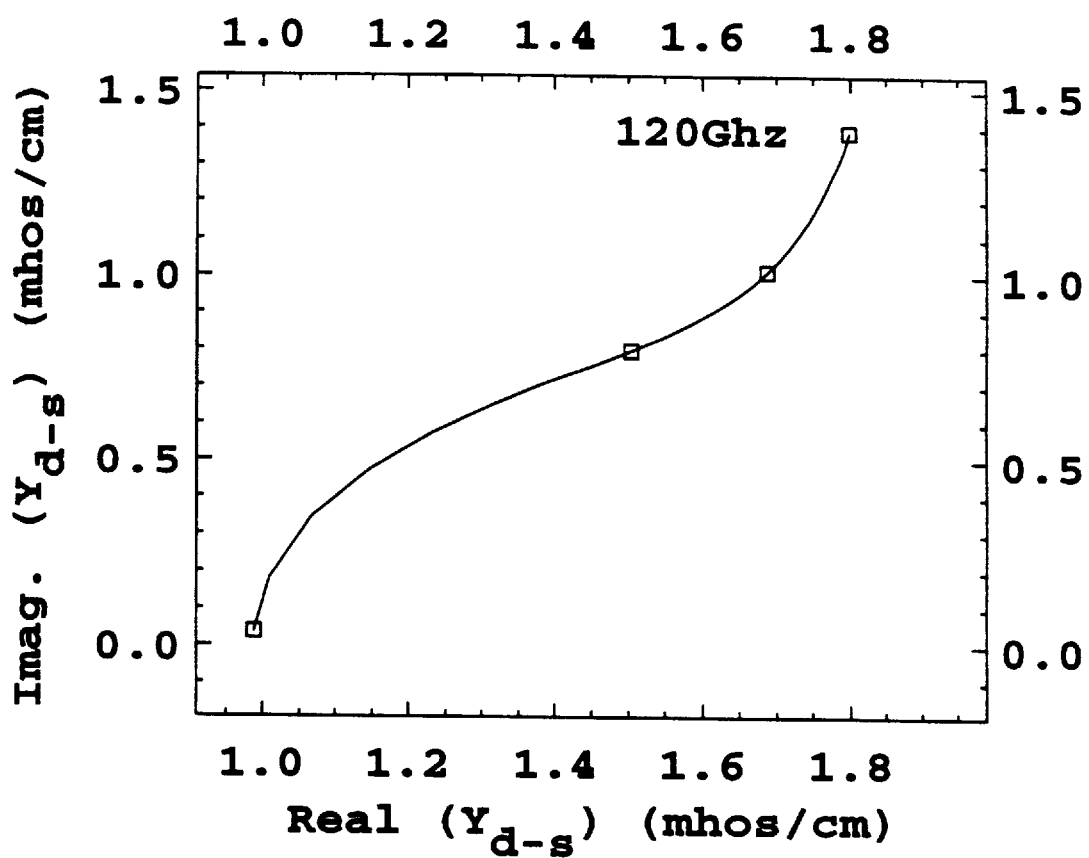
Figure 33:
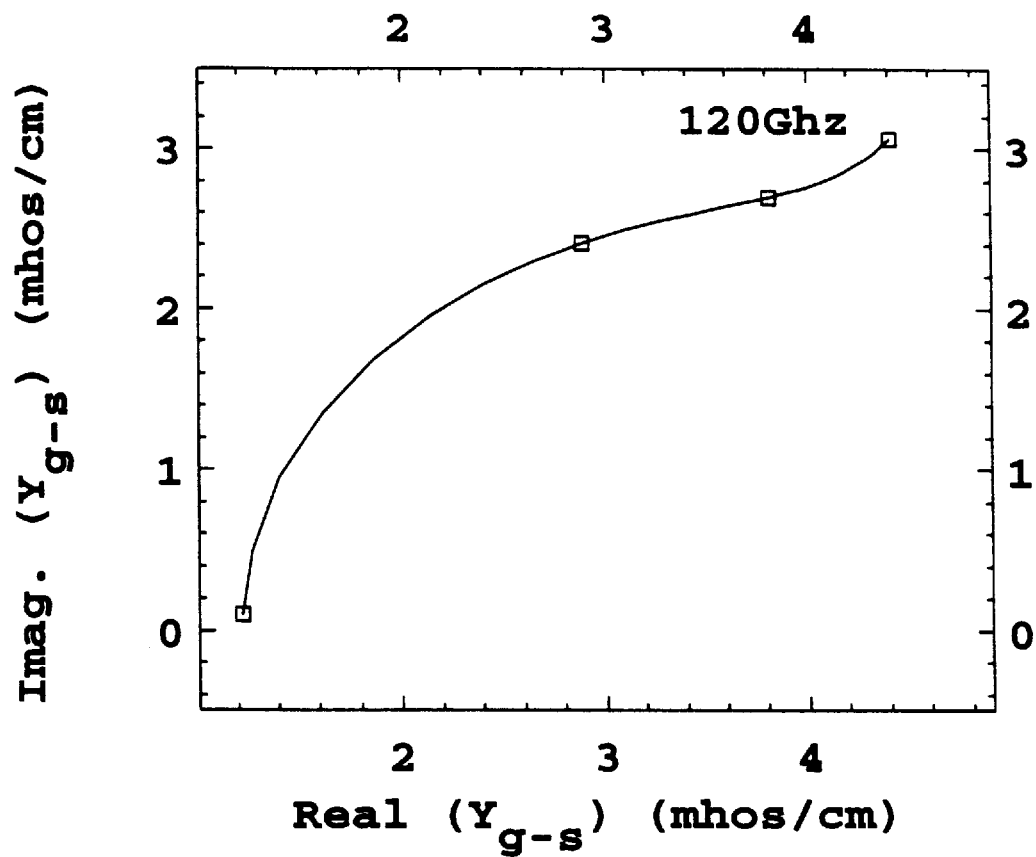
Figure 34:
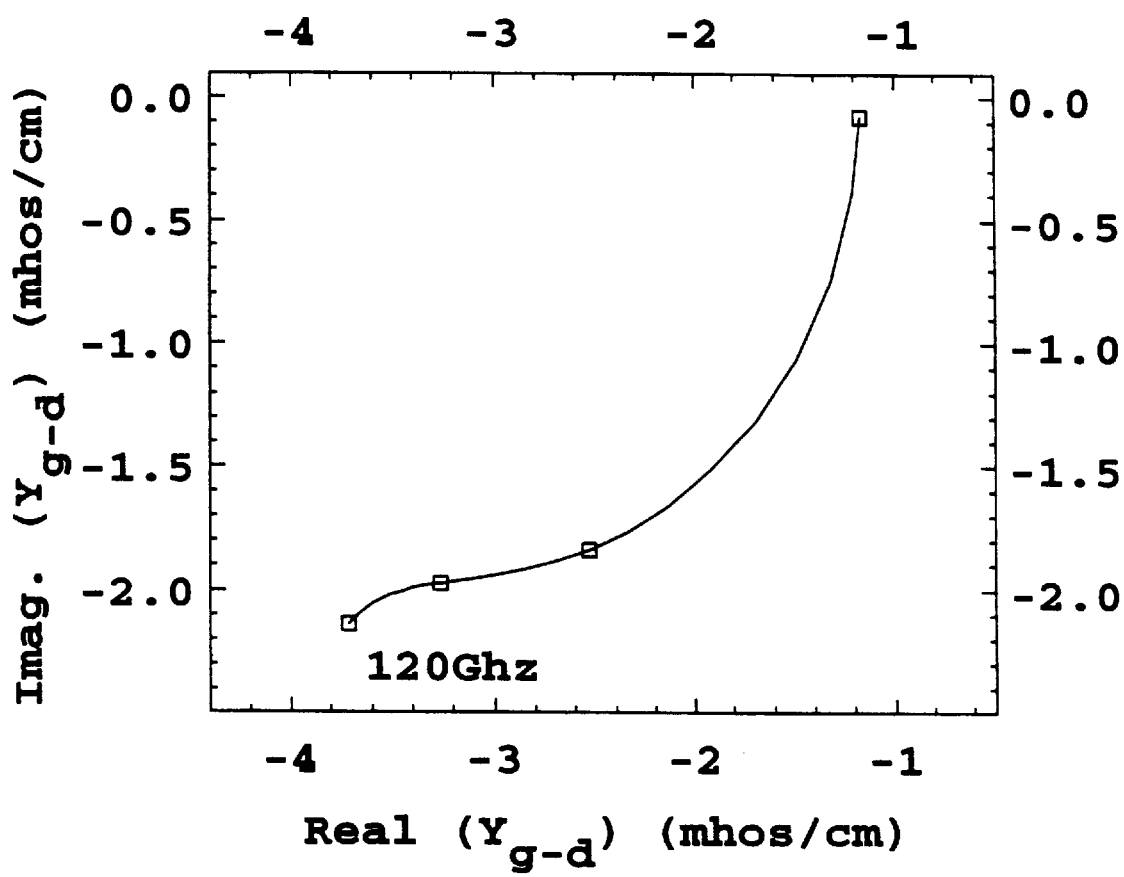
Figure 35:
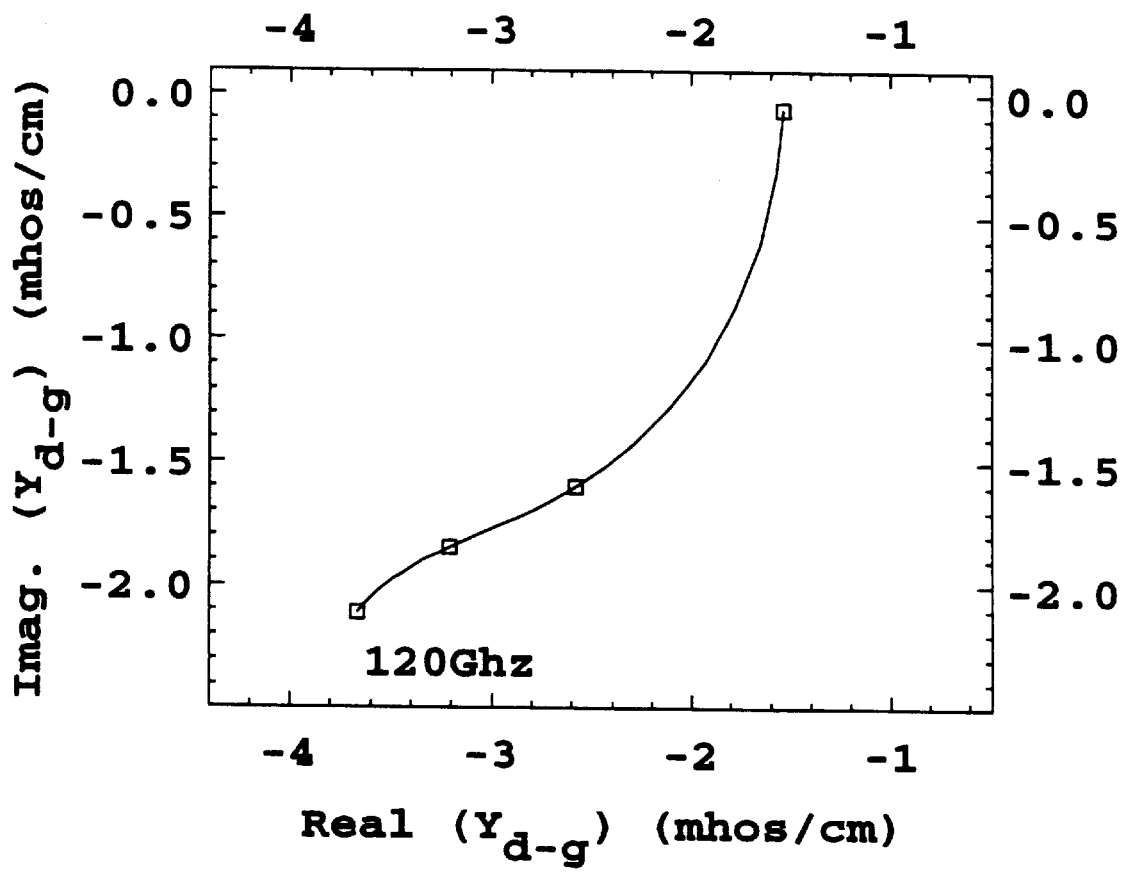
Figure 36:
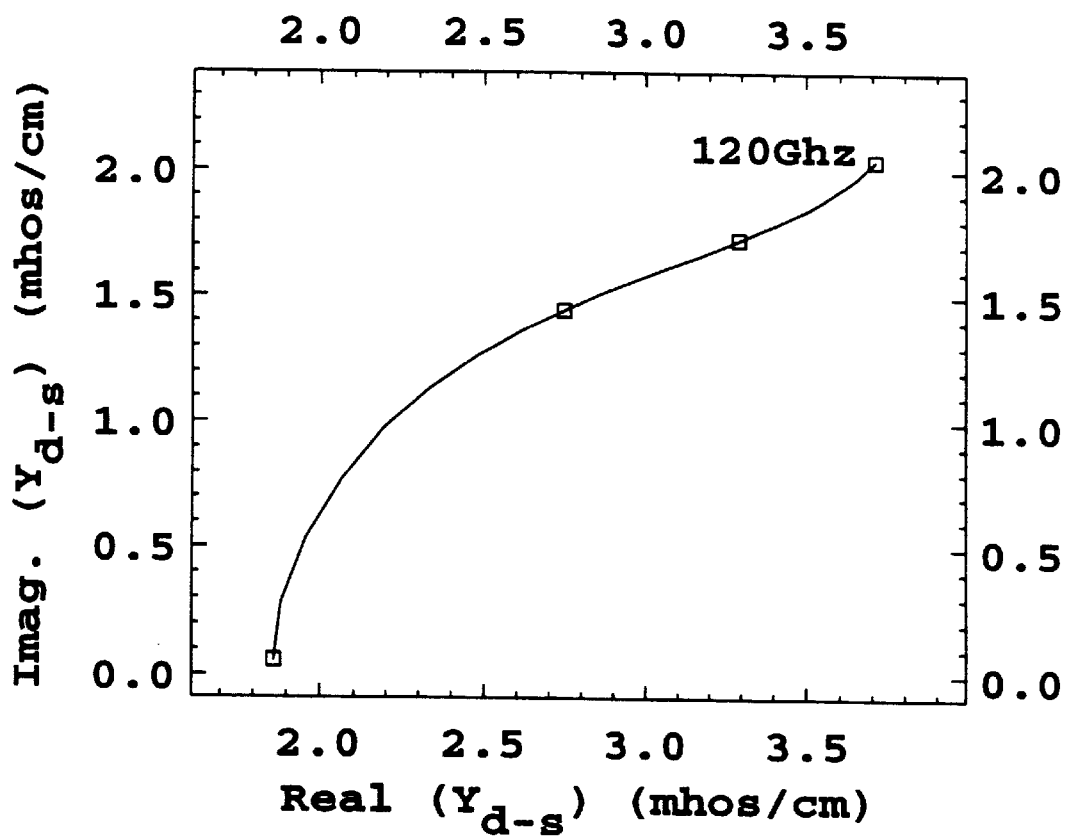
Figure 37:
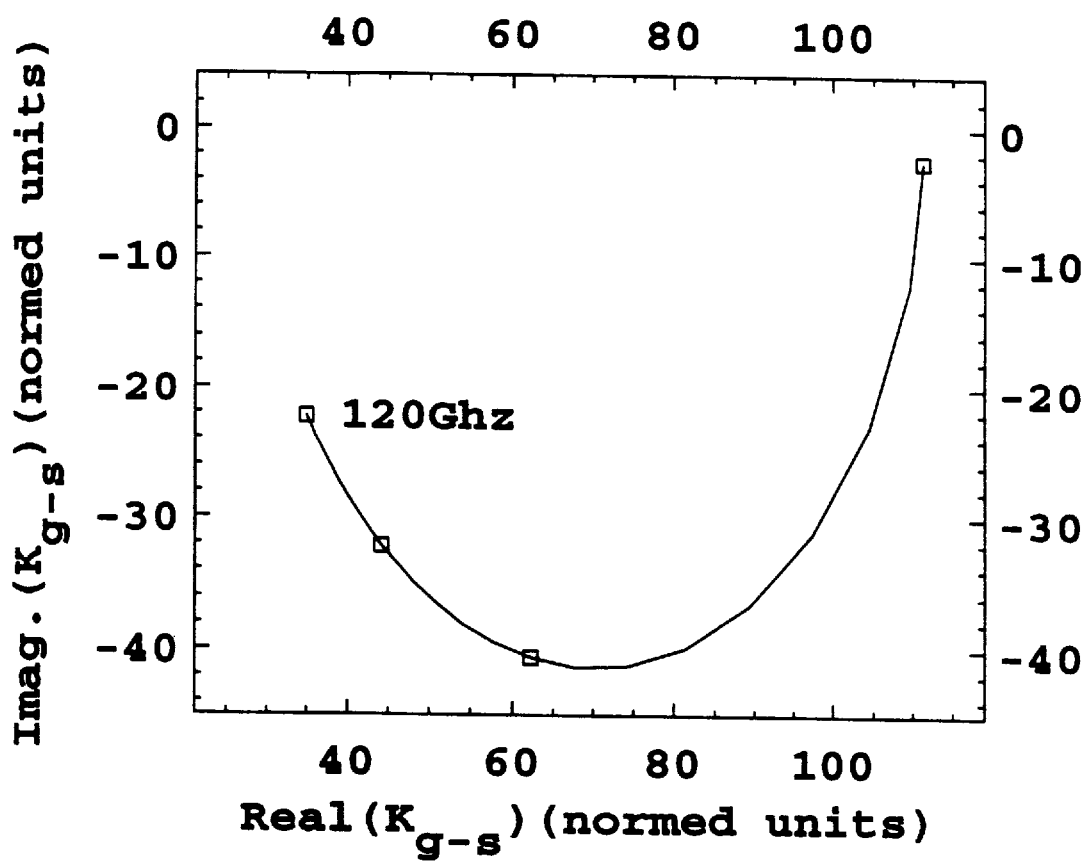
FIGS. 37–60 show the variation in the AC charge matrix for specific FETs of the present invention in the "forward" configuration.
Figure 38:
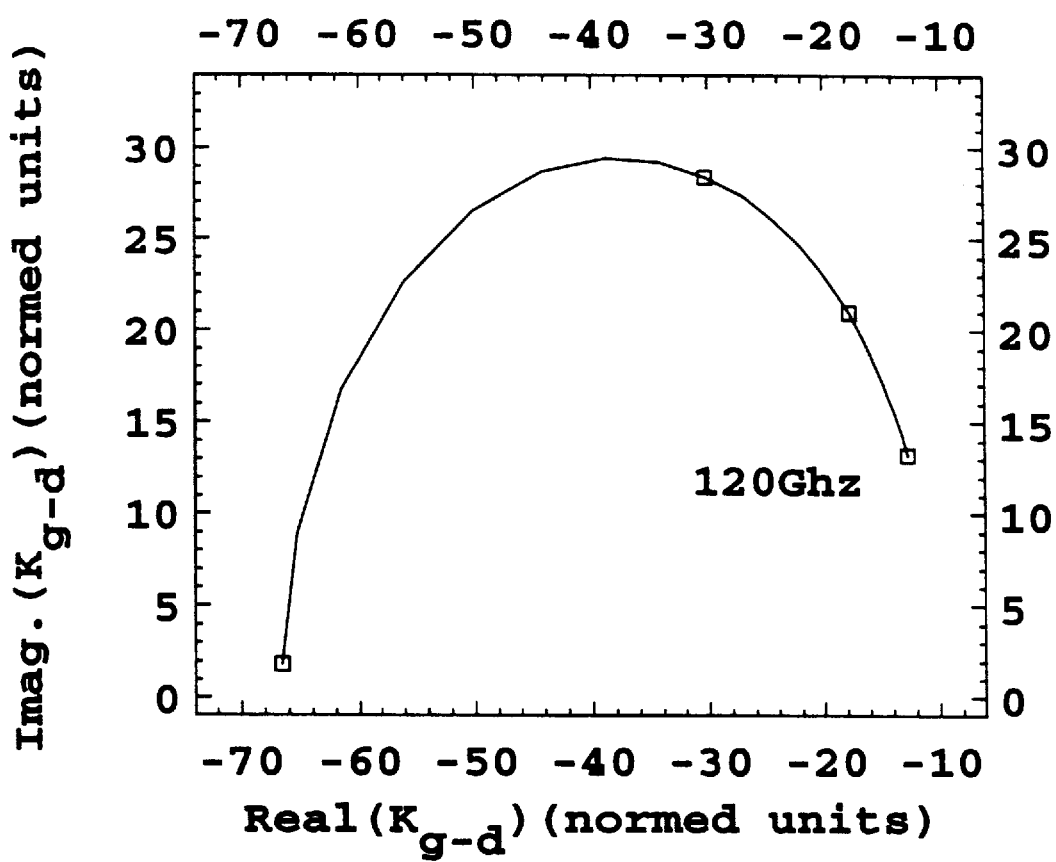
Figure 39:
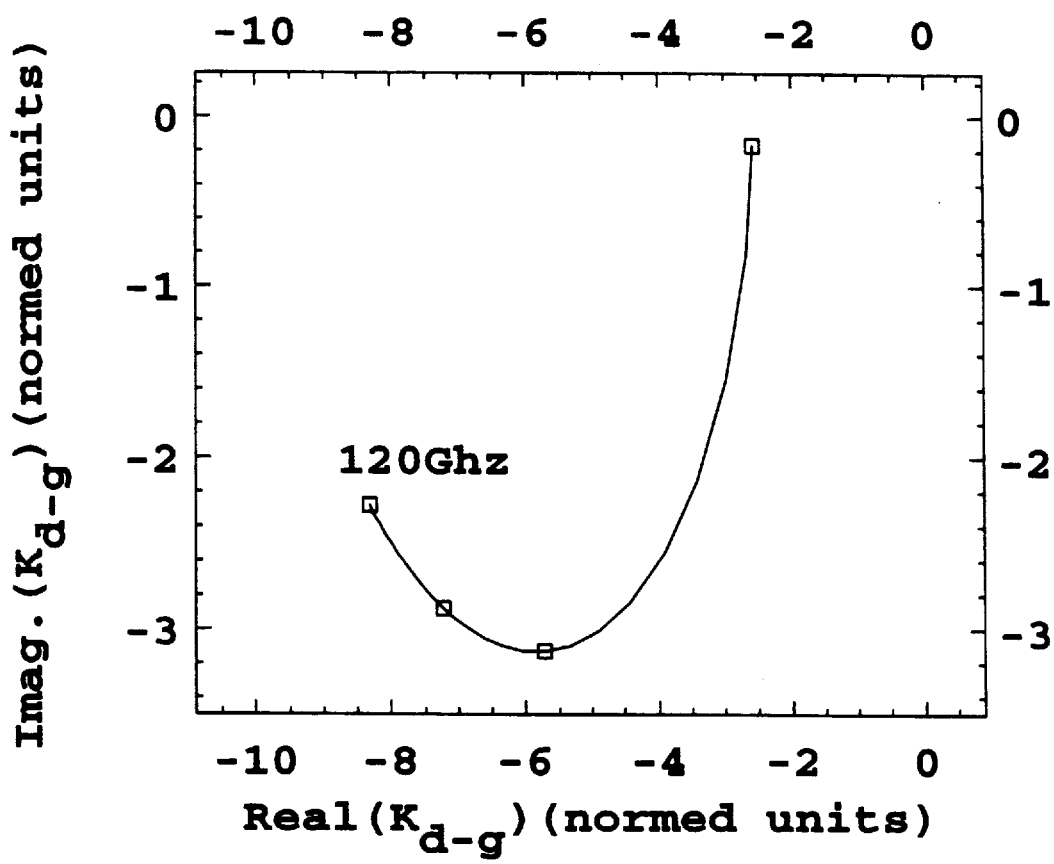
Figure 40:
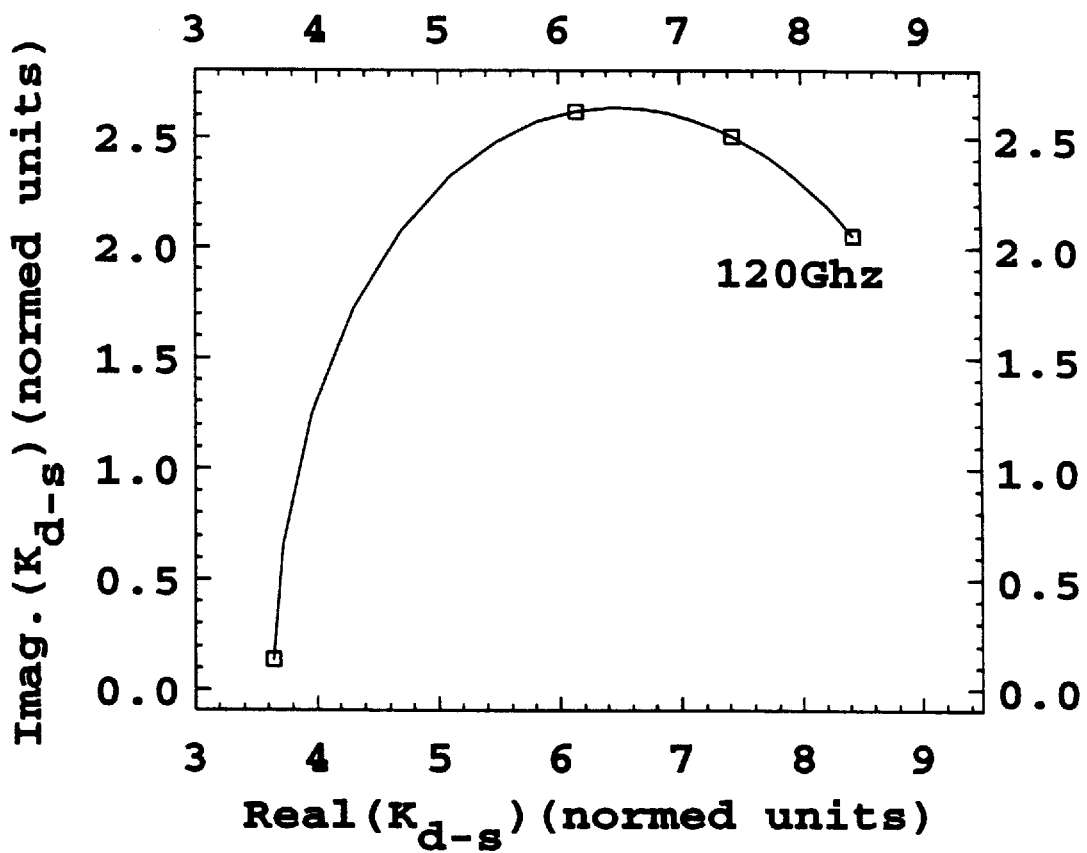
Figure 41:
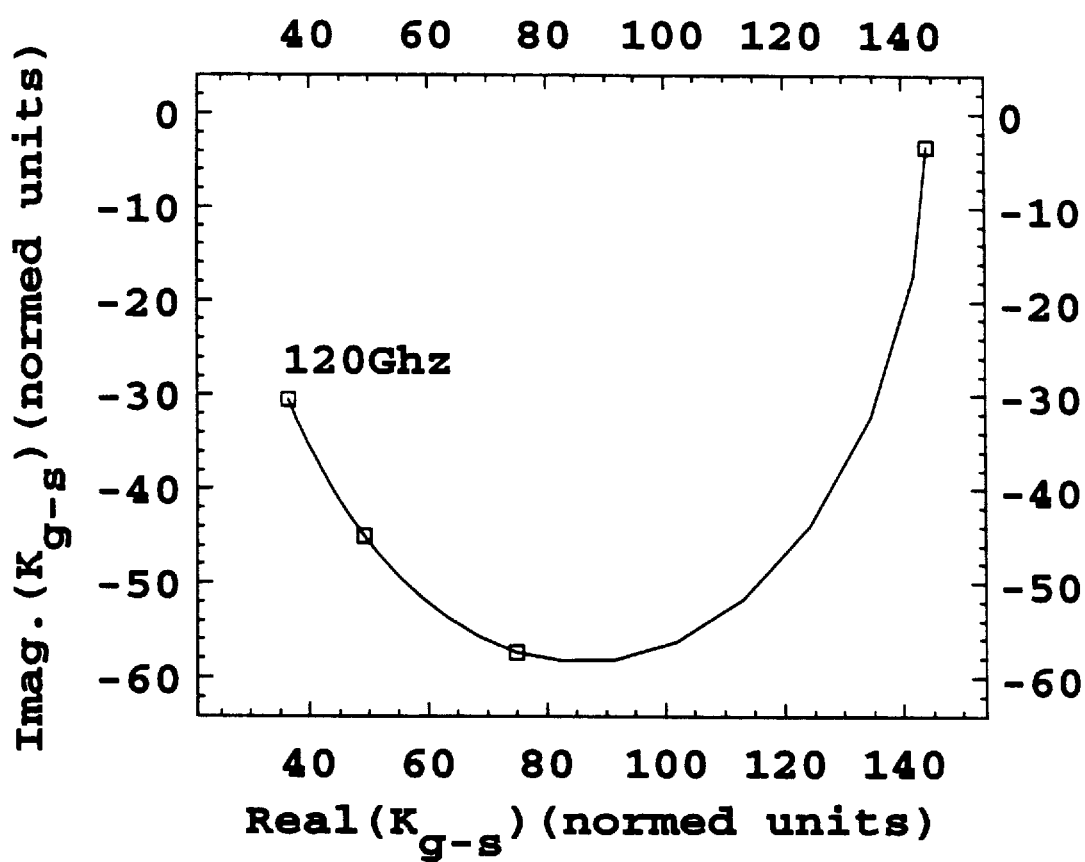
Figure 42:
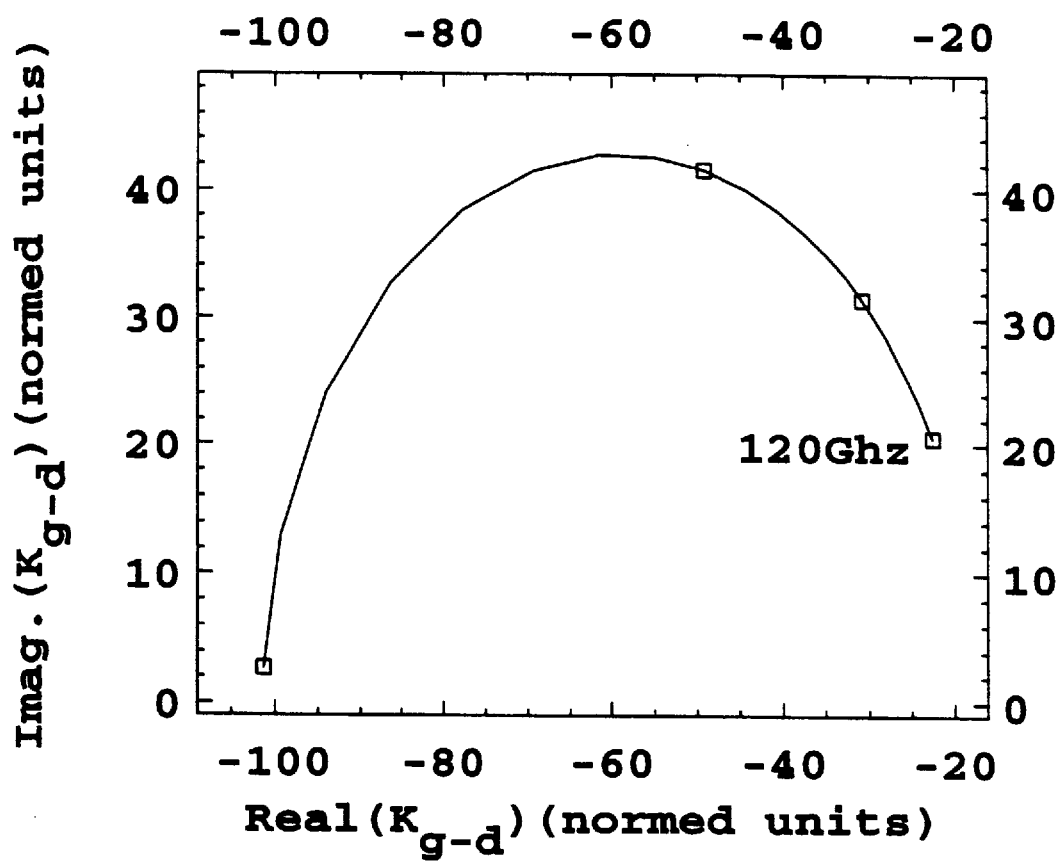
Figure 43:
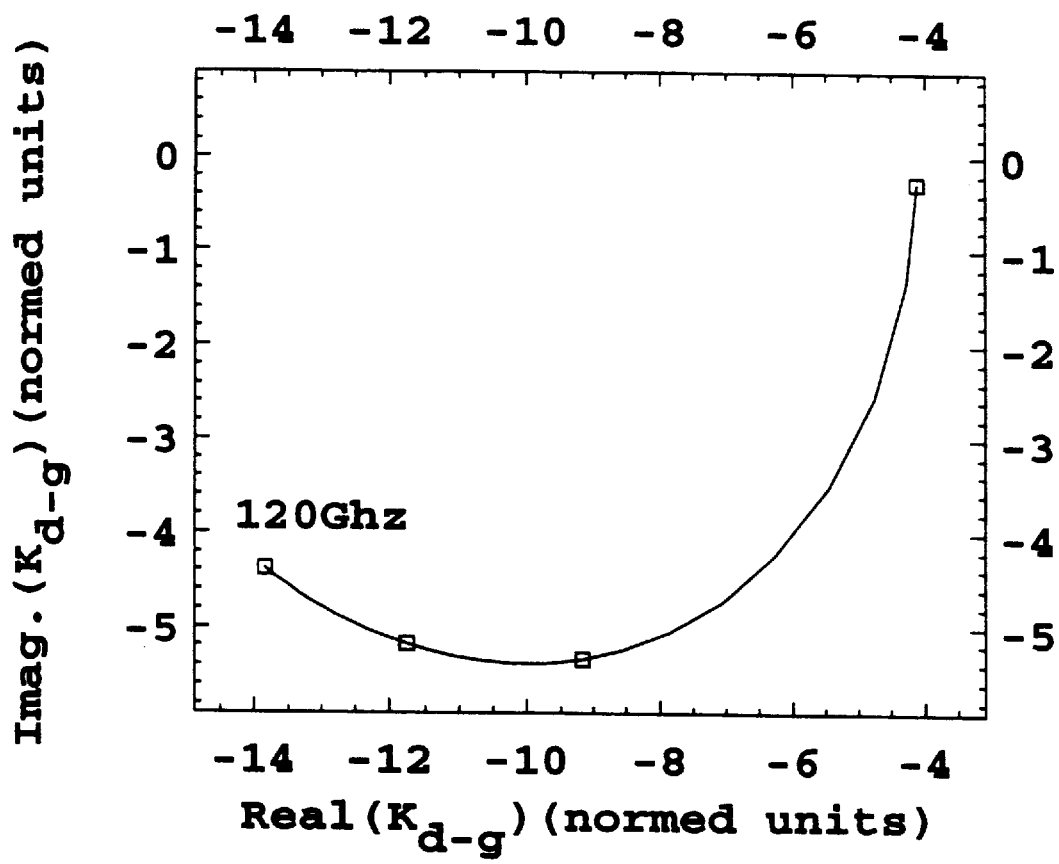
Figure 44:
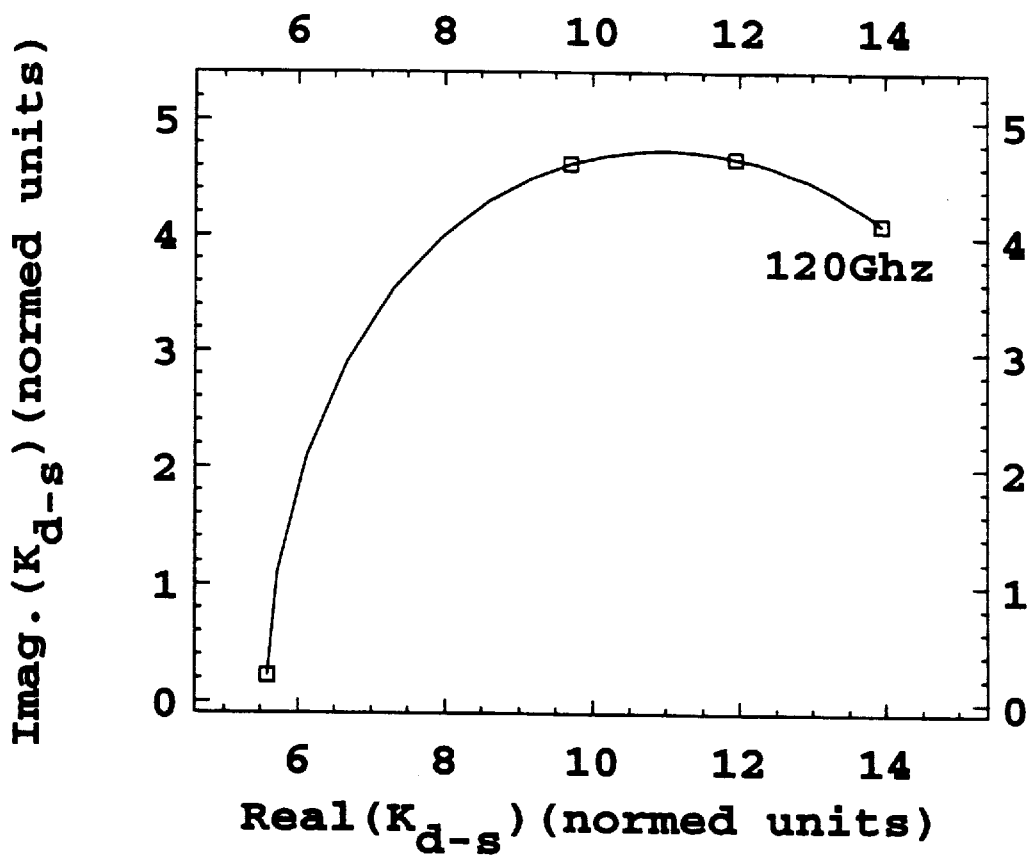
Figure 45:
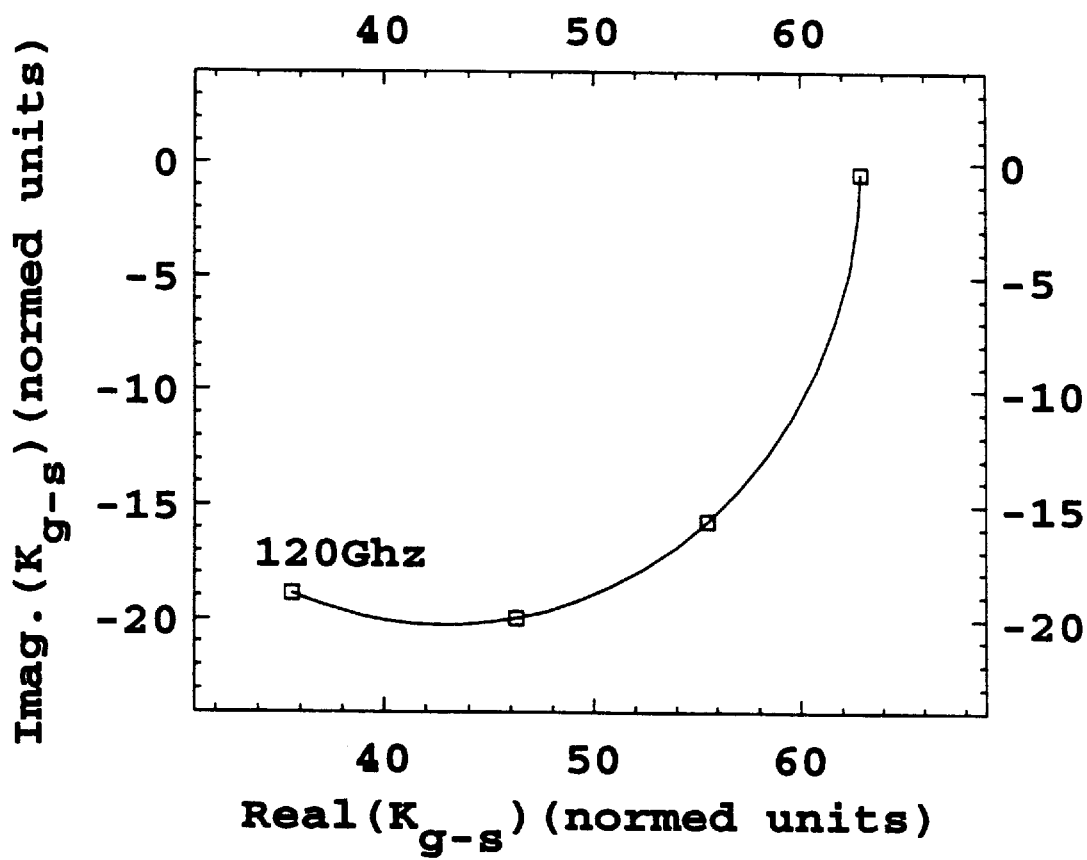
Figure 46:
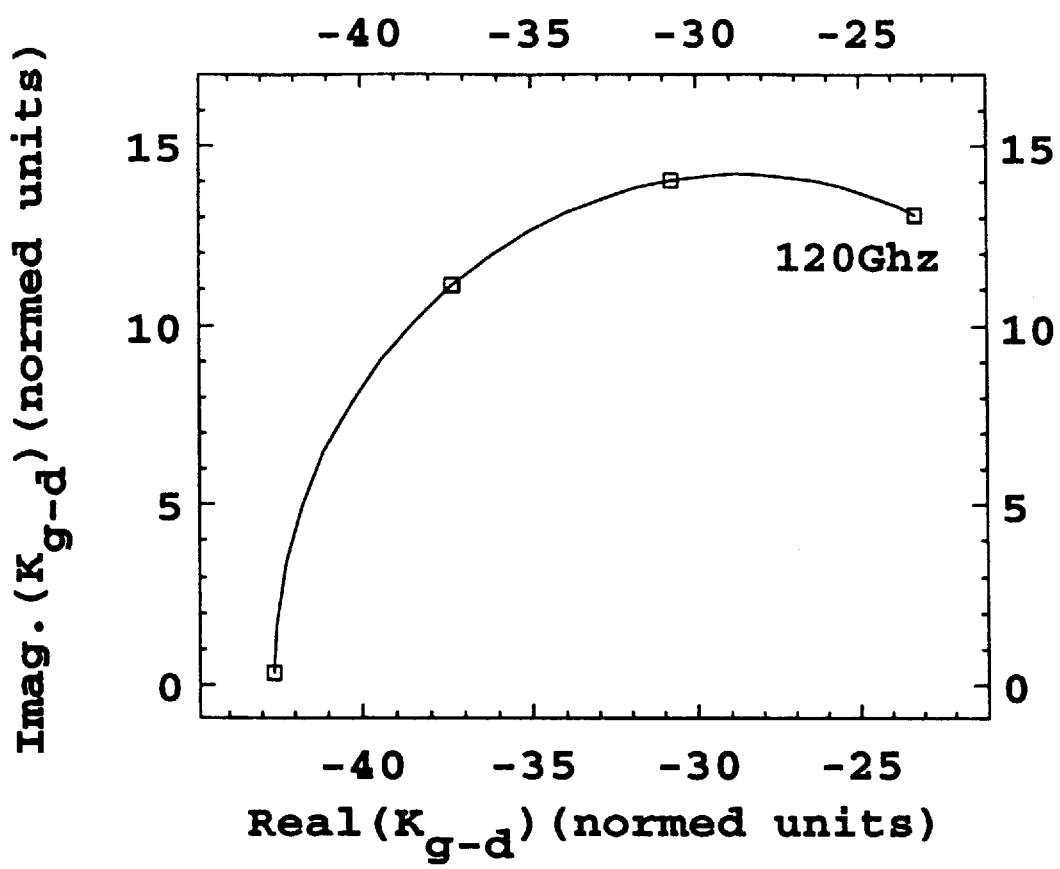
Figure 47:
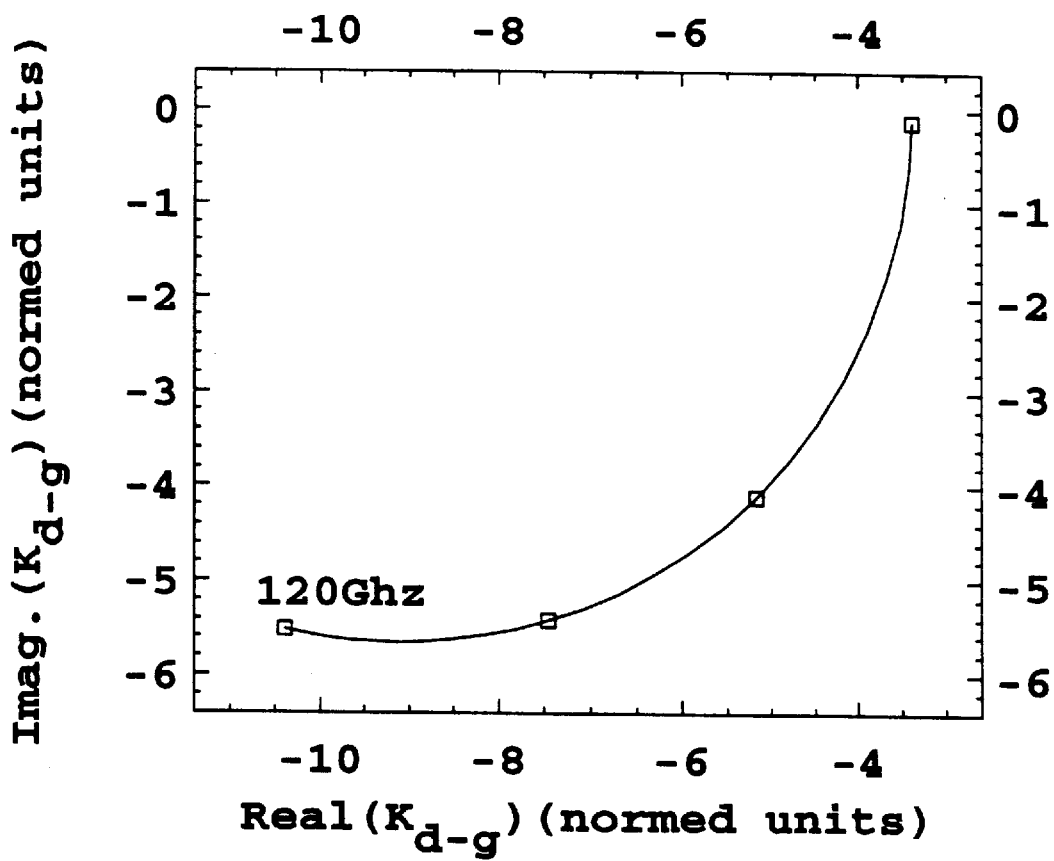
Figure 48:
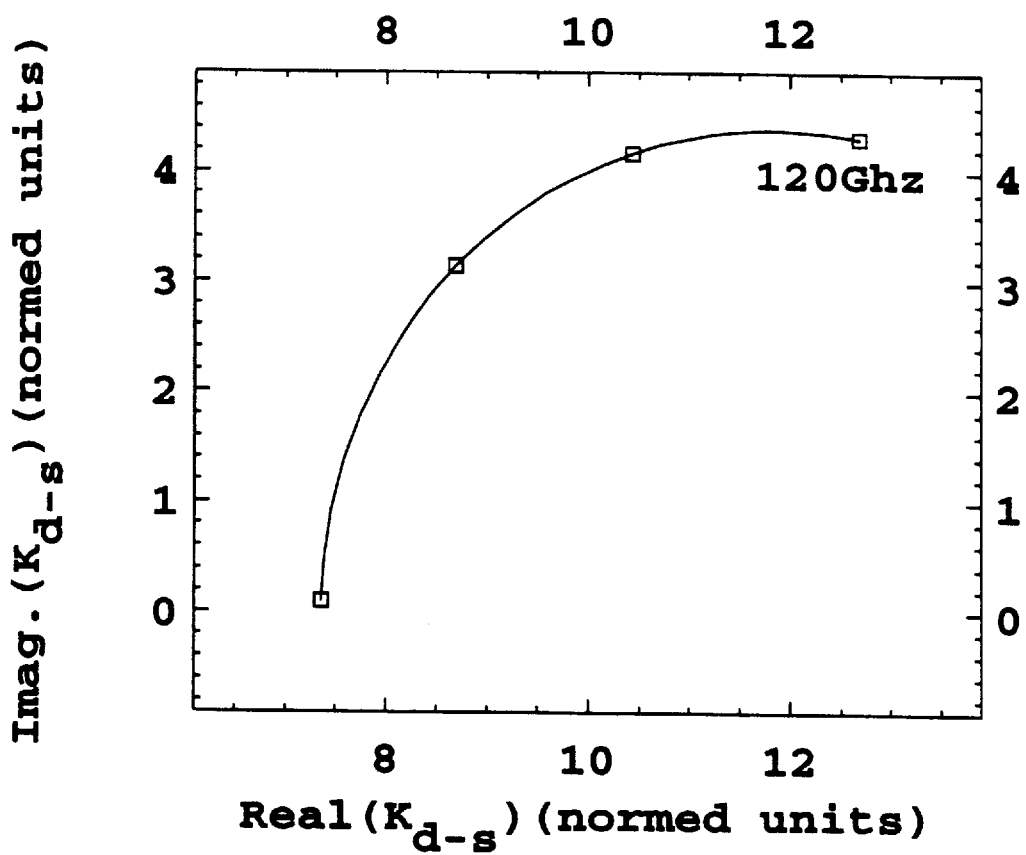
Figure 49:
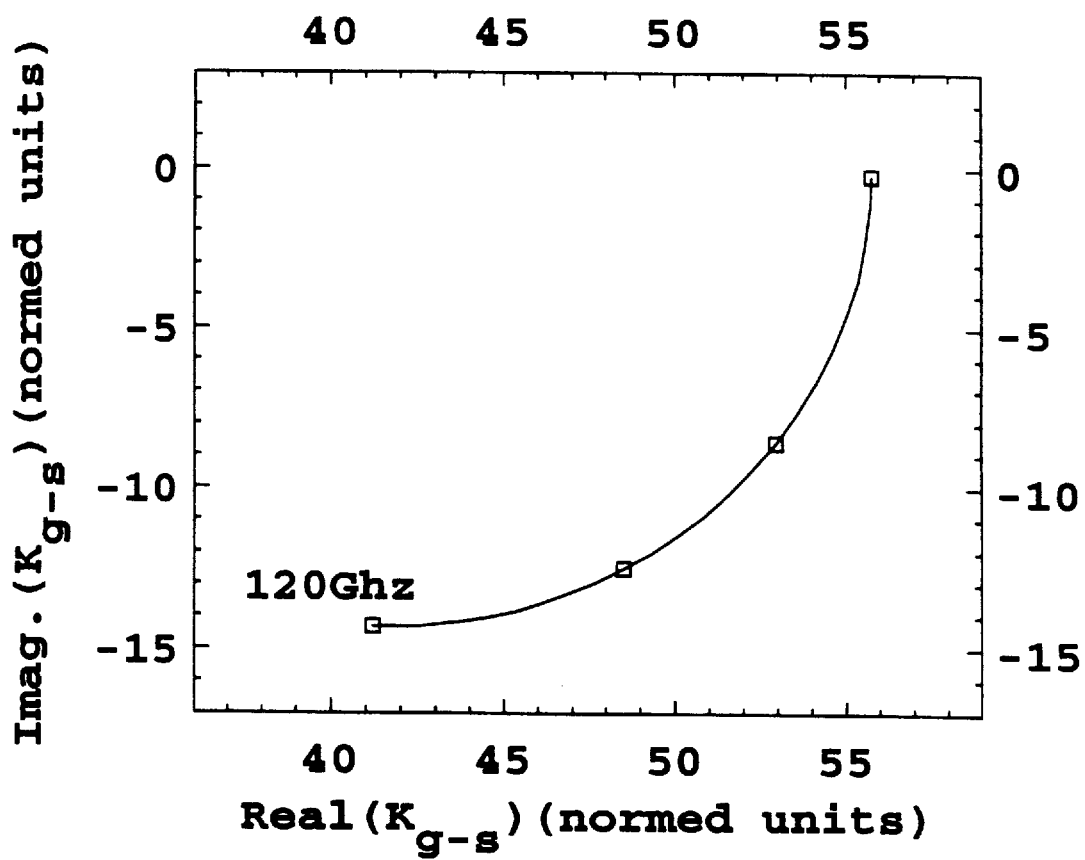
Figure 50:
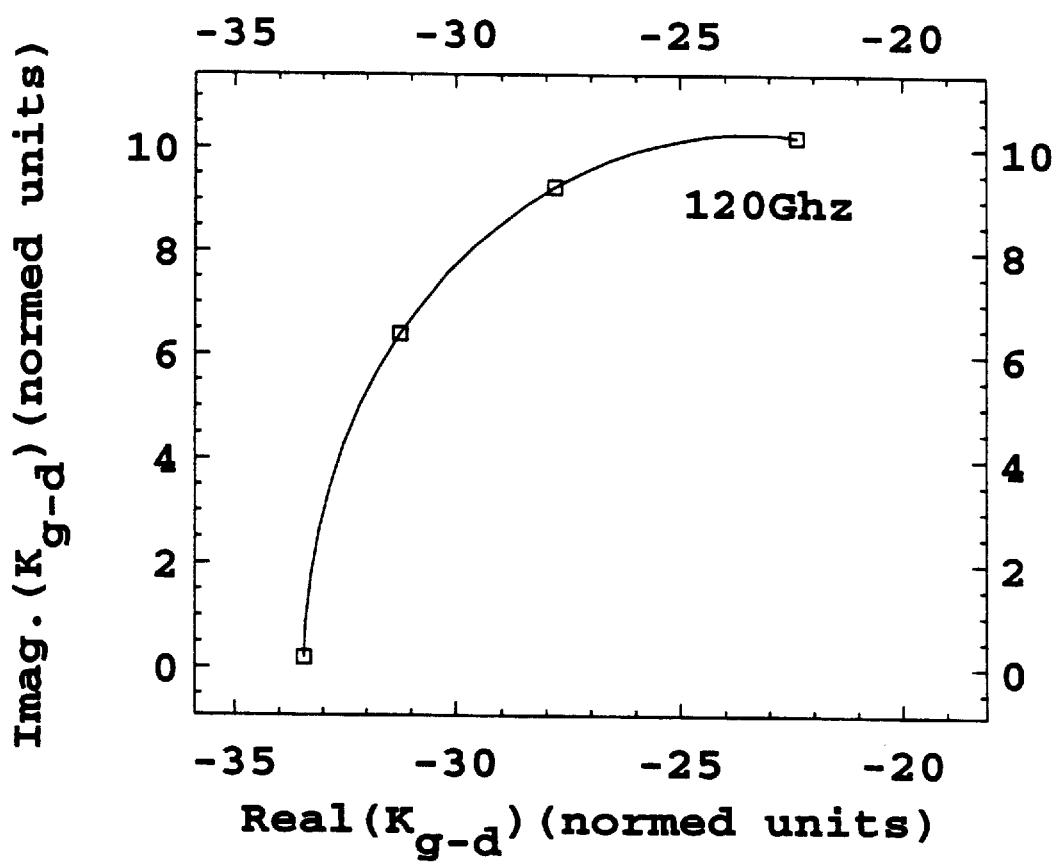
Figure 51:
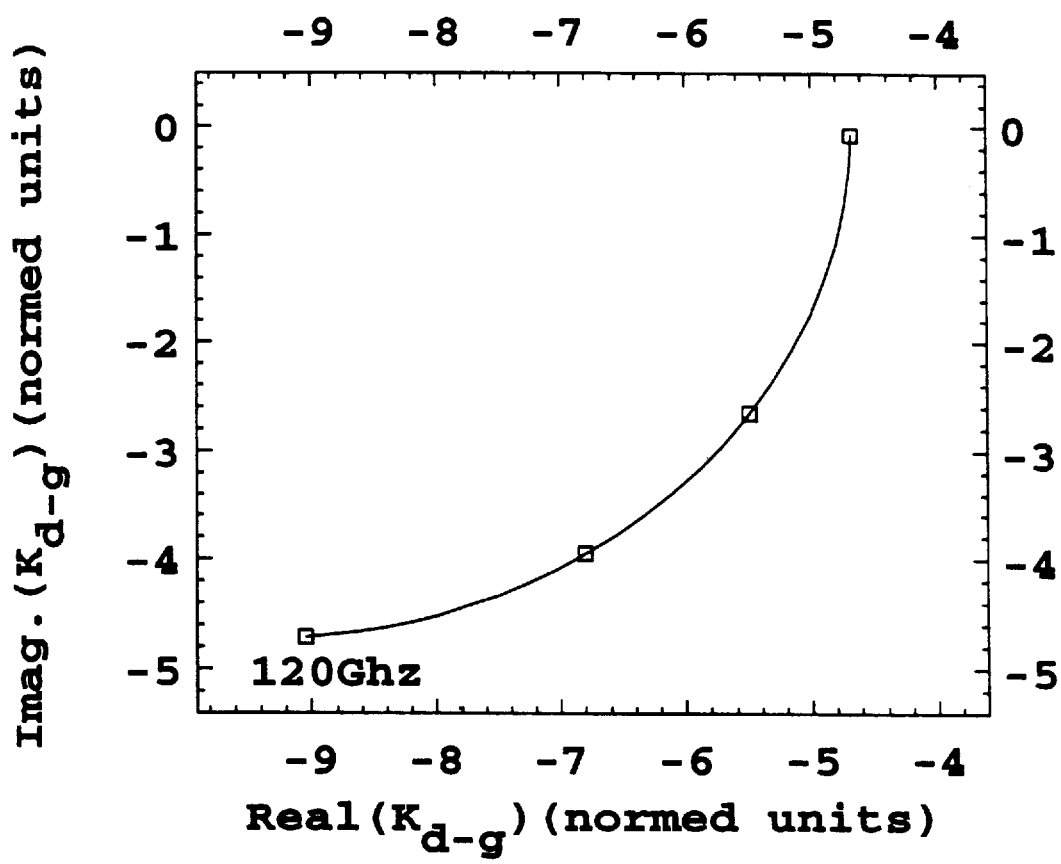
Figure 52:
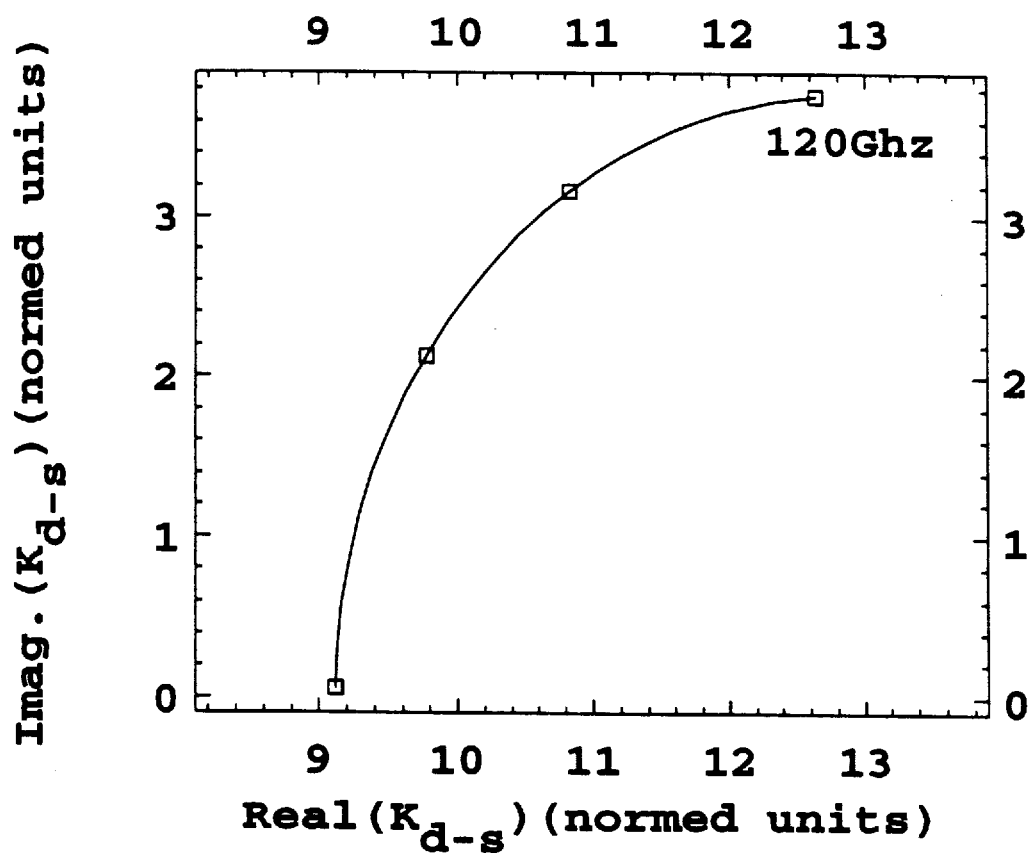
Figure 53:
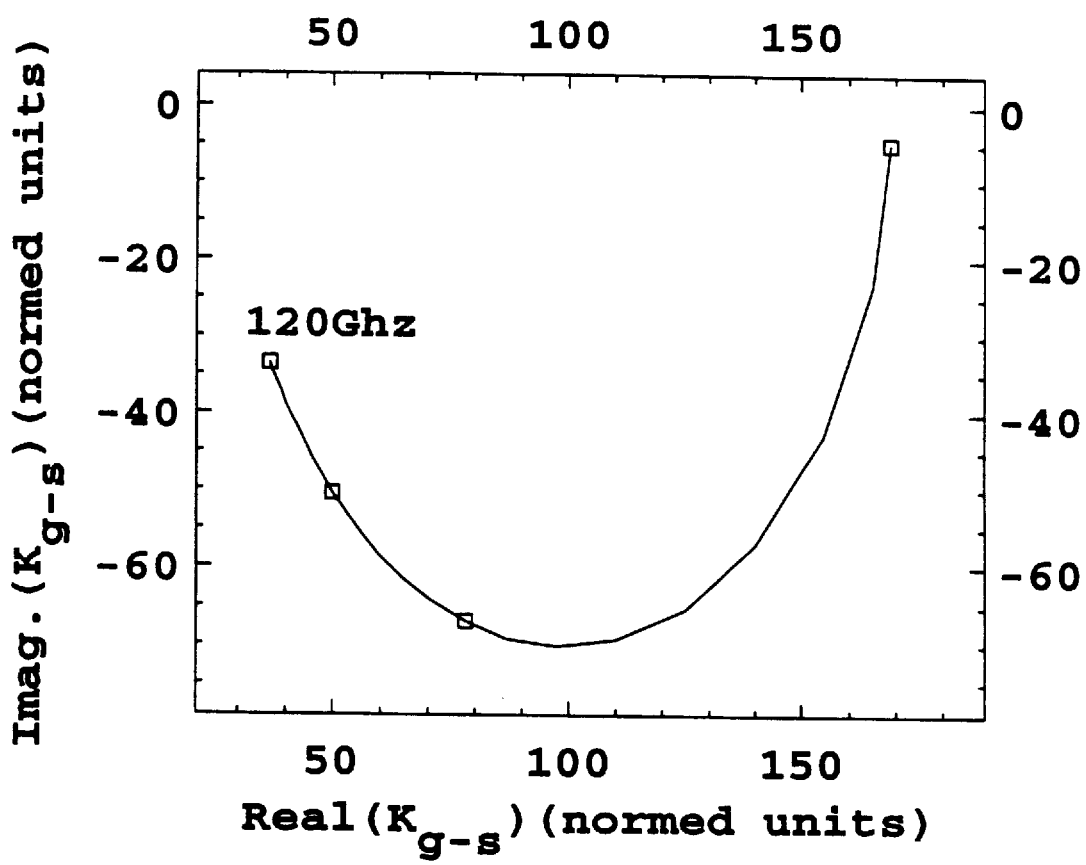
Figure 54:
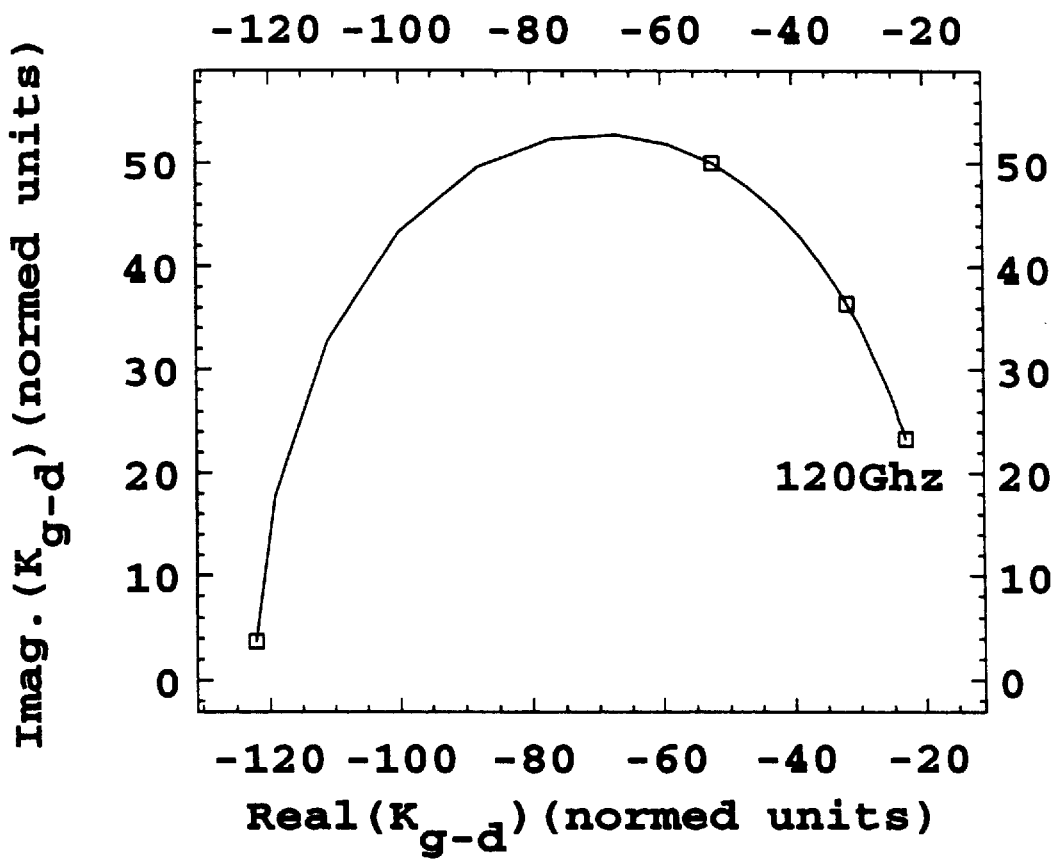
Figure 55:
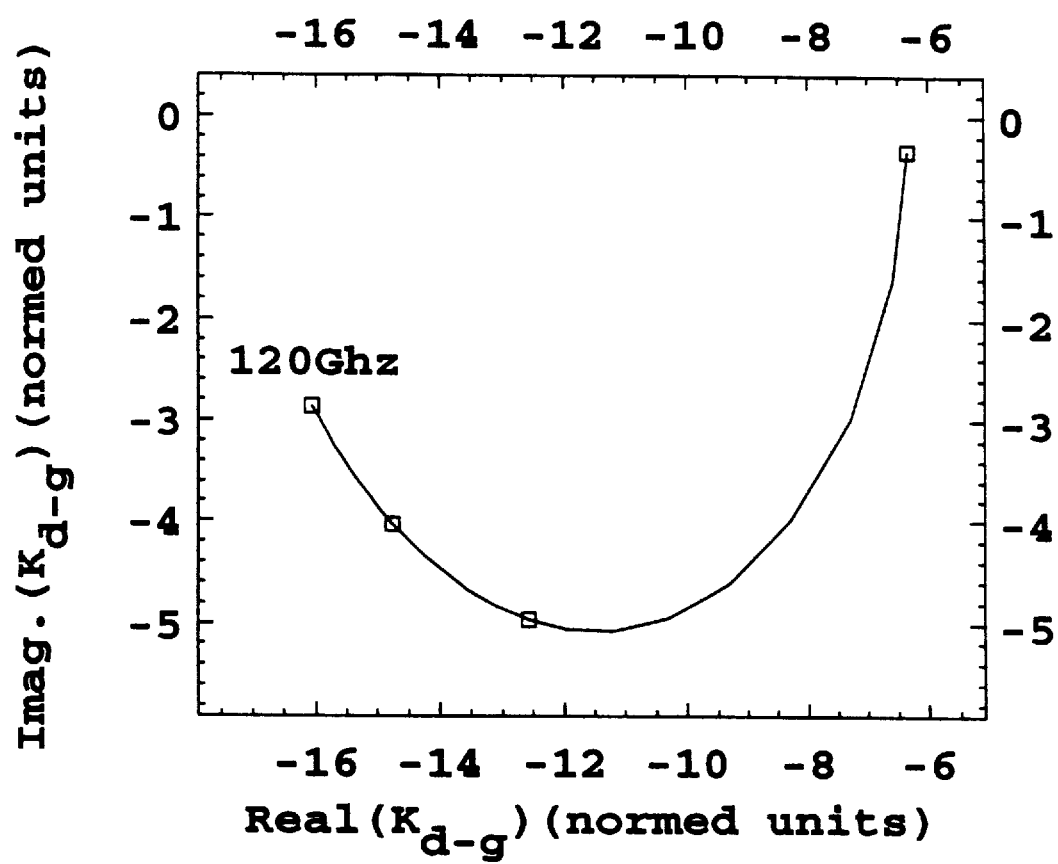
Figure 56:
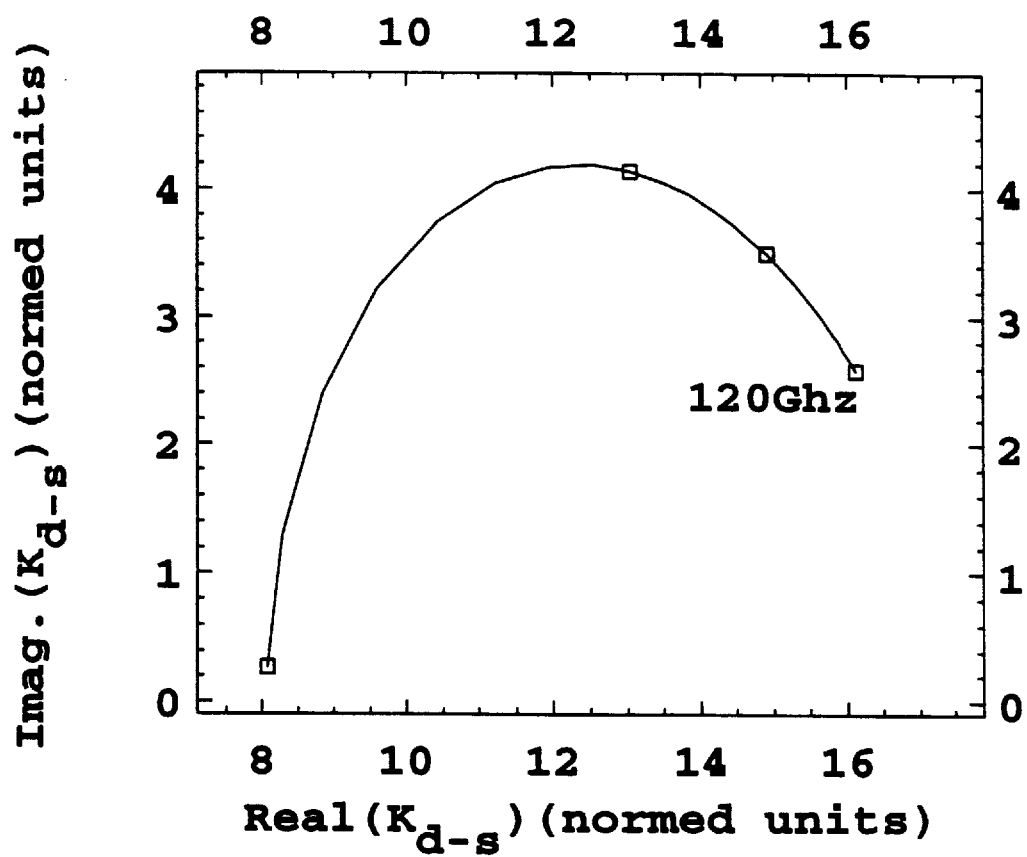
Figure 57:
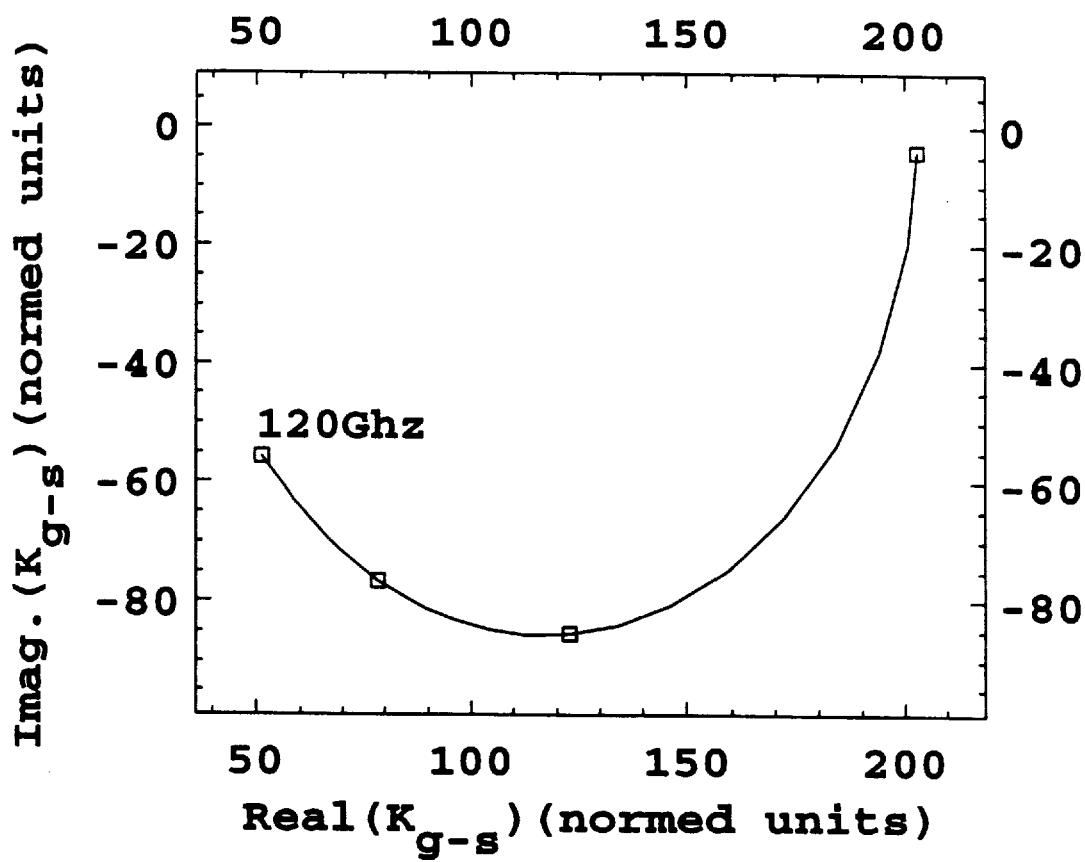
Figure 58:
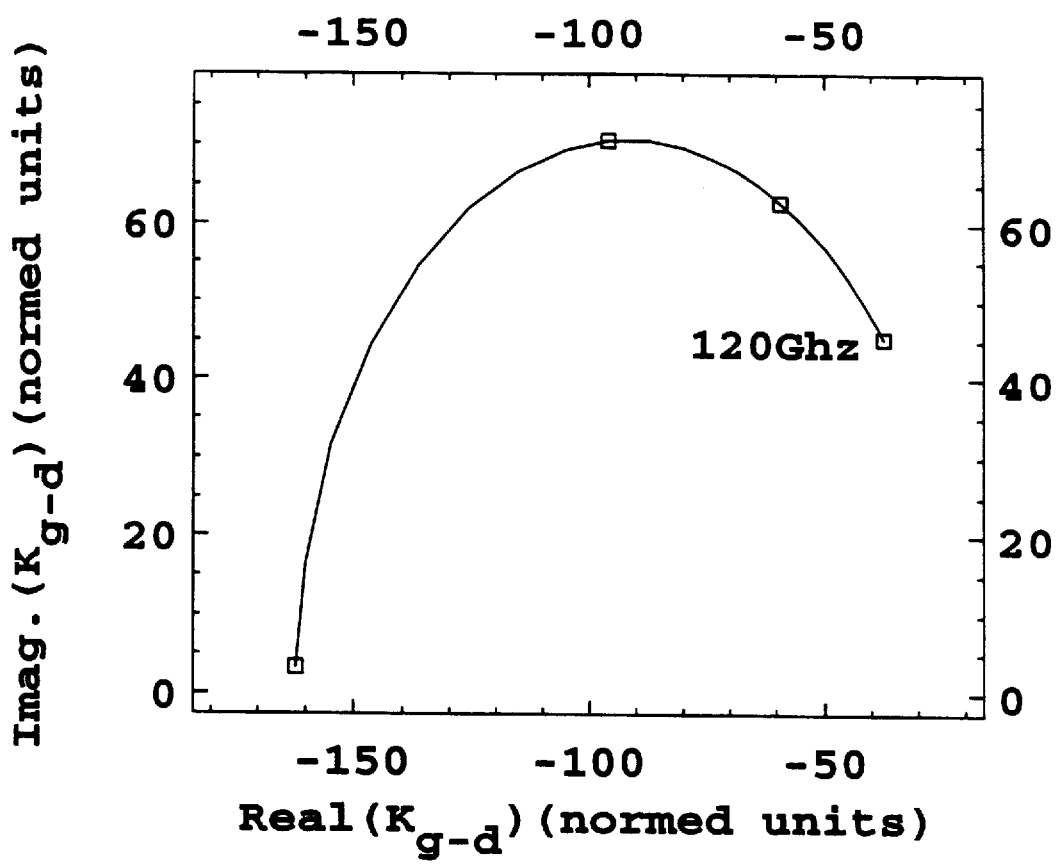
Figure 59:
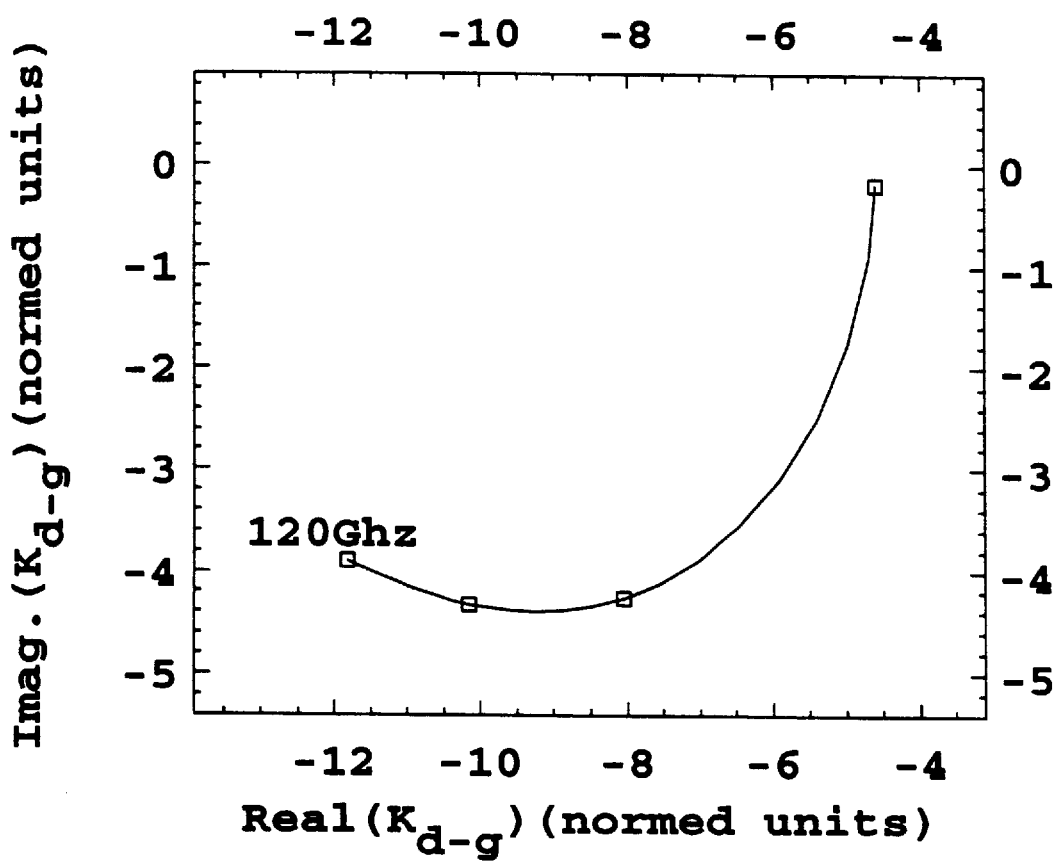
Figure 60:
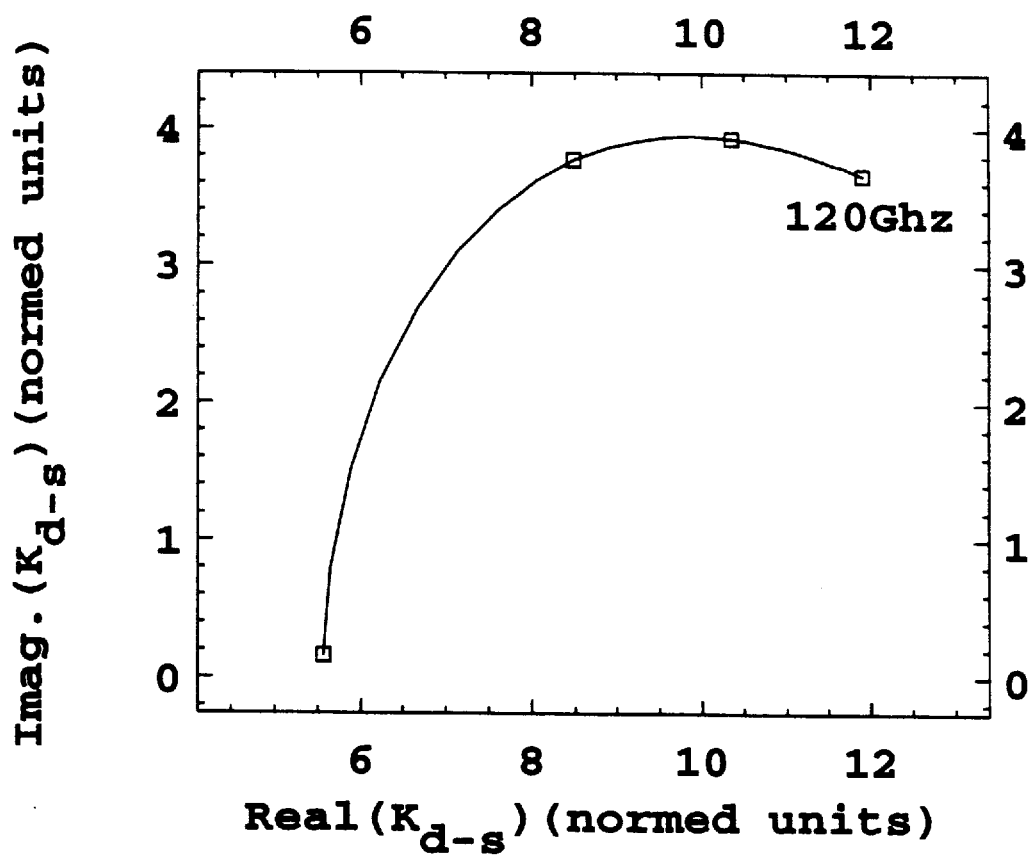
Figure 61:
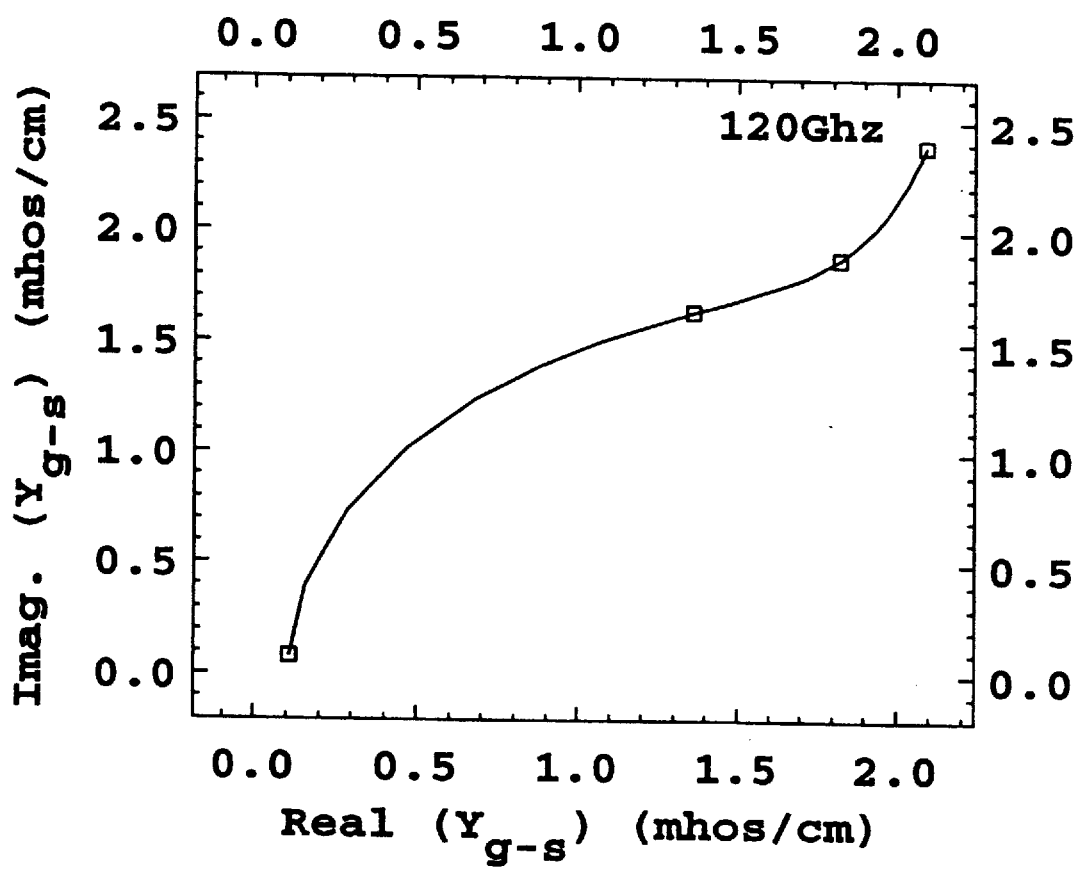
FIGS. 61–72 show the variation in the AC admittance matrix for specific FETs of the present invention in the "reverse" configuration.
Figure 62:
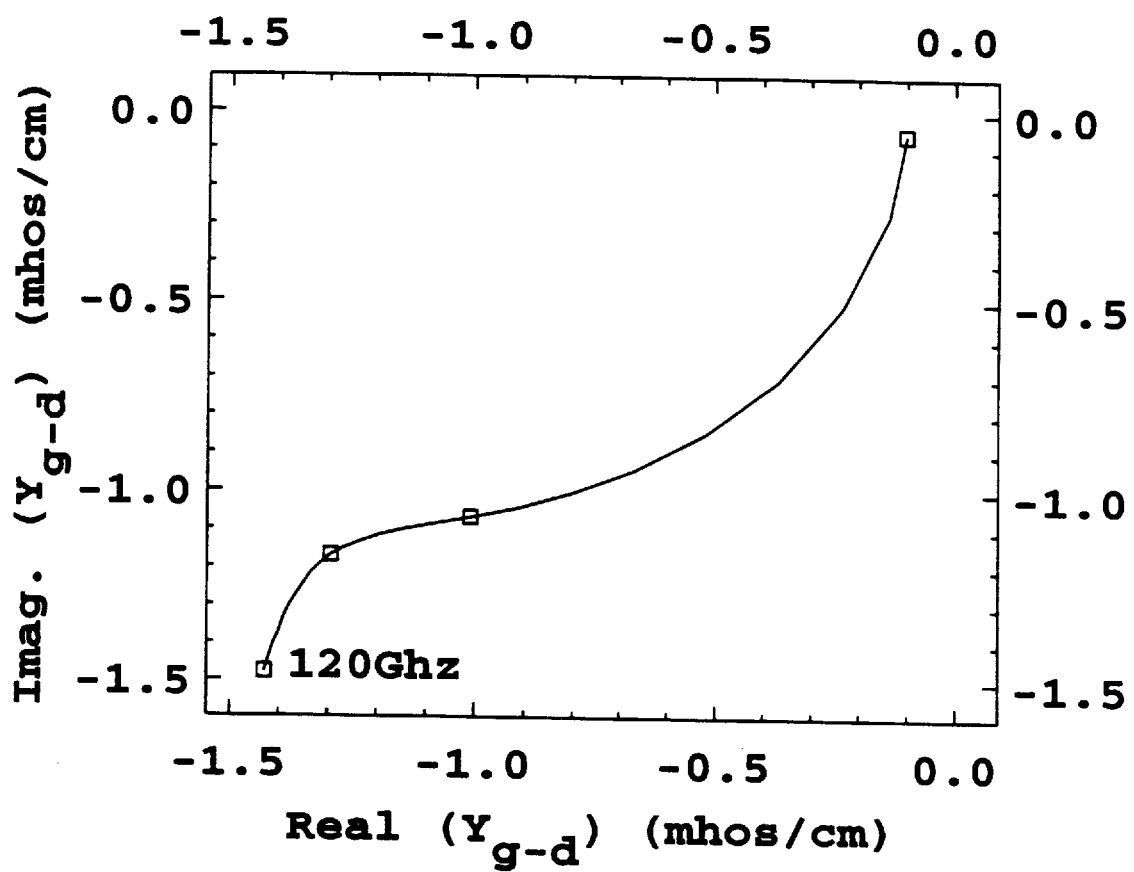
Figure 63:
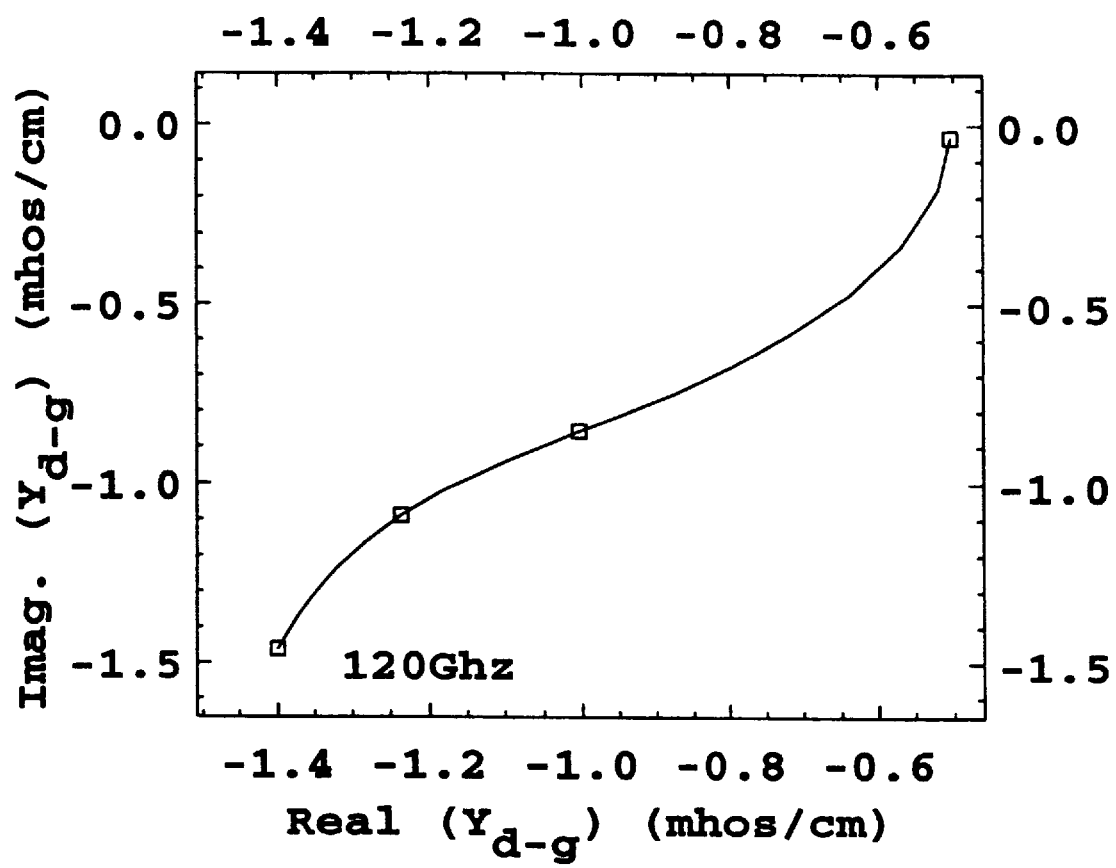
Figure 64:
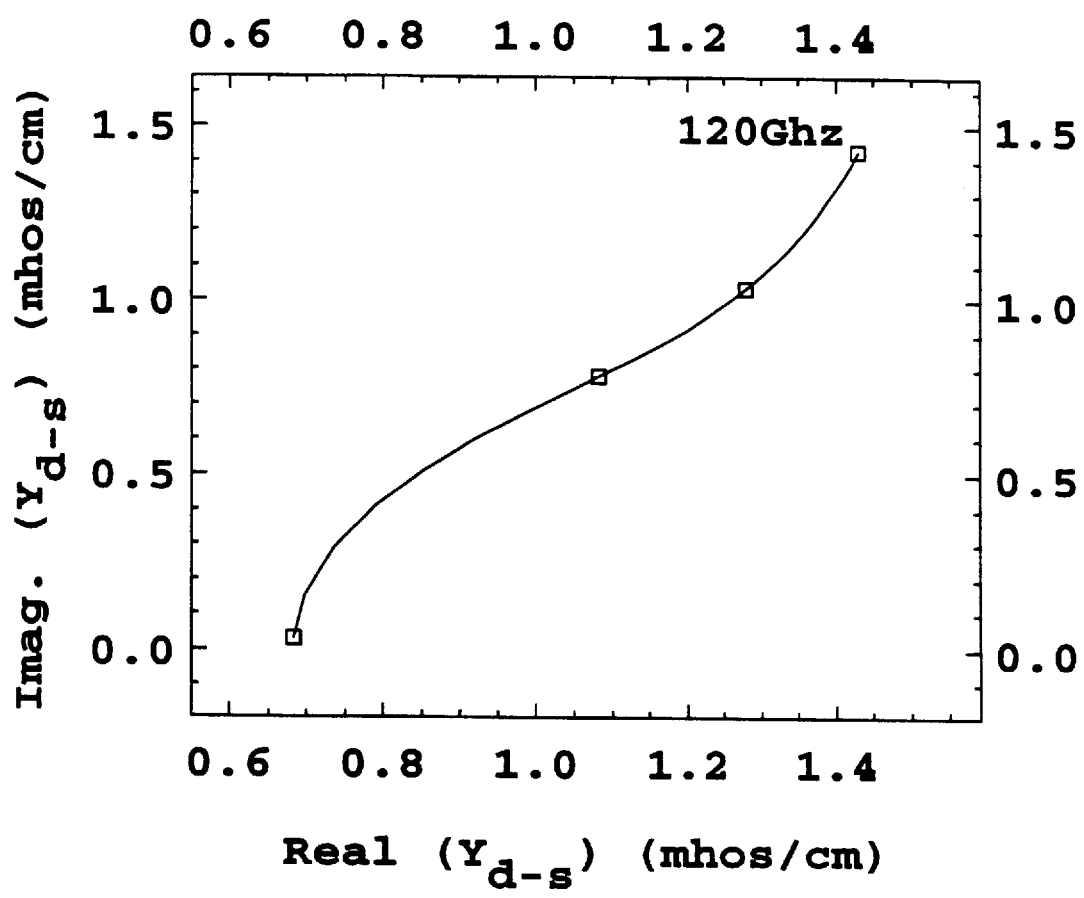
Figure 65:
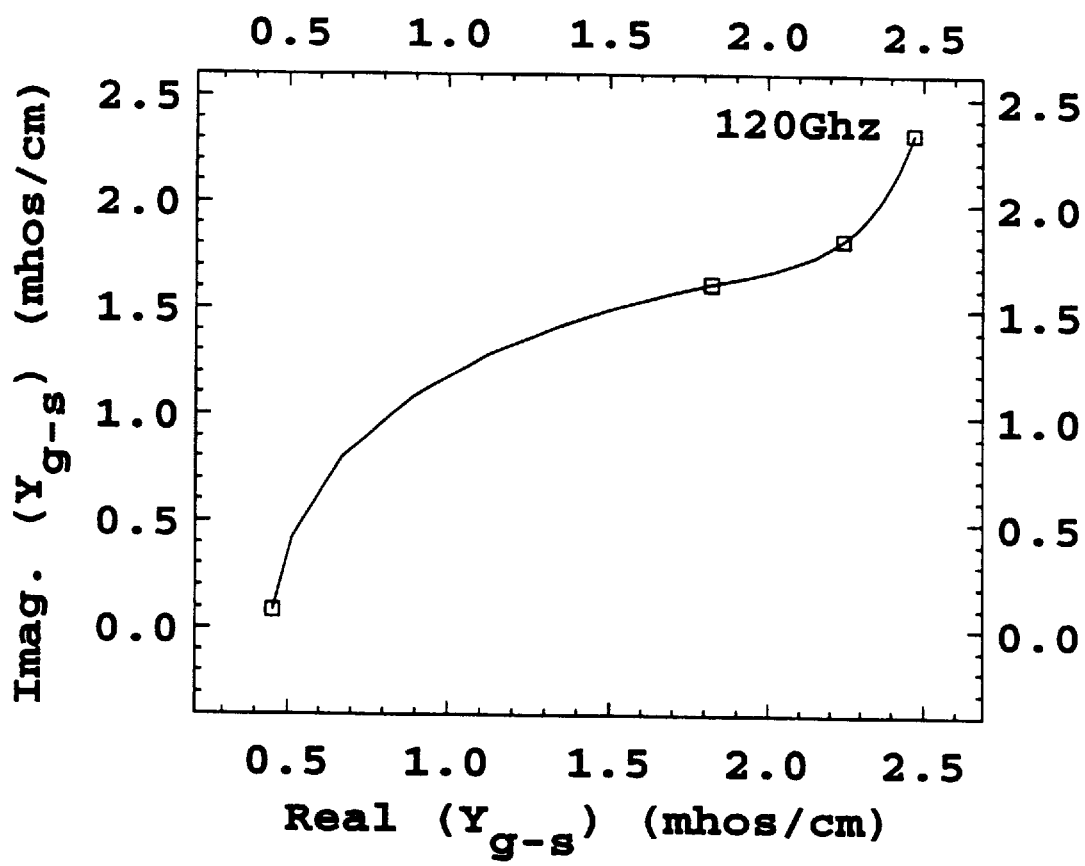
Figure 66:
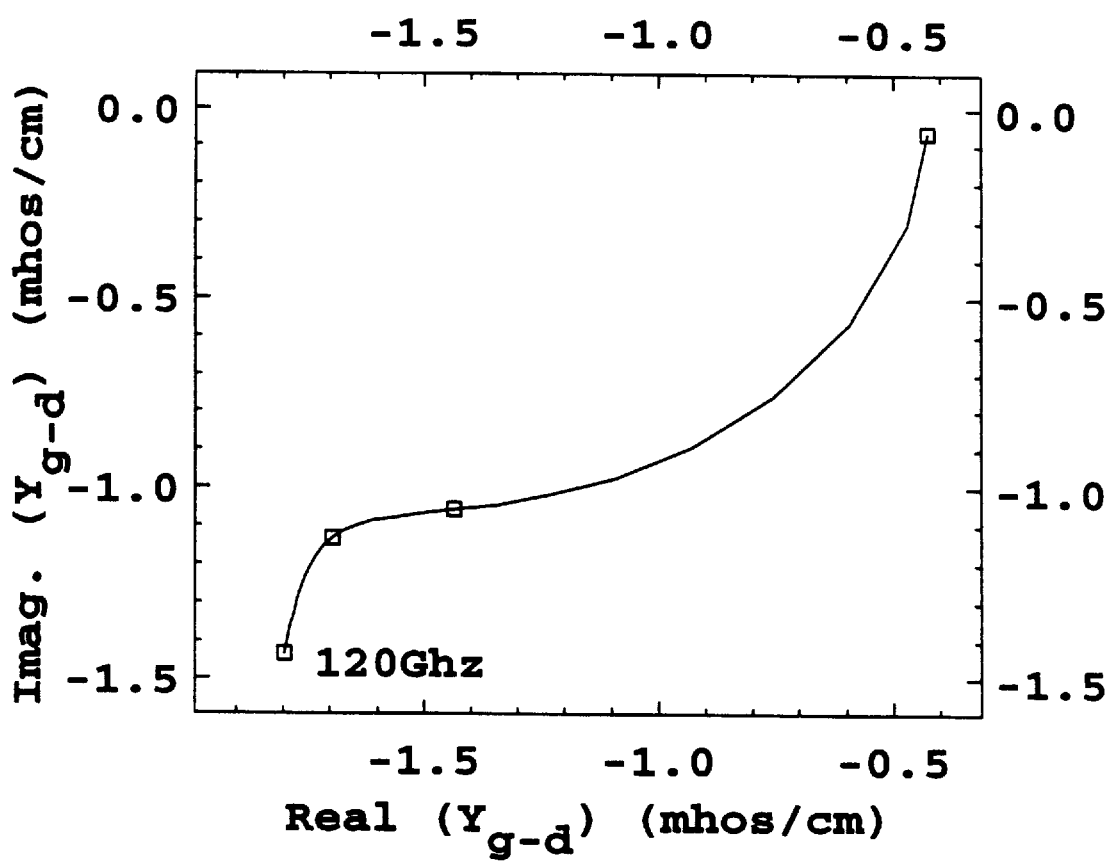
Figure 67:
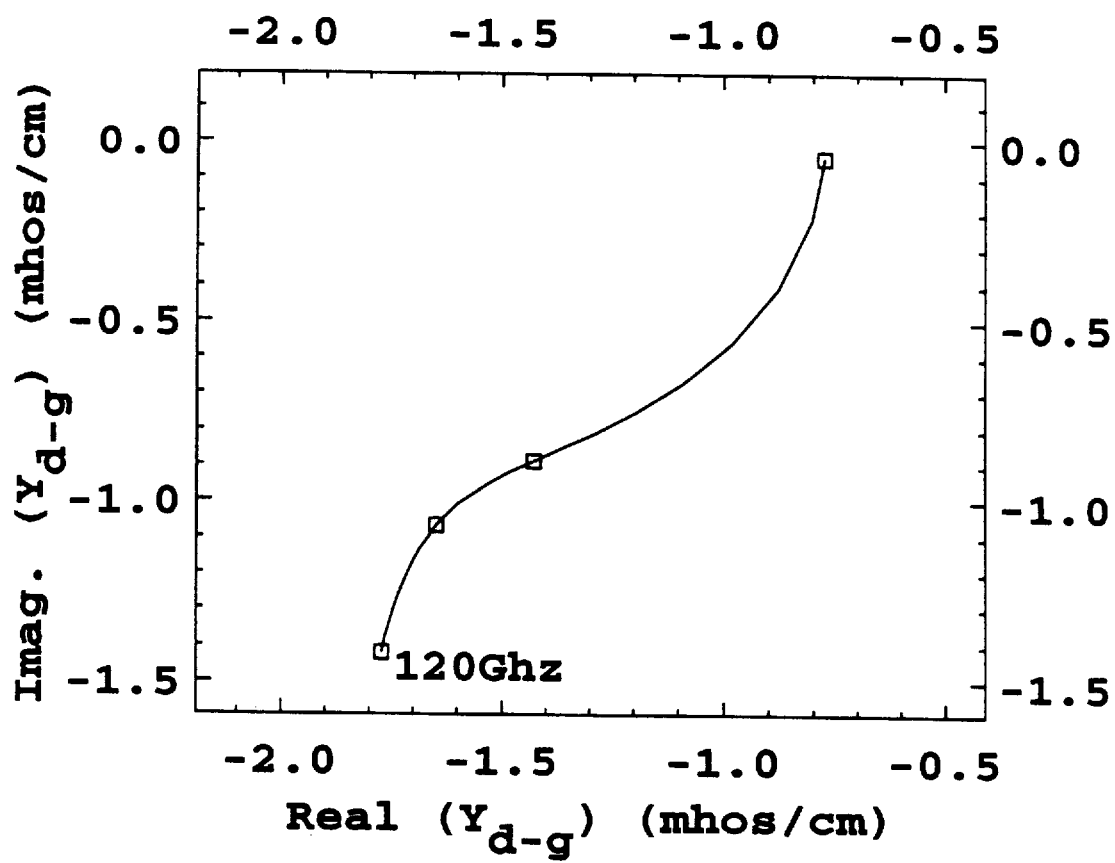
Figure 68:
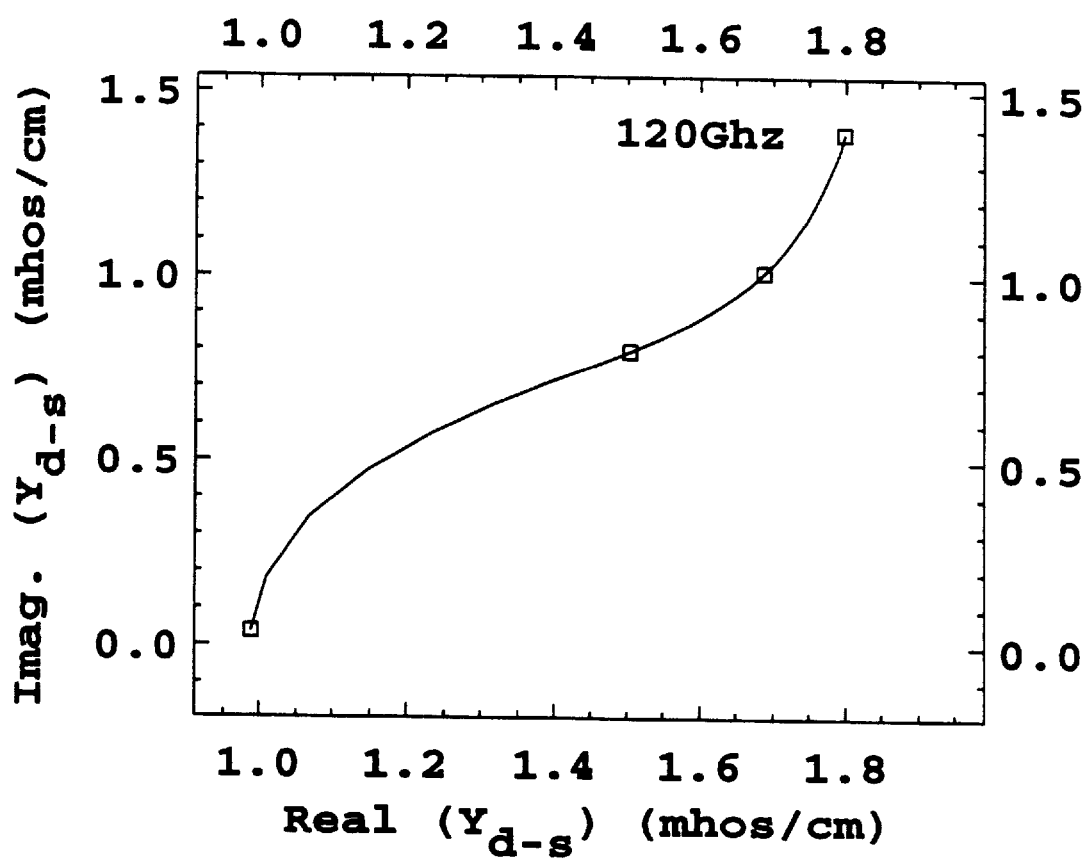
Figure 69:
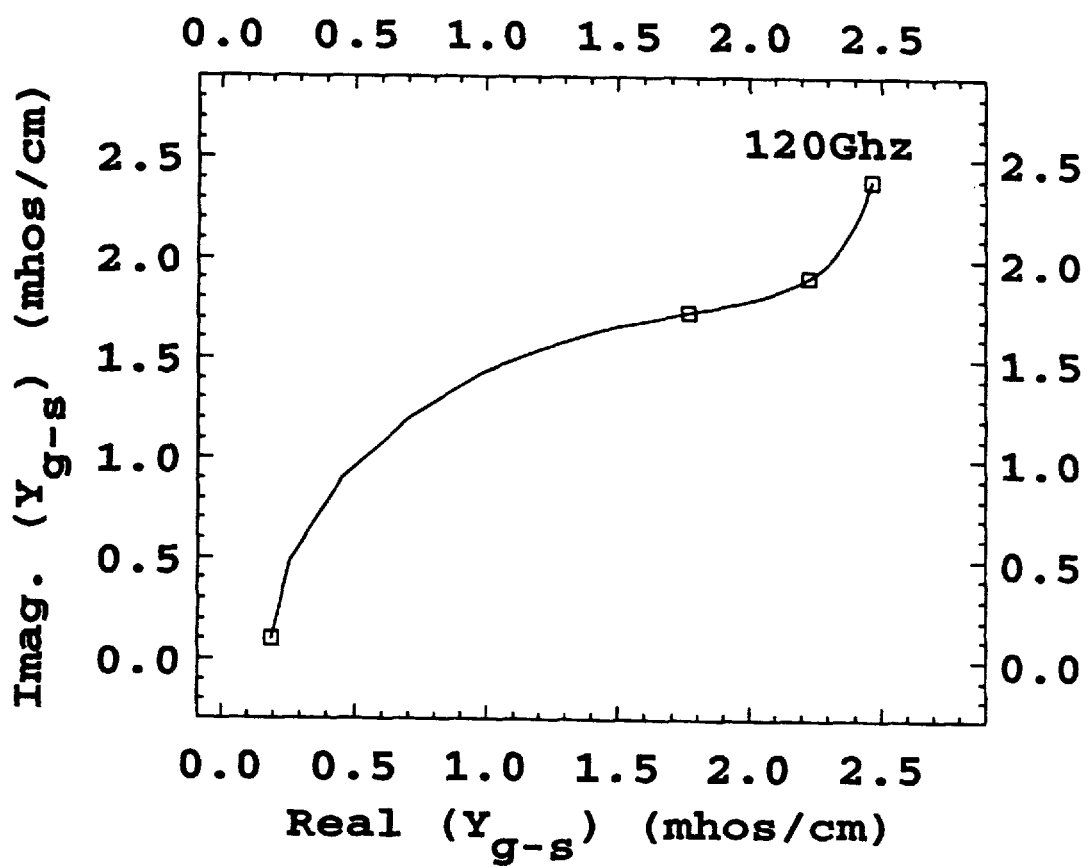
Figure 70:
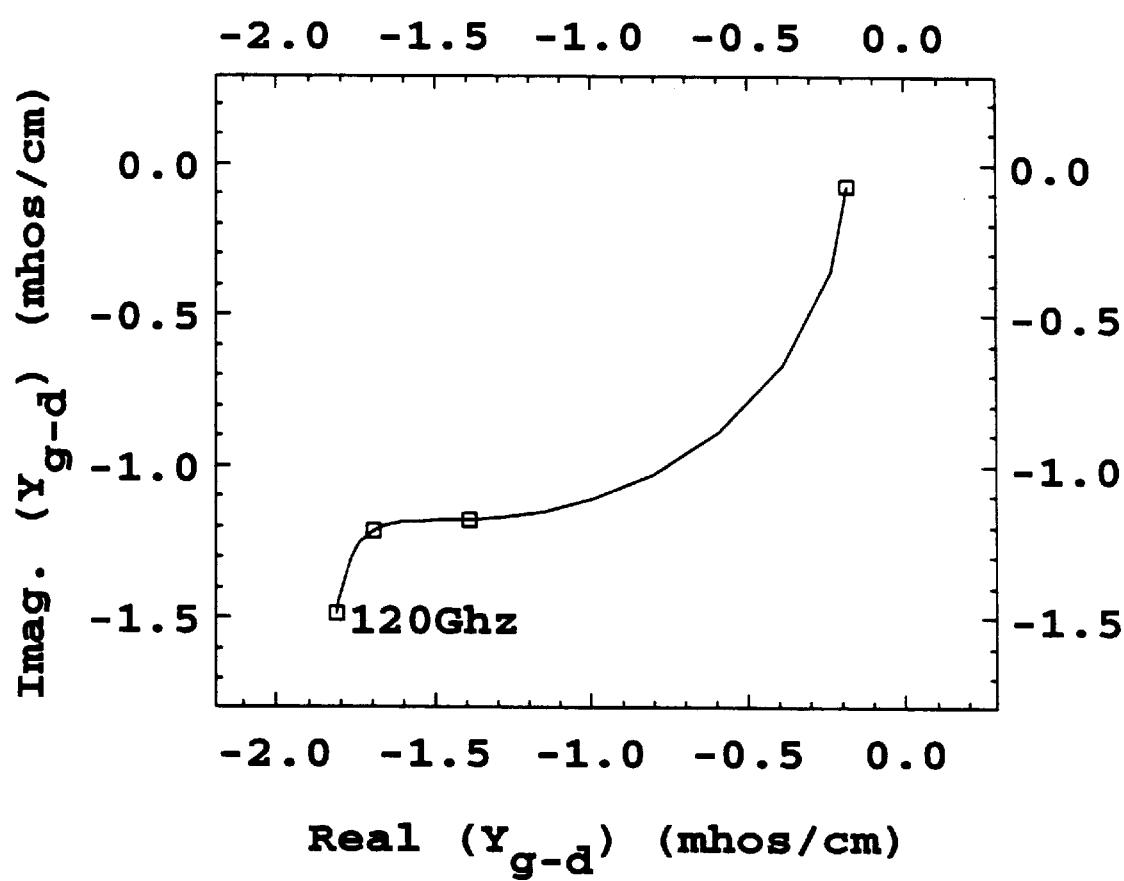
Figure 71:
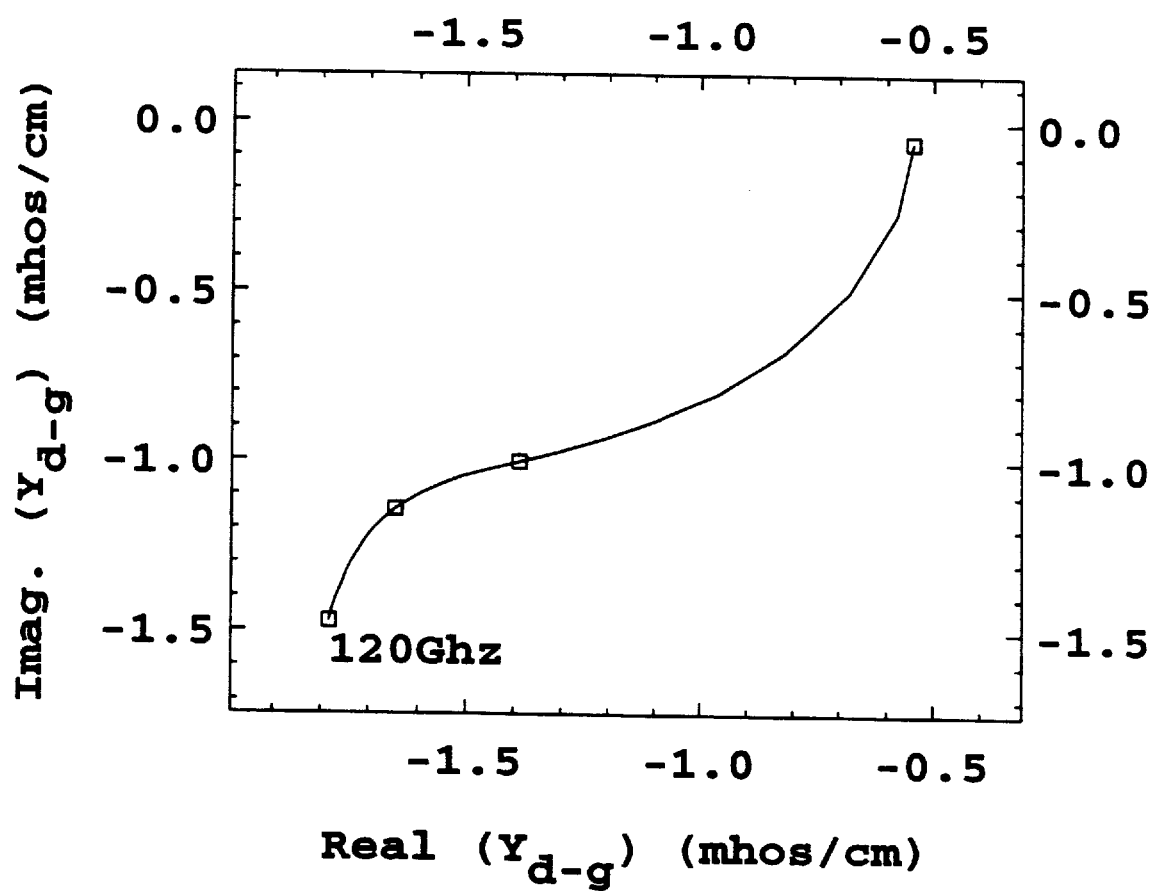
Figure 72:
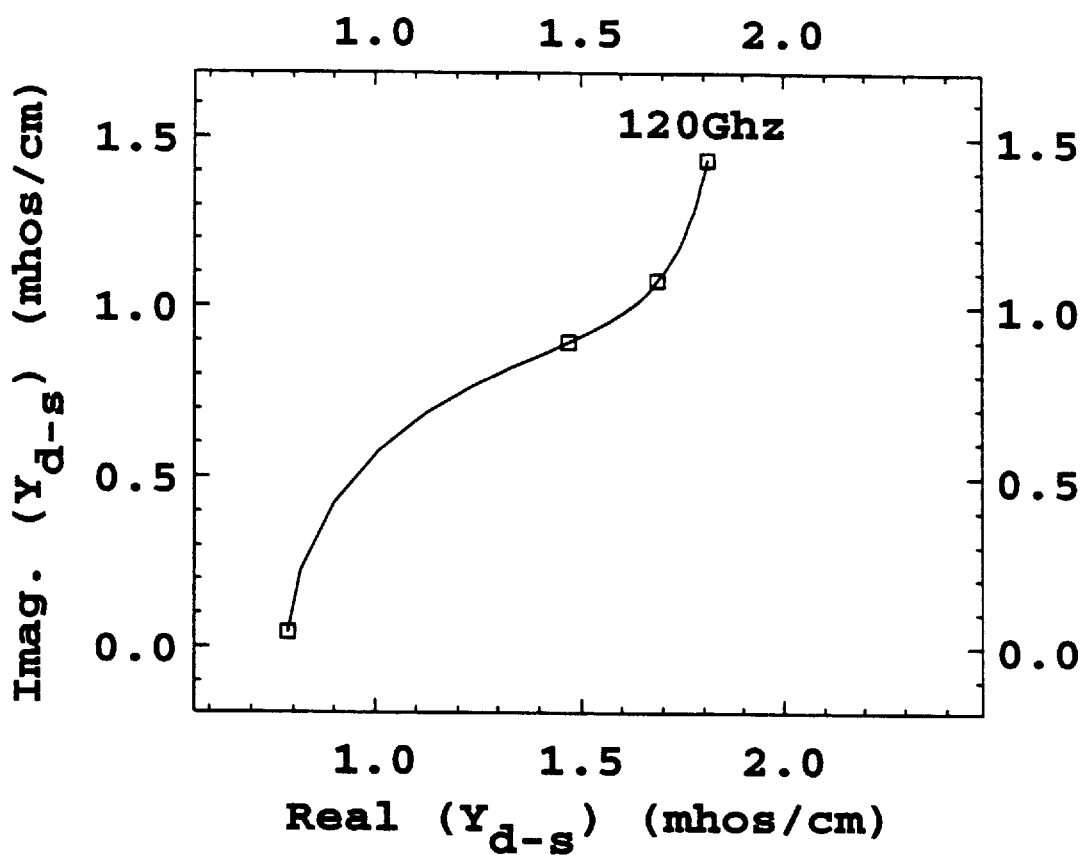
Figure 73:
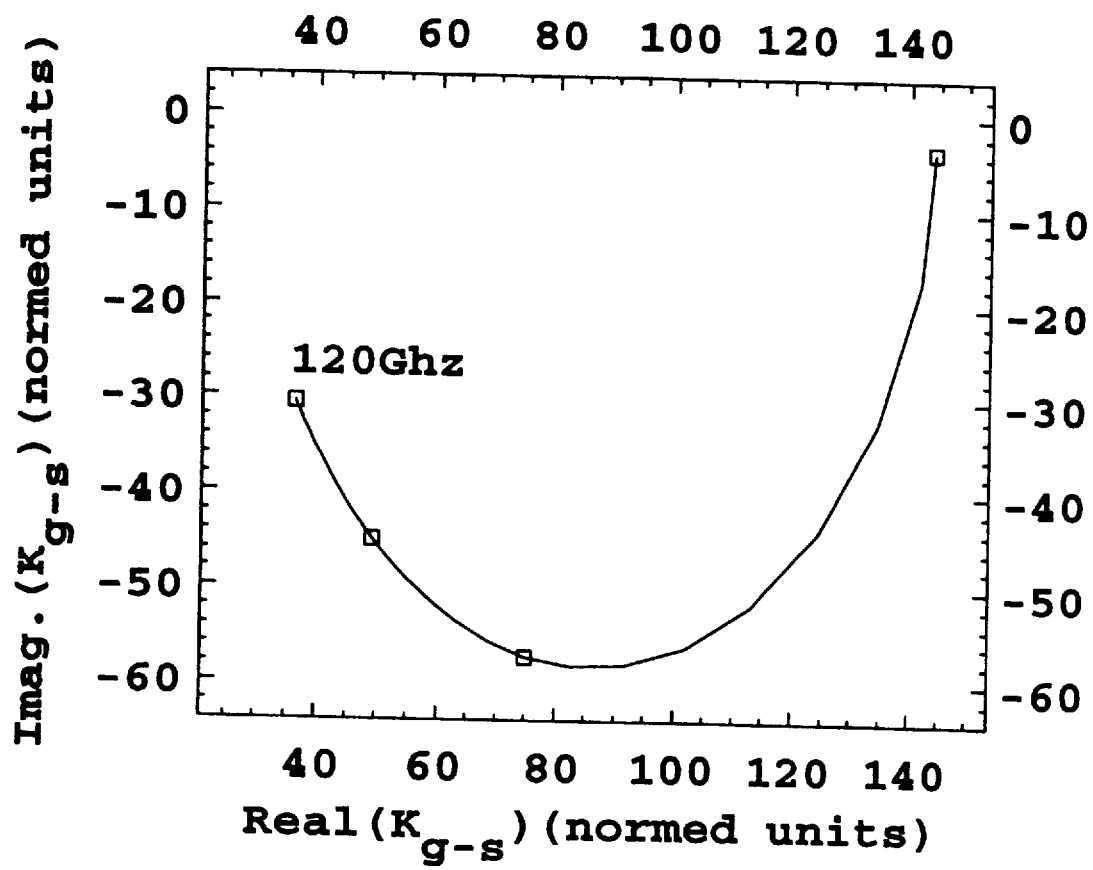
FIGS. 73–84 show the variation in the AC charge matrix for specific FETs of the present invention in the "reverse" configuration.
Figure 74:
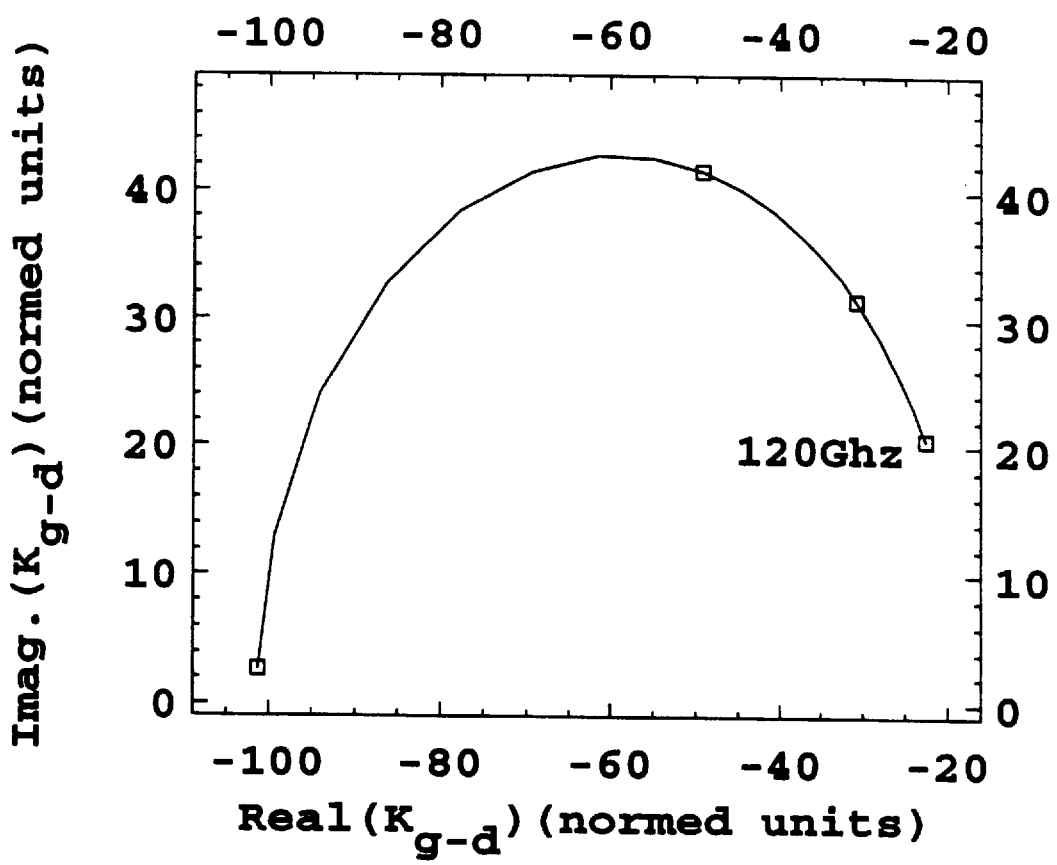
Figure 75:
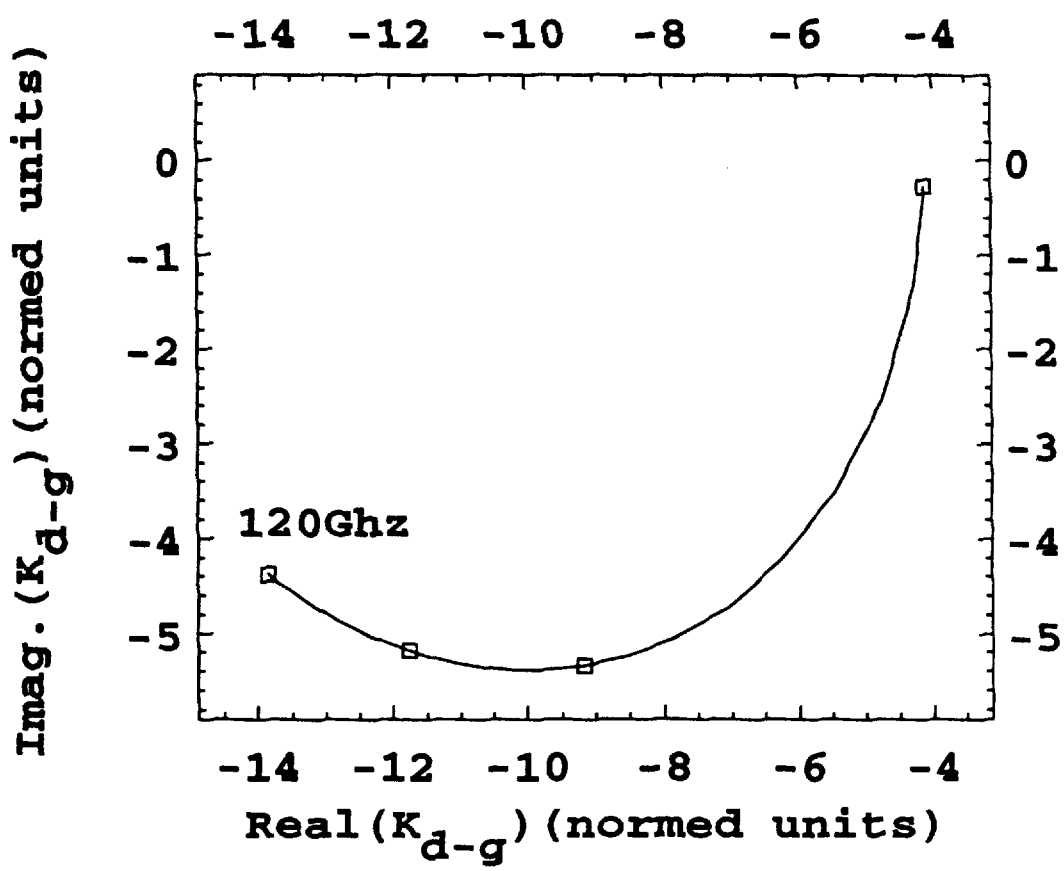
Figure 76:
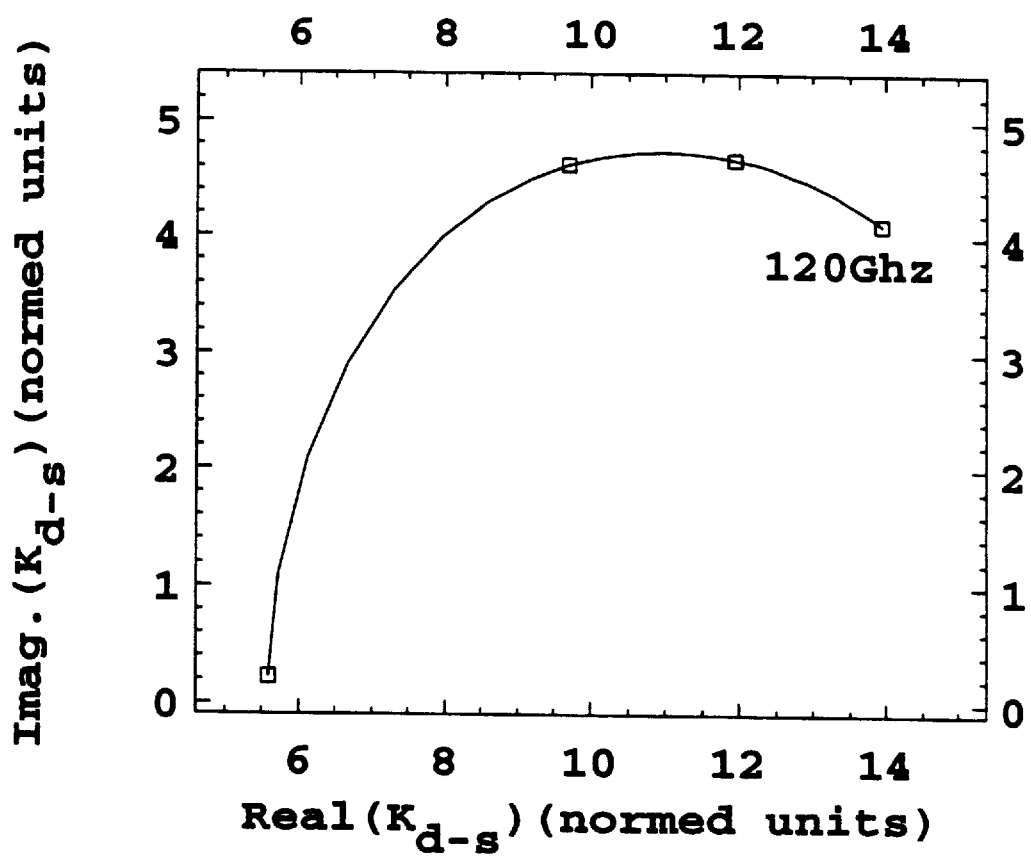
Figure 77:
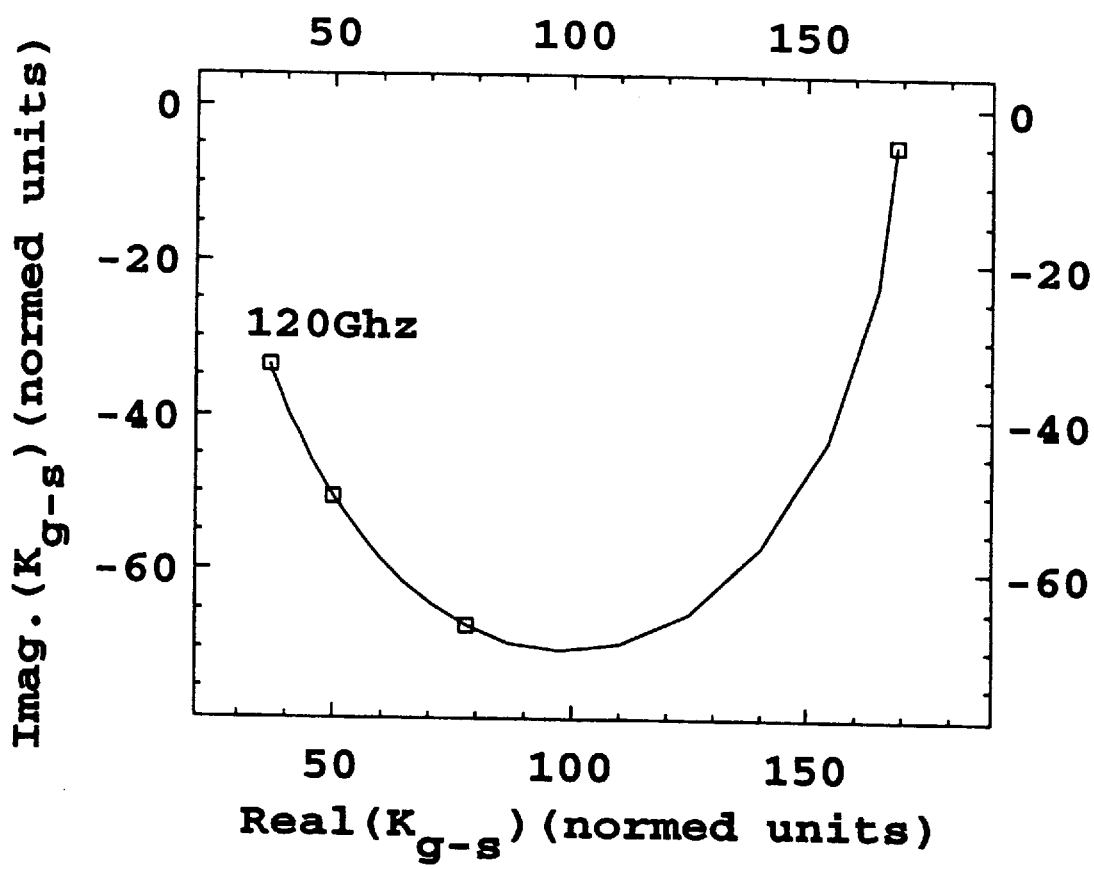
Figure 78:
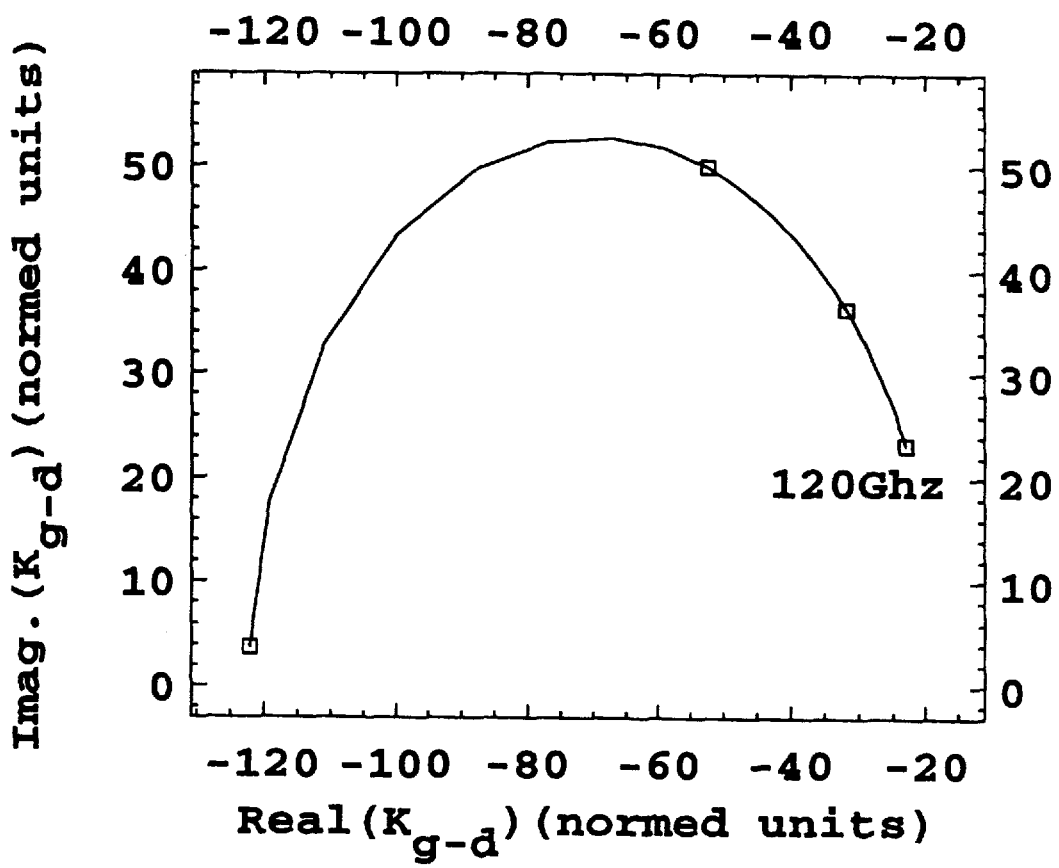
Figure 79:
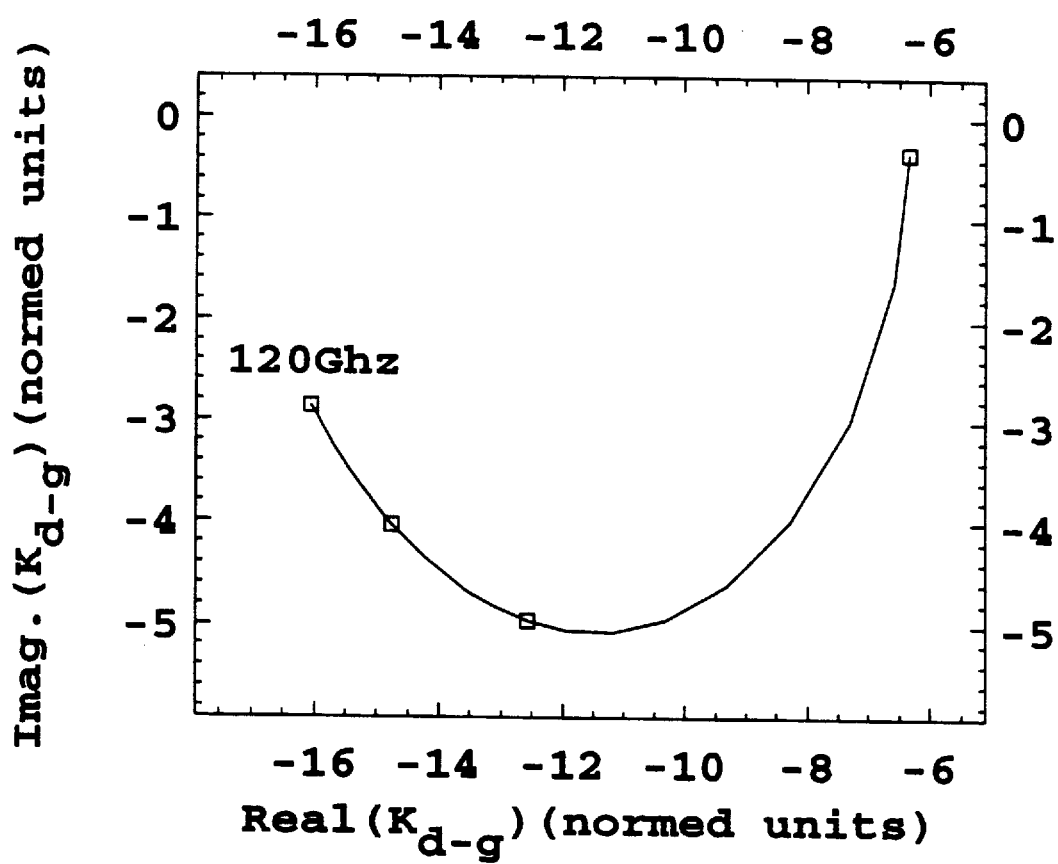
Figure 80:
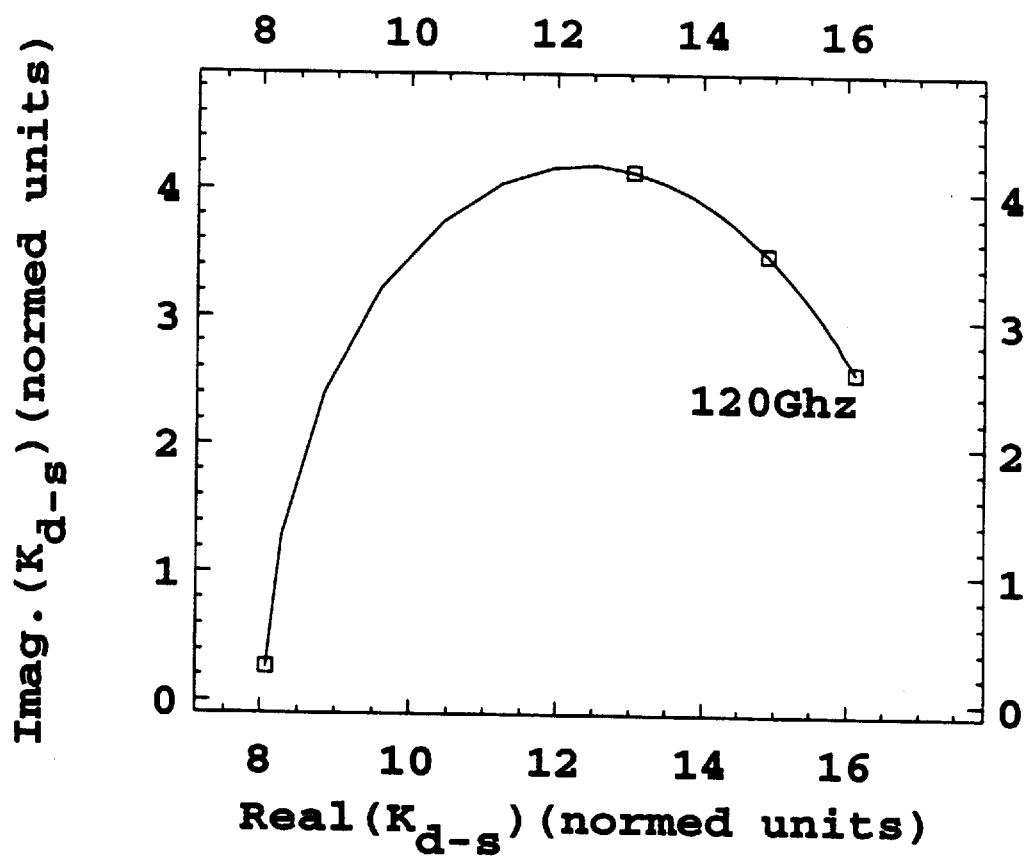
Figure 81:
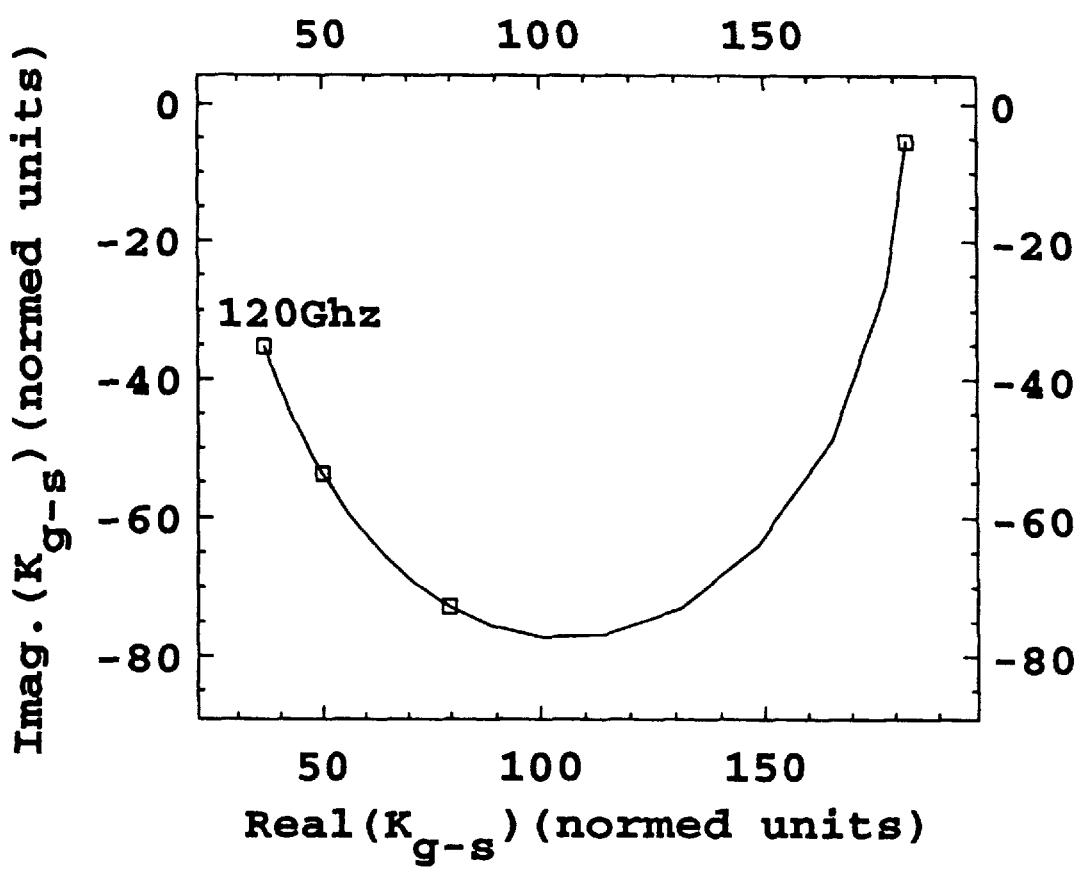
Figure 82:
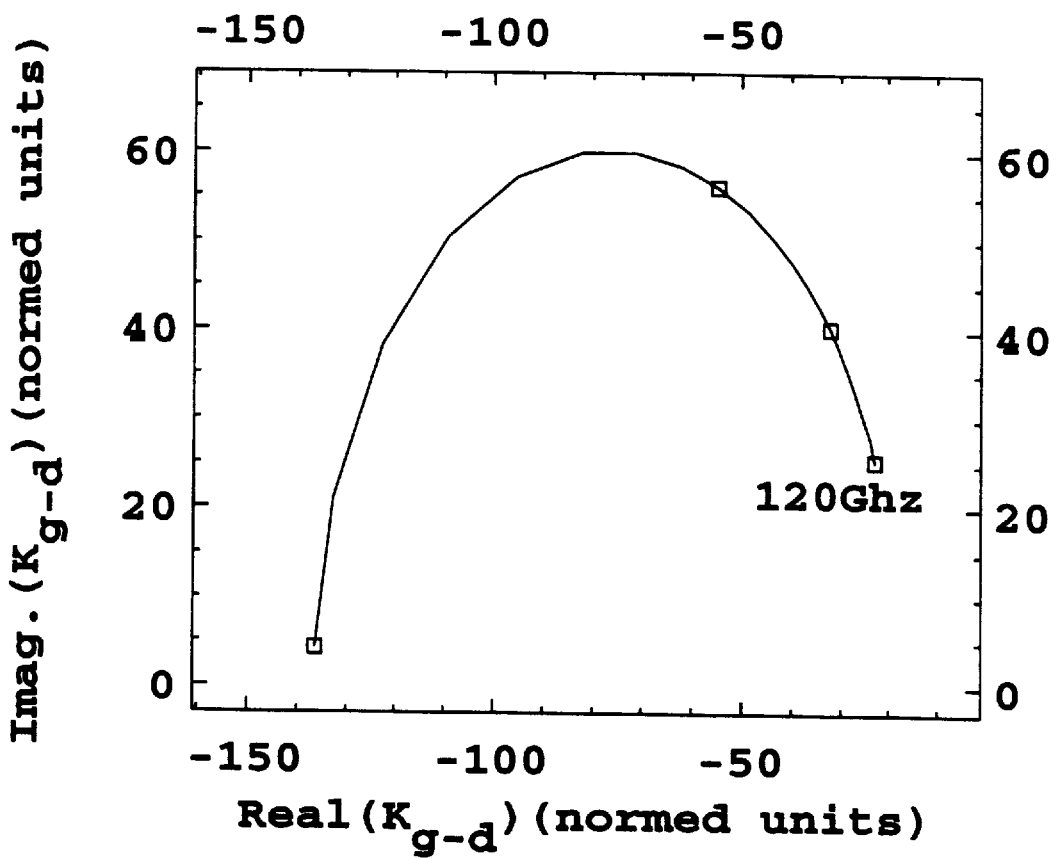
Figure 83:
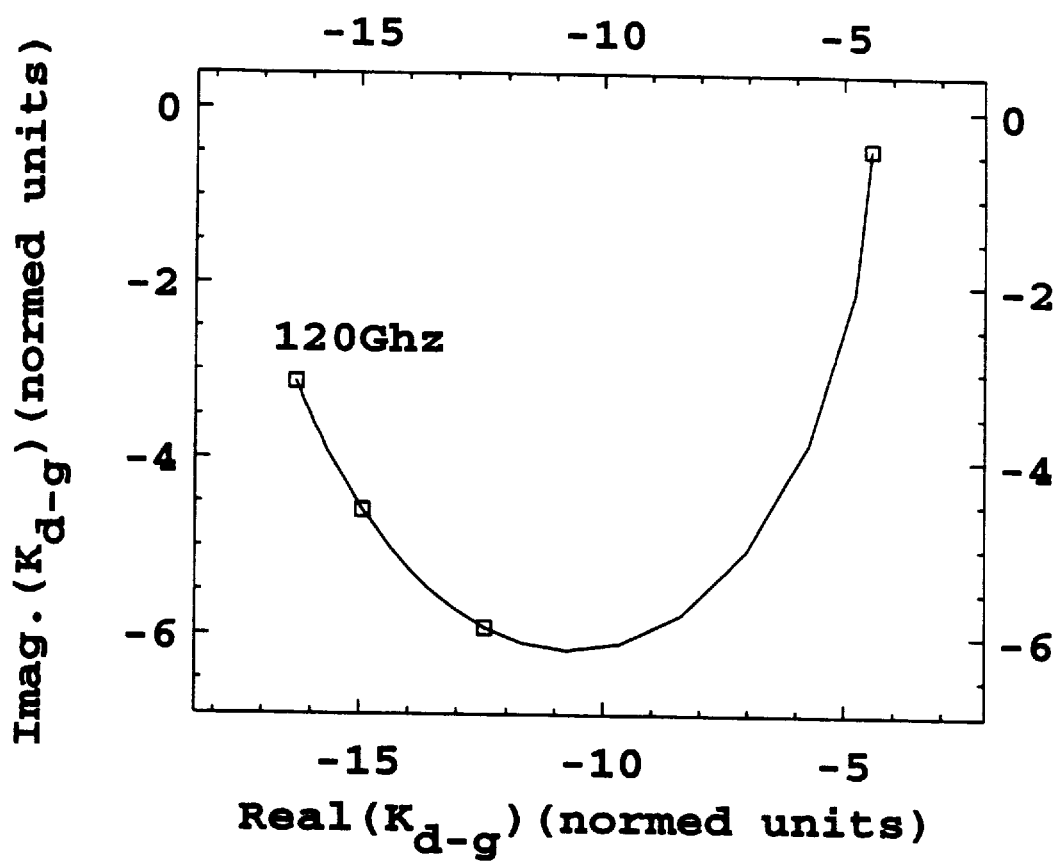
Figure 84:
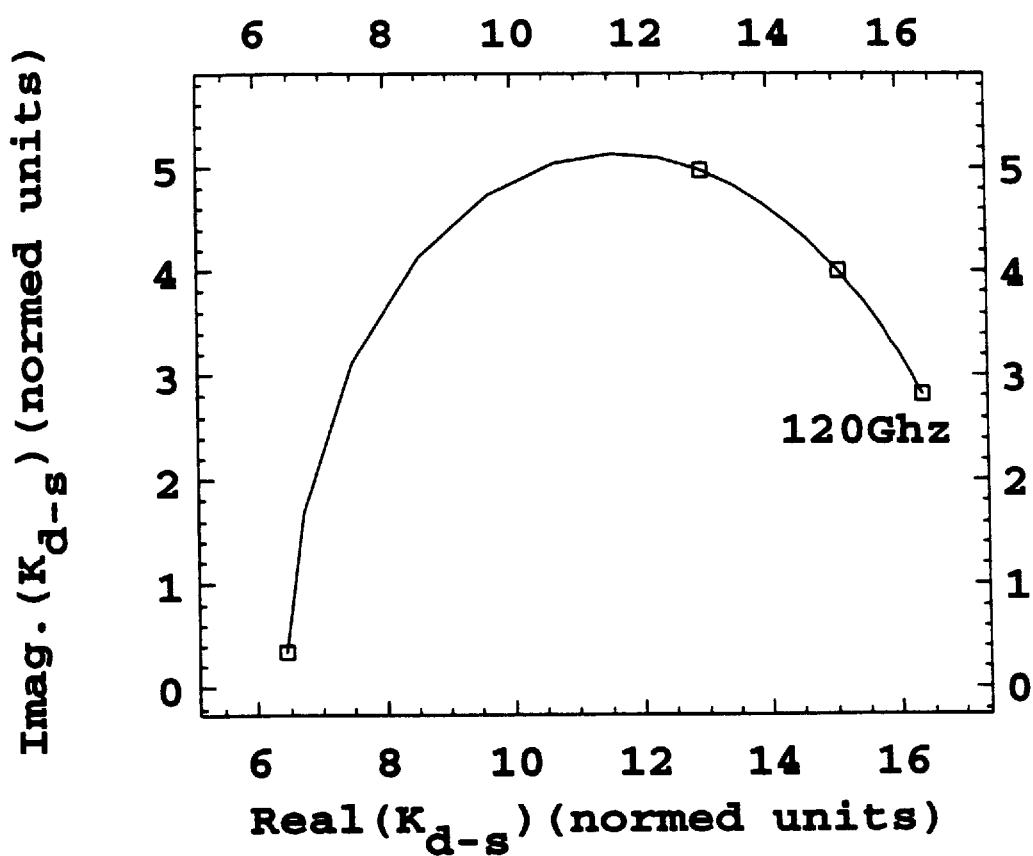

It will be obvious to those of ordinary skill in the art that the AC charge and admittance matrices of FIGS. 13–84, in combination with the series resistance values of Table I and Table II, determine the performance of the TWFET. A different analysis, using transverse electric and magnetic fields, would provide the same results when the same admittance and inductive coupling matrices are obtained and combined with these series resistance values.

While this invention has been explained with reference to the structure disclosed herein, it is not confined to the details set forth and this application is intended to cover any modifications and changes as may come within the scope of the following claims:

What is claimed is:

1. A traveling wave field-effect transistor operated at frequencies in the microwave range or above the microwave range, and having signals propagating therethrough generally from and to electrodes attached thereto defining a traveling wave signal direction, said traveling wave field-effect transistor defining a semiconductor structure, said semiconductor structure, taken in cross section in a transverse direction at right angles to said traveling wave signal direction, corresponding to a cross section field effect transistor, comprising:

at least one gate electrode constructed in said structure, at least one source electrode region constructed in said structure, at least one drain electrode region constructed in said structure, a depletion region generally beneath said gate electrode wherein, in a plane transverse to said direction of signal propagation, said depletion region defining an edge located between the gate electrode and a drain electrode region, and means for separating the depletion region edge from the drain electrode region such that at some frequency said traveling wave field effect transistor provides, compared to said cross section field-effect transistor, higher values for at least one of the parameters selected from the group consisting of Mason's U function, maximum available gain, and maximum stable gain.

2. The traveling wave field-effect transistor of claims 1, wherein a conductivity of a semiconductor of the traveling-wave field effect transistor is substantially 1.6 Siemens/cm.

3. The traveling wave field-effect transistor of claims 1, wherein a conductivity of a semiconductor of the traveling-wave field effect transistor is increased in a local area adjacent to said drain electrode region between the depletion region edge and the drain electrode region.

4. The traveling wave field-effect transistor of claims 1, further comprising:
   means for forming at least one gate electrode, at least one drain electrode region, and at least one source electrode region,
   means for positioning said edge of said depletion region wherein said edge has a first end portion located between said gate electrode and said drain electrode region and said edge has a second end portion located distal from said gate electrode in a direction towards said source electrode region, and wherein said gate electrode is about one micron in length.

5. The traveling wave field-effect transistor of claims 1, further comprising:
   means for forming a reverse bias between the at least one gate electrode and the at least one drain electrode region which is of a magnitude less than that of the reverse bias between the at least one gate electrode and the at least one source electrode region.

6. The traveling wave field-effect transistor of claim 1, wherein a signal is input to a drain-source electrode pair and the signal is taken from a gate-source electrode pair.

7. The traveling wave field-effect transistor of claim 1, further comprising at least one additional traveling wave field-effect transistor wherein said traveling wave field-effect transistors are configured to operate in parallel.

8. A traveling wave field-effect transistor operated at frequencies in the microwave range or above the microwave range, and having traveling wave signals propagating in a direction therethrough generally from and to electrodes attached thereto, comprising:
   semiconductor structure defining a traveling wave signal propagation direction and a transverse direction configured at right angles to said traveling wave signal propagation direction, said structure in cross section taken in said transverse direction perpendicular to said traveling wave signal propagation direction, said cross section corresponding to a cross section field-effect transistor,
   a coupling length of said structure in said traveling wave signal propagation direction having electrodes configured for attaching transmission lines for an input signal and for an output signal, said input and output attachments at opposite ends of said coupling length,
   at least one gate electrode extending along said coupling length in the traveling wave signal propagation direction,
   at least one source electrode extending along said coupling length in the traveling wave signal propagation direction,
   at least one drain electrode extending along said coupling length in the traveling wave signal propagation direction, wherein a traveling wave field-effect transistor is formed,
   input transmission line attached to the electrodes at one end of said coupling length for an input signal,
   output transmission line attached to the electrodes at said opposite end of said coupling length for an output signal,
   a depletion region generally beneath said at least one gate electrode, said depletion region, when viewed in a cross section of said semiconductor structure taken in said transverse direction, having an edge,
   means for positioning said edge between said at least one gate electrode and said at least one drain electrode region, and
   means for separating the depletion region edge from the at least one drain electrode region such that said traveling wave field effect transistor provides, compared to said cross section field-effect transistor, higher values for at least one of the parameters selected from the group consisting of Mason's U function, maximum available gain, and maximum stable gain.

9. A traveling wave field-effect transistor operated at frequencies in the microwave range or above the microwave range, and having traveling wave signals propagating in a direction therethrough generally from and to electrodes attached thereto, comprising:
   semiconductor structure defining a traveling wave signal propagation direction and a transverse direction configured at right angles to said traveling wave signal propagation direction,
   a coupling length of said structure in said traveling wave signal propagation direction having electrodes attaching transmission lines for an input signal and for an output signal, said input and output attachments at opposite ends of said coupling length,
   at least one gate electrode extending along said coupling length in the traveling wave signal propagation direction,
   at least one source electrode extending along said coupling length in the traveling wave signal propagation direction,
   at least one drain electrode extending along said coupling length in the traveling wave signal propagation direction, wherein a traveling wave field-effect transistor is formed,
   input transmission line attached to the electrodes at one end of said coupling length for an input signal,
   output transmission line attached to the electrodes at said opposite end of said coupling length for an output signal,
   a depletion region generally beneath said at least one gate electrode, said depletion region, when viewed in a cross section of said semiconductor structure taken in said transverse direction, having an edge,
   means for positioning said edge between said at least one gate electrode and said at least one drain electrode region, and
   means for separating said depletion region edge from the drain electrode region such that non-reciprocal inductive coupling is created along said coupling length.

10. A semiconductor structure forming a traveling wave field-effect transistor operated at frequencies in the microwave range or above the microwave range, said structure defining at least one of gate electrode and source and drain electrode regions, said structure having traveling wave signals propagating therethrough defining a traveling wave signal direction and a transverse direction configured at right angles to said traveling wave signal direction, said electrodes and electrode regions defining at least two transmission lines, comprising:
   a depletion region generally beneath said gate electrode wherein, in a plane in said transverse direction and at right angles to said traveling wave signal direction, said depletion region defines an edge, and means for separating said depletion region edge from the drain electrode region such that non-reciprocal inductive coupling is created between said at least two transmission lines of said traveling wave field effect transistor.

11. A traveling wave field-effect transistor operated at frequencies in the microwave range or above the microwave range, and having traveling wave signals propagating in a direction therethrough generally from and to electrodes attached thereto, comprising:

semiconductor structure defining a traveling wave signal propagation direction and a transverse direction configured at right angles to said traveling wave signal propagation direction, a coupling length of said structure in said traveling wave signal propagation direction having electrodes configured for attaching transmission lines for an input signal and for an output signal, said input and output attachments at opposite ends of said coupling length, at least one gate electrode extending along said coupling length in the traveling wave signal propagation direction, at least one source electrode extending along said coupling length in the traveling wave signal propagation direction, at least one drain electrode extending along said coupling length in the traveling wave signal propagation direction, wherein a traveling wave field-effect transistor is formed, input transmission line attached to the electrodes at one end of said coupling length for an input signal, output transmission line attached to the electrodes at said opposite end of said coupling length for an output signal, a depletion region generally beneath said at least one gate electrode, said depletion region, when viewed in a cross section of said semiconductor structure taken in said transverse direction, having an edge, means for positioning said edge between said at least one gate electrode and said at least one drain electrode region, means for defining a first end portion of said edge as that end portion located between the gate electrode and a drain electrode region, and means for defining a second end portion of said edge as that end portion distal from the gate electrode in a direction towards a source electrode region, means for separating said depletion region edge from the at least one drain electrode region, and means for adjusting said depletion region edge so that the distance between the first end portion and the gate electrode is less than the distance between the second end portion and the gate electrode.

12. The traveling wave field-effect transistor of claims 11 wherein a conductivity of a semiconductor of the traveling-wave field effect transistor is substantially 1.6 Siemens/cm.

13. The traveling wave field-effect transistor of claim 11 wherein said gate electrode is about one micron in length.

14. A semiconductor structure forming a traveling wave field-effect transistor operated at frequencies in the microwave range or above the microwave range, said structure defining at least one of gate electrode and source and drain electrode regions, said structure having traveling wave signals propagating therethrough defining a traveling wave signal direction and a transverse direction configured at right angles to said traveling wave signal direction, comprising:

a depletion region generally beneath said gate electrode wherein, in a plane in said transverse direction and at right angles to said traveling wave signal direction, said depletion region defines an edge, and means for positioning said edge between said at least one gate electrode and said at least one drain electrode region, means for defining a first end portion of said edge as that end portion located between the gate electrode and a drain electrode region, and means for defining a second end portion of said edge as that end portion distal from the gate electrode in a direction towards a source electrode region, means for separating said depletion region edge from the at least one drain electrode region, and means for adjusting said depletion region edge so that the distance between the first end portion and the gate electrode is less than the distance between the second end portion and the gate electrode.

* * * * *